United States Patent [19]

Kuriyama et al.

[11] Patent Number: 5,717,240
[45] Date of Patent: Feb. 10, 1998

[54] STATIC SEMICONDUCTOR MEMORY DEVICE

[75] Inventors: Hirotada Kuriyama; Masahiro Ishida, both of Hyogo, Japan

[73] Assignee: Mitsubishi Denki Kabushiki Kaisha, Tokyo, Japan

[21] Appl. No.: 668,526

[22] Filed: Jun. 28, 1996

Related U.S. Application Data

[63] Continuation of Ser. No. 351,144, Nov. 29, 1994, abandoned.

[30] Foreign Application Priority Data

Dec. 29, 1993 [JP] Japan ..................... 5-352917
May 24, 1994 [JP] Japan ..................... 6-109954

[51] Int. Cl.⁶ ............................................. H01L 29/786
[52] U.S. Cl. ........................... 257/370; 257/67; 257/393; 257/774; 257/903
[58] Field of Search ................................. 257/67, 66, 903, 257/904, 369, 370, 774, 775, 393

[56] References Cited

U.S. PATENT DOCUMENTS

| | | | |
|---|---|---|---|
| 4,774,203 | 9/1988 | Ikeda et al. | 257/903 |
| 5,095,347 | 3/1992 | Kirsch | 257/903 |
| 5,317,193 | 5/1994 | Watanbe | 257/773 |
| 5,350,933 | 9/1994 | Yoshihara | 257/903 |
| 5,353,245 | 10/1994 | Lee et al. | 257/903 |
| 5,394,358 | 2/1995 | Huang | 257/903 |
| 5,406,107 | 4/1995 | Yamaguchi | 257/904 |
| 5,408,130 | 4/1995 | Woo et al. | 257/758 |
| 5,442,236 | 8/1995 | Fukazawa | 257/773 |
| 5,488,248 | 1/1996 | Lee et al. | 257/904 |

FOREIGN PATENT DOCUMENTS

| | | | |
|---|---|---|---|
| 63-53965 | 3/1988 | Japan . | |
| 63-193558 | 8/1988 | Japan . | |
| 3-234055 | 10/1991 | Japan . | |
| 3-234056 | 10/1991 | Japan . | |
| 3-234057 | 10/1991 | Japan . | |
| 0283641 | 12/1991 | Japan | 257/774 |
| 4-137760 | 5/1992 | Japan . | |
| 5-121695 | 5/1993 | Japan . | |
| 5-136372 | 6/1993 | Japan . | |
| 0132421 | 5/1994 | Japan | 257/774 |

OTHER PUBLICATIONS

"A Split Wordline Cell for 16MB SRAM Using Polysilicon Sidewall Contacts", Kazuo Itabashi et al., IEDM 91, pp. 477–484.

"Evaluation of Dislocation Generation at SiN Film Edges on Silicon Substrates by Selective Oxidation", Y. Tamaki et al., J. Electrochem. Soc: Solid–State Science and Technology, Mar. 1981, pp. 644–648.

"Cornerless Active Area Cell and Bi–T–Mos Process for Sub–Half Micron SRAMS", M. Ishida et al., Jun. 9, 1994.

"A High Performance 0.6 um BICMOS SRAM Technology with Emitter–Base Self–Aligned Bipolar Transistors and Retrograde Well for MOS Transistors", Hiroki Honda et al., 1992 Symposium on VLSI Technology Digest of Technical Papers.

*Primary Examiner*—Tom Thomas
*Assistant Examiner*—David B. Hardy
*Attorney, Agent, or Firm*—Lowe, Price, LeBlanc & Becker

[57] ABSTRACT

In one memory cell forming region of an SRAM, a field oxide film having edges straight and parallel to each other is formed. Active regions are formed sandwiching field oxide film. One word line is formed extending over field oxide film and active regions. On word line 6, gate electrodes of a driver transistor and GND lines are formed at prescribed positions. Gate electrodes of the driver transistor also serve as a gate electrode of a TFT. On gate electrodes of the driver transistor and on GND lines, polycrystalline silicon layers in which channel region and source/drain regions of the TFT are formed, are formed respectively. Consequently, a high performance SRAM which can reduce cell area and which has high reliability can be obtained.

15 Claims, 67 Drawing Sheets

STATIC SEMICONDUCTOR MEMORY DEVICE

This application is a continuation of application Ser. No. 08/351,144 filed Nov. 29, 1994, now abandoned.

BACKGROUND OF THE INVENTION

1. Field of the Invention

The present invention relates to an SRAM (Static Random Access Memory) and manufacturing method thereof.

2. Description of the Background Art

A so called SRAM has been well known as a static semiconductor memory device. A memory cell of a SRAM includes four transistors formed on a substrate, and thin film transistors (hereinafter referred to as "TFTs") formed of polycrystalline silicon. FIG. 50 is an equivalent circuit diagram showing an example of a conventional SRAM including TFTs.

Referring to FIG. 50, in one memory cell (memory element forming region) 250 of the SRAM, the aforementioned six transistors are formed. Of these six transistors, access transistors Q1 and Q2, and driver transistors Q3 and Q4 are formed on a main surface of a semiconductor substrate. Transistors Q5 and Q6 are TFTs.

Access transistor Q1 has one impurity region connected to a bit line 251. Access transistor Q1 has its gate electrode connected to a word line 253. Access transistor Q2 has one impurity region connected to a bit line 252. Access transistor Q2 has its gate electrode connected to a word line 254.

Driver transistor Q3 has one impurity region grounded through a parasitic resistance 255. Driver transistor Q4 also has one impurity region grounded through a parasitic resistance 256.

An example of an SRAM layout corresponding to the equivalent circuit diagram of FIG. 50 described above is shown, for example, in IEDM91, pp.477–484. FIGS. 51 to 54 are plan views showing stepwise the layout of the memory cell starting from lower layer, which is disclosed in IEDM91 mentioned above. FIGS. 51 to 54 show a layout corresponding to one memory cell of the SRAM.

First, referring to FIG. 51, in a memory cell region (memory element forming region) 250 in which one memory cell is formed, there are active regions 109a and 109b which have bent shapes. A field oxide film 107 is formed in a region other than the active regions 109a and 109b. Since active regions 109a and 109b have bent shapes, in memory cell region 250, a corner of field oxide film 107 is formed in a region 114.

Then, referring to FIG. 52, first gates 111a, 111b, 111c and 111d are formed to cross prescribed regions of active regions 109a and 109b. The first gate 111a serves as a word line (WL). At a crossing between the first gate 111a and active region 109a, access transistor Q1 is formed. The first gate 111b also serves as a word line. At a crossing between the first gate 111b and active regions 109b, access transistor Q2 is formed. In this manner, in one memory cell region 250, two word lines are formed.

At a crossing between first gate 111c and active region 109b, driver transistor Q4 is formed. At a crossing between first gate 111d and active region 109a, driver transistor Q3 is formed.

First gate 111c is connected to active region 109a through a first contact portion 113a. First gate 111d is connected to active region 109b through a first contact portion 113b.

On the aforementioned first gates 111a to 111d, second gates 115a, 115b and 115c are formed with an insulating layer interposed. Second gate 115a serves as a ground line (GND line) for grounding one impurity region of transistors Q3 and Q4. Second gate 115a is connected to active regions 109a and 109b through second contact portions 117a and 117b, respectively.

The second contact portions 117a and 117b provide parasitic resistances 255 and 256 on the ground line. Second gate 115b is connected to active region 109a through second contact portion 117c. Second gate 115c is connected to active region 109b through second contact portion 117d.

Thereafter, referring to FIG. 53, third gates 119a and 119b are formed on the aforementioned second gates 115a to 115c with an insulating layer interposed. The third gates 119a and 119b serve as gate electrodes of the TFTs. Third gate 119a is connected to first gate 111c through a third contact portion 123a. Third gate 119b is connected to first gate 111d through a third contact portion 123b.

On third gates 119 and 119b, fourth gates 121a and 121b are formed with an insulating layer interposed. In the fourth gates 121a and 121b, channel region and source/drain regions of the TFT are formed. Fourth gate 121a is connected to third gate 119b through a fourth contact portion 125b. Fourth gate 121b is connected to third gate 119a through a fourth contact portion 125a.

Then, referring to FIG. 54, on the fourth gates 121a and 121b, metal interconnections 127a and 127b are formed with an insulating layer interposed. The metal interconnections 127a and 127b serve as bit lines (BL). Metal interconnection 127a is connected to second gate 115b through a fifth contact portion 129a. Metal interconnection 127b is connected to second gate 115c through a fifth contact portion 129b.

A cross section taken along the line A—A of the layouts (FIGS. 51 to 54) above is shown in FIG. 55. Cross sectional structure of the memory cell of the SRAM will be described with reference to FIG. 55.

Referring to FIG. 55, in an element isolating region at a surface of a p type well region 206 on a main surface of a silicon substrate, a field oxide film 107 is formed. In prescribed regions of the surface of p type well region 206 at the main surface of silicon substrate, active regions 109a and 109b are formed. On the surface of p type well region 206, there would be four interconnection layers (first to fourth gates) until the fourth gates 121a and 121b are formed. In the fourth gates 121a and 121b, the channel region and the source/drain regions of the TFT are formed.

One example of a method of manufacturing an SRAM will be described with reference to FIGS. 56 to 69. In the following description, an example including an BiCMOS (Bipolar Complementary Metal Oxide Semiconductor) and an SRAM combined (hereinafter simply referred to as "BiCMOS type SRAM") is discussed, and manufacturing method thereof will be described.

FIG. 56 shows a cross sectional structure of the aforementioned BiCMOS type SRAM. FIGS. 57 to 69 are cross sections showing the first to thirteenth steps of manufacturing the BiCMOS type SRAM shown in FIG. 56.

Referring to FIG. 56, the structure of the BiCMOS type SRAM will be described. In FIG. 56, a p channel transistor portion, a memory cell portion and a bipolar portion are shown. As for an n channel transistor portion, it is not shown since this portion is formed in the similar manner as the memory cell portion. Referring to FIG. 56, at a main surface of p type semiconductor substrate 200, n diffusion layers 202 and 203 are formed at prescribed positions. On the main surface of p type semiconductor substrate 200, an n type well region 205a, an n type epitaxial layer 205b and a p type well region 206 are formed at prescribed positions, respectively. At an element isolating region at the main surface of p type semiconductor substrate 200, a field oxide film 107 is formed.

At a surface of n type well region 205a, a p channel MOS transistor 250a is formed. The p channel MOS transistor 250a includes p$^+$ diffusion layers 218a and 218b and a gate electrode 210a. A pair of sidewall oxide films 212 are formed on the sidewalls of gate electrode 210a.

At the surface of p type well region 206, n channel MOS transistors (access transistor Q1) 250b and 250c are formed. The n channel MOS transistor 250b includes n$^-$ diffusion layers 211a and 211b, an n$^+$ diffusion layer 109a and a gate electrode (first gate) 111a. The n channel MOS transistor (driver transistor Q4) 250c includes n$^-$ diffusion layers (not shown), an n$^+$ diffusion layer (not shown) and a gate electrode (first gate) 111b.

A pair of sidewall oxide films 212 are formed on the sidewalls of each of the gate electrodes 111a and 111b.

On n$^+$ diffusion layer 203, an n type diffusion layer 208 is formed. At the surface of n type epitaxial layer 205b, a p type base region 220 and an external base region 217 are formed. At the surface of p type base region 220, and n type emitter region 225 is formed.

On the main surface of p type semiconductor substrate 200, an insulating layer 112a is formed to cover gate electrodes 111a, 111b and 111c in the memory cell portion. Insulating layer 112a has opening portions at prescribed positions, and interconnection layer (second gate) 115b and an emitter electrode 228 are formed extending from inside of the openings over insulating layer 112a.

An insulating layer 112b is formed to cover interconnection layers 115a, 115b and 115c, and emitter electrode 228. At prescribed positions on insulating layer 112b, gate electrodes 119a and 119b of the TFTs are formed. An insulating layer 112c is formed to cover gate electrodes 119a and 119b. This insulating layer 112c serves as a gate insulating layer of the TFT. On insulating layer 112c, interconnection layers 121a and 121b are formed, in which channel region and source/drain regions of the TFTs are formed. An insulating layer 112d is formed to cover interconnection layers 121a and 121b. Openings are formed at prescribed positions of insulating layer 112d, in which openings, metal interconnections 127a, 127b, 127c, 127d, 127e and 127f are formed.

The method of manufacturing the semiconductor device shown in FIG. 56 will be described with reference to FIGS. 57 to 69. First, referring to FIG. 57, a silicon oxide film 201 is formed, for example, by thermal oxidation, entirely on the main surface of p type semiconductor substrate 200. Silicon oxide film 201 is patterned to have a prescribed shape. Then, by using this silicon oxide film 201 as a mask, an antimony (Sb), for example, is implanted to the main surface of p type semiconductor substrate 200. Thereafter, thermal processing is performed at a temperature of about 1100° C. for about two hours, and thus n$^+$ diffusion layers 202 and 203 are formed.

Then, referring to FIG. 58, the silicon oxide film 201 is removed. On the main surface of p type semiconductor substrate 200, an n$^-$ epitaxial layer 204 is formed. Consequently, n$^+$ diffusion layers 202 and 203 are formed buried in p type semiconductor substrate 200.

Thereafter, referring to FIG. 59, an n type impurity such as phosphorus (P) is introduced to n type epitaxial layer 204 positioned above n$^+$ diffusion layer 202. By diffusion, n type well region 205a is formed. A p type impurities such as boron (B) is introduced to a prescribed region of n type epitaxial layer 204 mentioned above, and by diffusion, p type well region 206 is formed.

Then, referring to FIG. 60, by LOCOS (Local Oxidation of Silicon), field oxide films 107 are formed at prescribed positions at the main surface of semiconductor substrate 200. By introducing an n type impurities such as phosphorus (P) to a prescribed region at the main surface of p type semiconductor substrate 200, n$^+$ diffusion layer 208 is formed, which n diffusion layer 208 serves as a contact region with a collector electrode in the bipolar transistor.

Then, referring to FIG. 61, gate oxide film 108 is formed by performing thermal oxidation on the entire main surface of p type semiconductor substrate 200. At a portion of gate oxide film 108 located above the first contact portion 113a in the memory cell portion, an opening is formed. At this time, an n type impurity may be introduced to the surface of p type well region 206 through this opening.

Then, by using LPCVD (Low Pressure Chemical Vapor Deposition), for example, a polycrystalline silicon layer is deposited on gate oxide film 108. By patterning the polycrystalline silicon layer, gate electrodes 210, 111a, 111b and 111c of the MOS transistor are formed.

Thereafter, on the main surface of p type semiconductor substrate 200, a resist pattern 213 patterned to have a prescribed shape is formed. By using resist pattern 213 and gate electrodes 111a, 111b and 111c as a mask, an n type impurity is introduced to the surface of p well region 206. In this manner, n$^+$ diffusion layers 211a and 211b are formed.

Then, referring to FIG. 62, the aforementioned resist pattern 213 is removed. Thereafter, on the entire main surface of p type semiconductor substrate 200, an oxide film is formed by the LPCVD method. Then, anisotropic etching is performed by RIE (Reactive ion Etching), for example, on the oxide film. By this etching, sidewall oxide films 212 are formed on the sidewalls of gate electrodes 210a, 111a, 111b and 111c.

Thereafter, a resist pattern 214 exposing p type well region 206 is formed on the main surface of p type semiconductor substrate 200. By using resist pattern 214, sidewall oxide films 212 and gate electrodes 111a to 111c as a mask, an n type impurity is introduced to the surface of p type well region 206, thereby forming n$^+$ diffusion layer 109.

The above described n$^-$ diffusion layers 211a to 211b and n$^+$ diffusion layer 109a constitute a so called LDD (Lightly Doped Drain) structure in which electric field near the drain is relaxed. Thereafter, resist pattern 214 is removed.

Thereafter, referring to FIG. 63, on the main surface of p type semiconductor substrate 200, a resist pattern 216 is formed which exposes portions of surfaces of n type epitaxial layer 205b and n type well region 205a. By using resist pattern 216, gate electrode 210a and sidewall oxide films 212 as a mask, p type impurity is introduced to the surfaces of n type well region 205a and n type epitaxial layer 205b. Consequently, p$^+$ diffusion layers 218a, 218b and an external base region 217 are formed. Thereafter, resist pattern 216 is removed.

Then, referring to FIG. 64, on the main surface of p type semiconductor substrate 200, a resist pattern 219 exposing a portion of the surface of n type epitaxial layer 205b is formed. By using resist pattern 219 as a mask, a p type impurity is introduced to the surface of n type epitaxial layer 205b, thereby forming p type base region 220.

Then, referring to FIG. 65, entirely over the main surface of p type semiconductor substrate 200, an insulating layer 112a of, for example, silicon oxide film is deposited. Then, referring to FIG. 66, on the insulating layer 112a, a resist pattern 220 having openings at prescribed regions is formed. By using resist pattern 220 as a mask, insulating layer 112a is etched by RIE method, for example. Thus, second contact portions 117c and 224 are formed. Thereafter, resist pattern 222 is removed.

Then, referring to FIG. 67, entirely over the main surface of p type semiconductor substrate 200, a polycrystalline silicon layer is deposited by the LPCVD method. Arsenic (As) is implanted to the polycrystalline silicon layer. Thereafter, by performing RTA (Rapid Thermal Annealing), the arsenic (As) which has been implanted to the polycrystalline silicon layer is diffused into n type epitaxial layer 205b.

Thus, n$^+$ emitter region 225 is formed. Preferable conditions of the aforementioned RTA processing are 1050° C. for about 30 seconds. At this time, emitter region 225 may be formed by normal thermal processing, not by RTA processing. Thereafter, the polycrystalline silicon layer is patterned, for example, by anisotropic RIE. Thus second gates 115a, 115b and 115c are formed in the memory cell portion, and emitter electrode 2228 is formed in the bipolar portion.

Then, referring to FIG. 68, an insulating layer 112b of silicon oxide film, for example, is formed entirely over the main surface of p type semiconductor substrate. Then, a third contact portion 123a is formed. Thereafter, a polycrystalline silicon layer is formed on insulating layer 110b, by the LPCVD method, for example. By patterning the polycrystalline silicon layer, gate electrodes 119a and 119b of the TFTs are formed.

Then, referring to FIG. 69, entirely over the main surface of p type semiconductor substrate 200, an insulating layer 112c such as a silicon oxide film is formed. On insulating layer 112c, a polycrystalline silicon layer is formed, for example, by the LPCVD method. The polycrystalline silicon layer is patterned and p type impurity is introduced to the polycrystalline silicon layer to form channel regions and source/drain regions 121a and 121b of TFTs are formed.

Thereafter, an insulating layer 112d is formed entirely over the main surface of p type semiconductor substrate 200, and contact holes are formed at prescribed positions of insulating layer 112d. Metal electrodes 127a, 127b, 127c, 127d, 127e and 127f of Al, AlCu, W or the like are formed in the contact holes. Through these steps, the semiconductor device of FIG. 56 is completed. However, the above described SRAM has the following disadvantages.

The disadvantages will be described with reference to FIGS. 51, 70 and 71. Referring to FIG. 51, in the memory cell forming region 250 of the conventional SRAM, active regions 109a and 109b have bent shapes. Therefore, in the region 114 of FIG. 51, field oxide film 107 inevitably has a corner. This corner of the field oxide film 107 is formed near the storage node of the SRAM. Since there is a corner of field oxide film 107, generation of leak current becomes more likely in the active regions 109a and 109b near that portion (especially at the storage node portion).

The reason will be discussed in the following. When a field oxide film is formed, there is generated a stress along the field oxide film. If the field oxide film has a corner portion, the stress generated at the corner is larger. Accordingly, dislocation of Si crystal is made more likely near the corner of the field oxide film. The generation of dislocation leads to generation of leak current at that portion. Similar phenomenon is disclosed, for example, in *J. Electrochem. Soc.: SOLID-STATE SCIENCE AND TECHNOLOGY*, March, 1981, p. 645, FIG. 1.

Generation of leak current at the storage node portion or in the vicinity thereof of the SRAM because of the existence of the corner in the field oxide film brings about the following problems. FIG. 71 is an equivalent circuit diagram showing generation of the leak current at the standby state of the SRAM. Referring to FIG. 71, it is assumed that the potential on the side of the storage node H is at the high level, and the potential on the side of storage node L is at the low level.

At this time, when leak current i is generated at storage node H as shown in FIG. 71, it becomes difficult to maintain stable potential level on the side of the storage node H. Further, such a leak current i is part of the current consumed in the memory cell, it becomes difficult to reduce consumption current (standby current) of the SRAM.

In the conventional example shown in FIG. 51 described above, active regions 109a and 109b have bent shapes. For this reason, corners of field oxide films 107 have been inevitably formed in the memory cell forming region 250. However, even if the active regions 109a and 109b shown in FIG. 51 are adapted to have straight shape, there is still a corner portion formed inevitably in the field oxide film 107 in the memory cell forming region 250 in the conventional structure of the SRAM memory cell.

The reason will be described. FIG. 70 is a schematic plan view showing first gates 111a and 111d formed on active region 109a which is adapted to have a straight shape. Referring to FIG. 70, at the crossing between active region 109a and first gate 111a, access transistor Q1 is formed. At a crossing between active region 109a and first gate 111d, a driver transistor Q3 is formed.

As shown in FIG. 70, channel width W of access transistor Q1 is set different from channel width W1 of driver transistor Q3. More specifically, channel width W1 of driver transistor Q3 is set to be wider than that of access transistor Q1. The reason is as follows.

A so called cell ratio is known as one of the references showing stability in reading of the SRAM memory cell. This is generally represented as: current amount flowing through driver transistor/current amount flowing through access transistor. Generally, the cell ratio necessary for stable operation of the common SRAM memory cell is at least 3.5.

In order to ensure the cell ratio as above, conventionally, the channel width W of access transistor Q1 has been made smaller than the channel width W1 of driver transistor Q3. This method is also employed in the conventional SRAM shown in FIG. 51. Therefore, even if the active region 109a is formed not bent but straight as shown in FIG. 70, there is inevitably formed a corner of the field oxide film 107 in the region 114 in memory cell forming region 250. Therefore, the above described problem still exists.

Further, the shape itself of the aforementioned field oxide film 107 is relatively complicated. Therefore, the step of photolithography or etching required for patterning the mask layer to form field oxide film 107 becomes difficult.

Further, in the conventional BiCMOS type SRAM, four layers of polycrystalline silicon layers are used for the TFT row memory cells. One of these layers is used as the emitter electrode of the bipolar transistor. If a double polysilicon type bipolar transistor having higher performance is desired, another layer of polycrystalline silicon layer is necessary which is used only for the base electrode of the bipolar transistor. As a result, a total of five polycrystalline silicon layers becomes necessary.

SUMMARY OF THE INVENTION

The present invention was made to solve the above described problems.

An object of the present invention is to provide a highly reliable static semiconductor memory device capable of suppressing generation of leak current near a storage node of a memory cell region, and to provide a manufacturing method thereof.

Another object of the present invention is to provide a static semiconductor memory device which can easily ensure the desired cell ratio without impairing reliability and without increasing the cell area, and to provide manufacturing method thereof.

A still another object of the present invention is to provide a method of manufacturing a static semiconductor device in which steps of photolithography and etching can be facilitated when an element isolating region is formed.

A still further object of the present invention is to form a TFT load SRAM having high performance double polysilicon type bipolar transistor while not increasing the number of layers of deposited polycrystalline silicon layers.

In accordance with one aspect of the present invention, the static semiconductor memory device includes a semiconductor substrate having a main surface, a memory element forming region, an active region, and first and second gates. The memory element forming region is provided at the main surface of semiconductor substrate, and one memory element is formed therein. The active region is formed selectively in the memory element forming region. The first gate is formed on a first region in the active region with an insulating layer interposed. The second gate is formed on a second region in the active region spaced by a prescribed distance from the first region, with an insulating layer interposed. An edge portion of the active region positioned between the first and the second gates mentioned above extend linearly.

In the static semiconductor memory device in accordance with this first aspect of the present invention, the edge portion of the active region positioned between the first and second gates extends linearly. Namely, between the first and second gates, there is not a corner of the isolating insulating layer (element isolating region) defining the active region. Therefore, the problem of the prior art, that is, generation of the leak current in the memory element forming region, especially at the storage node portion can be effectively suppressed. As a result, highly reliable static semiconductor memory device can be provided.

In accordance with another aspect of the present invention, the static semiconductor memory device includes, as a premise, first and second driver transistors and an access transistor. The static semiconductor memory device in accordance with this aspect includes a semiconductor substrate of a first conductivity type having a main surface, a memory element forming region, first and second active regions, and first, second and third gates. The memory element forming region is provided on the main surface of the semiconductor substrate, and one memory element is formed therein. The first and second active regions are formed selectively in the memory element forming region sandwiching an element isolating region. The first gate is formed on a first region of the first active region with an insulating layer interposed, and it serves as a gate electrode of the access transistor. The second gate is formed on a second region of the first active region spaced by a prescribed distance from the first region, with an insulating layer interposed, and it serves as a gate electrode of a first driver transistor. The third gate is electrically connected to a prescribed region in the first active region positioned between the first and second gates, and extends from the first active region to the second active region. At a crossing between the third gate and the second active region, a second driver transistor is formed. The first active region positioned between the first and the second gates has a pair of linearly extending edge portions. In a portion of the first active region positioned below the third gate, there is provided a resistance portion for adjusting the ratio of the current amount flowing through the first driver transistor with respect to the current amount flowing in the access transistor to a desired value.

In accordance with this aspect of the present invention, in the static semiconductor memory device, there is provided a resistance portion in the first active region positioned below the third gate. Provision of this resistance portion is to adjust the cell ratio. Therefore, different from the prior art, it becomes unnecessary to make the width of the active region for the access transistor different from that of the driver transistor. Therefore, the desired cell ratio can be ensured easily without increasing the area of the memory cell region. The reason will be discussed. In order to ensure the cell ratio in the prior art, it is necessary to make channel widths of access transistors T1 and T2 relatively narrower and to make channel widths of driver transistors Q3 and Q4 relatively wide, as shown in FIG. 52. At this time, there is a limit in narrowing the channel widths of access transistors Q1 and Q2, since there is the problem of narrow channel effect. In order to widen the channel widths of driver transistors Q3 and Q4, the area of the memory cell region must be enlarged. From the foregoing, it has been difficult in such a memory cell structure as the prior art to ensure the desired cell ratio without increasing the area of the memory cell region. By contrast, in the static semiconductor memory device in accordance with this aspect, the cell ratios is ensured by the provision of a resistance portion, and therefore the desired cell ratio can be ensured without increasing the area of the memory cell region.

In accordance with still another aspect of the present invention, the static semiconductor memory device includes, as a premise, a memory cell portion in which a memory cell is formed, a bipolar portion in which a bipolar transistor is formed, and a TFT (Thin Film Transistor). The static type semiconductor memory device in accordance with this aspect includes a semiconductor substrate of a first conductivity type having a main surface, a bipolar transistor, a base electrode, an emitter electrode, a driver transistor, and a TFT layer. The bipolar transistor is formed in the bipolar portion at the main surface of the semiconductor substrate, and has a collector region of a second conductivity type, a base region of the first conductivity type formed on the surface of the collector region, and an emitter region of the second conductivity type formed on the surface of the base region. The base electrode is formed on the surface of the base region. The emitter electrode is formed on the surface of the emitter region. The driver transistor is formed in the memory cell portion at the main surface of the semiconductor substrate, and it has a pair of impurity regions of the second conductivity type and a gate electrode. An insulating layer is formed to cover the driver transistor. The TFT layer is formed on the insulating layer, and in which TFT layer, source/drain regions of the TFT are formed. The aforementioned emitter electrode and the gate electrode of the driver transistor are formed by patterning a first conductive layer, while the base electrode and the TFT layer are formed by patterning a second conductive layer.

In the static type semiconductor memory device in accordance with this aspect of the present invention, the emitter electrode of the bipolar transistor and the gate electrode of the driver transistor are formed by patterning the first conductive layer of, for example, polycrystalline silicon, and the base electrode of the bipolar transistor and the TFT layer are formed by patterning the second conductive layer of, for example, polycrystalline silicon. Therefore, a static semiconductor memory device of high performance having a double polysilicon type bipolar transistor can be formed with smaller number of layers of the deposited polycrystalline silicon layer.

In accordance with a method of manufacturing a static semiconductor memory device of the present invention, at first, an element isolating insulating layer is formed selectively on a main surface of a semiconductor substrate of a first conductivity type, such that an active region having a pair of edge portions opposite to each other and extending linearly is defined. First, second and third gates are formed respectively on the active region with an insulating layer interposed, crossing the aforementioned pair of edge portions. The third gate is formed between the first and second gates to be electrically connected to a prescribed region in the active region positioned between the first and the second gates. By introducing an impurity of a second conductivity type into the active region by using the first, second and third gates as a mask, an access transistor is formed at a crossing between the first gate and the active region, a driver transistor is formed at a crossing between the second gate and the active region; and a region of a first conductivity type serving as a resistance portion for adjusting the ratio of current amount flowing in the driver transistor with respect to the current amount flowing in the access transistor to a desired value is formed in the active region positioned below the third gate.

In accordance with the method of manufacturing a static semiconductor memory device of the present invention, an element isolating insulating layer is formed selectively on the main surface of the semiconductor substrate so as to define an active region having a pair of edge portions extending linearly. Therefore, in forming the element isolating insulating layer, the steps of photolithography and etching can be performed easily. Further, by introducing an impurity of the second conductivity type to the active region by using the first, second and third gates as a mask, it becomes possible to form a resistance portion. At this time, the access transistor and the driver transistor are formed simultaneously. Namely, the aforementioned resistance portion can be formed through the same steps as the steps for forming the access transistor and the driver transistor. Therefore, the resistance portion for ensuring a desired cell ratio can be formed without making the manufacturing process complicated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to FIGS. 1 to 49.

(First Embodiment)

Figure 1:
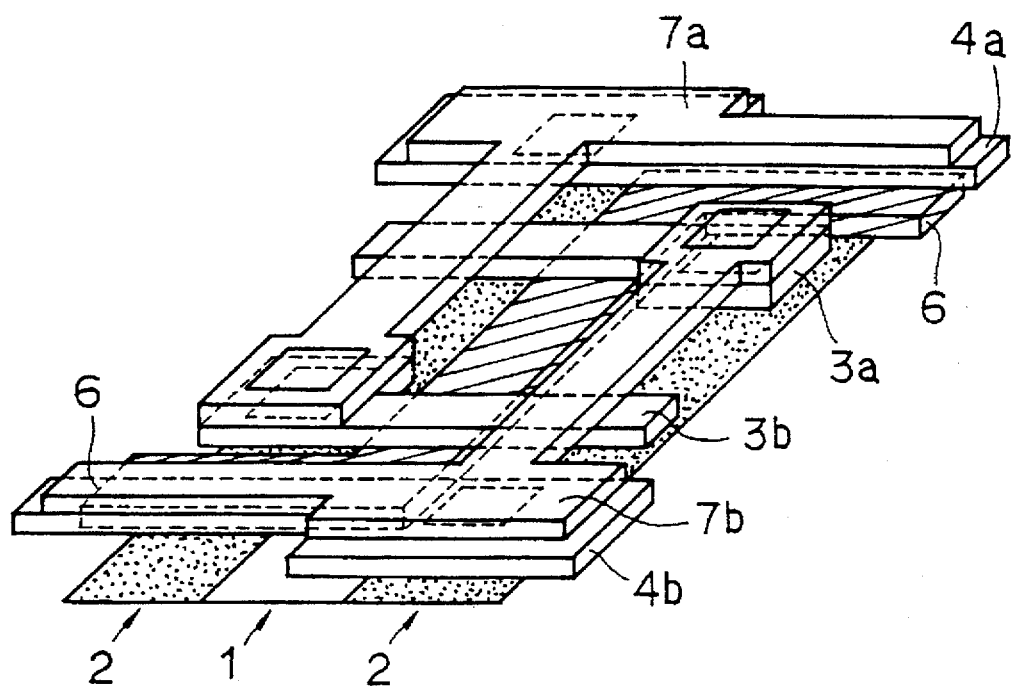
FIG. 1 is a perspective view of a memory cell of an SRAM in accordance with a first embodiment of the present invention.

FIG. 1 is a perspective view showing layout of one memory cell of an SRAM in accordance with a first embodiment of the present invention. FIG. 1 shows layers up to the interconnection layer in which the channel region of the TFT is formed.

Referring to FIG. 1, on the main surface of a semiconductor substrate, active regions 2 are formed sandwiching a field oxide film 1. A gate electrode (word line WL) 6 of one access transistor is formed to extend from above the field oxide film 1 to a prescribed position on active region 2.

On gate electrode 6 of the access transistor, a pair of gate electrodes 3a and 3b of a driver transistor are formed. On gate electrode 6 of the access transistor, a pair of ground lines (GND lines) 4a and 4b are also formed. Gate electrodes 3a and 3b of the driver transistor also serve as the gate electrodes of the TFT.

On the gate electrodes 3a and 3b of the driver transistor and on the GND lines 4a and 4b, a pair of polycrystalline silicon layers 7a and 7b for forming the channel region and the source/drain regions of the TFT are formed.

The layout of the memory cell of the SRAM shown in FIG. 1 will be described in greater detail with reference to FIGS. 2 to 6. FIGS. 2 to 6 are plan views showing stepwise the layout of the memory cell of the SRAM shown in FIG. 1, starting from the lower most layer.

Figure 2:
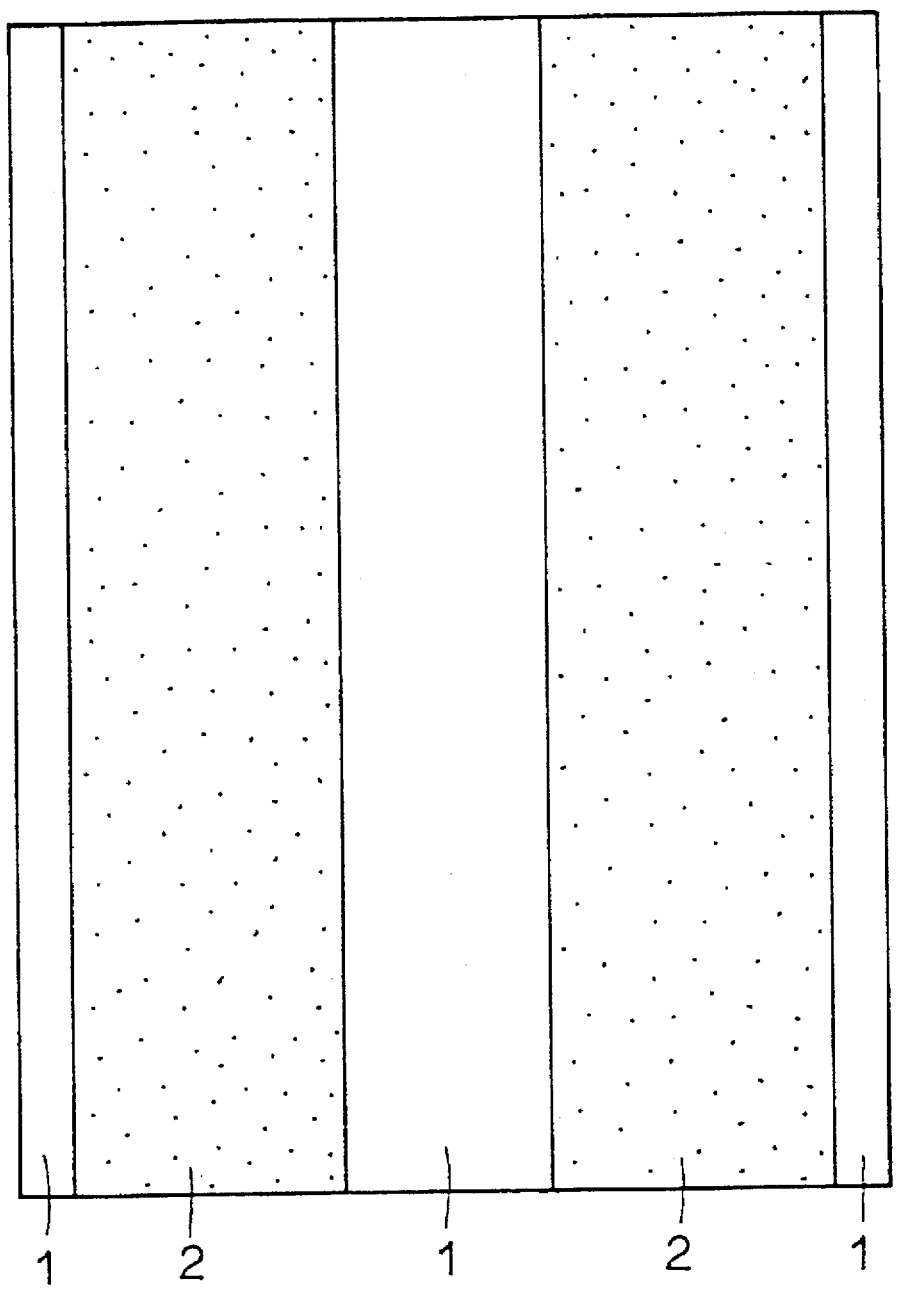
FIG. 2 is a plan view showing shapes of a field oxide film and an active region formed in one memory element region.

First, referring to FIG. 2, in one memory cell forming region (memory element forming region) of the SRAM, a field oxide film 1 is formed passing through the memory forming region in a prescribed direction. Field oxide film 1 of the present embodiment has edges straight and parallel to each other in the memory cell forming region. Therefore, in the memory cell forming region, there is not a corner of the field oxide film 1. Therefore, the leak current generated in the memory cell forming region (especially at the storage node portion) because of the corner of the field oxide film 1 can be effectively prevented. This leads to reduction in leak current of the memory cell. As a result, it becomes possible to keep stable the potential level at the time of standby of the SRAM, and further to reduce the current consumption (standby current) of the SRAM. Since there is not a corner of the field oxide film 1, the steps of lithography and etching for forming the field oxide film 1 can be simplified. In the memory cell forming region, a pair of active regions 2 are formed sandwiching field oxide film 1 as shown in FIG. 2. Therefore, the active regions 2 also come to have linear shape extending straight and parallel to each other.

Figure 3:
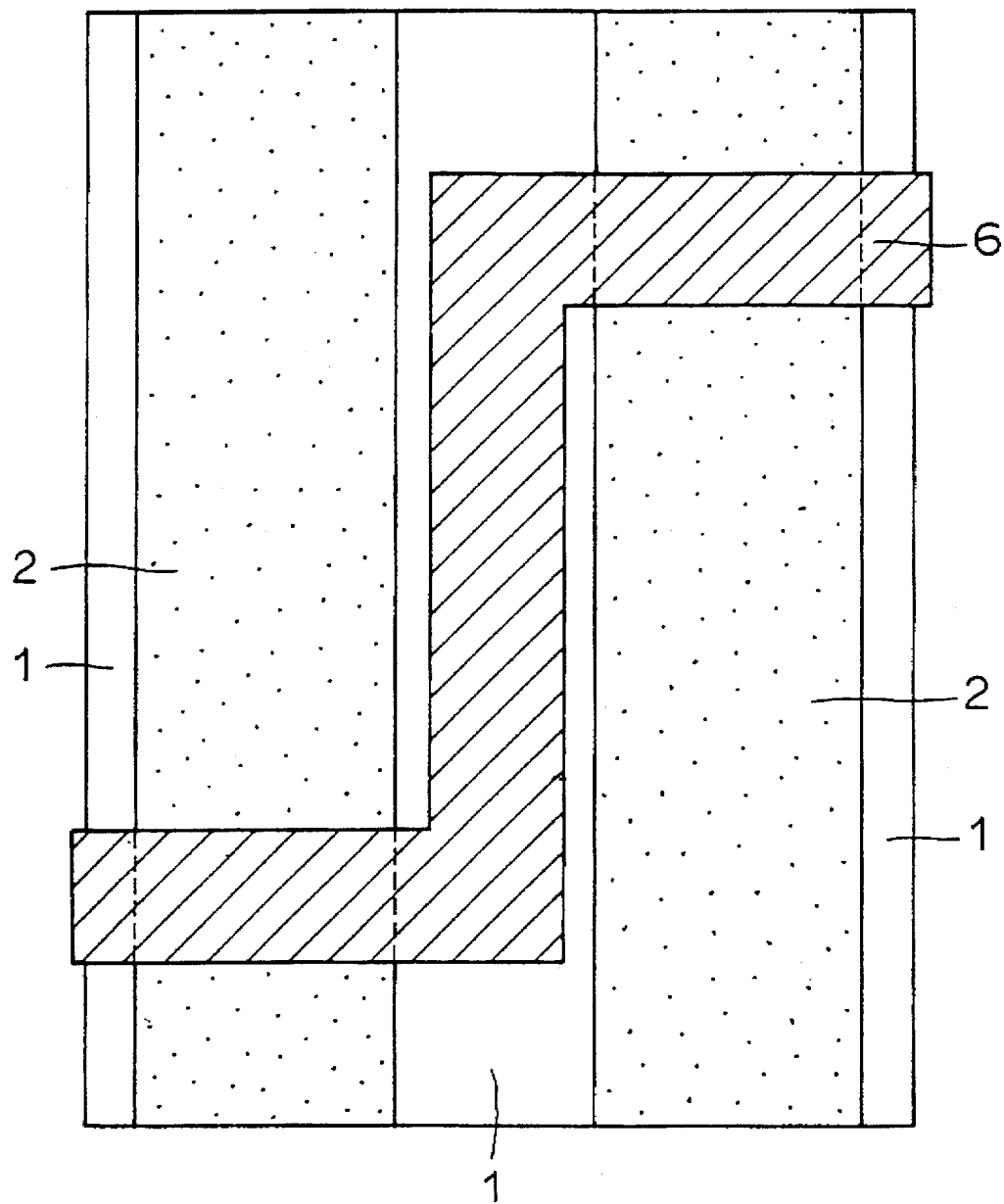
FIG. 3 is a plan view showing a word line formed on the field oxide film and the active region shown in FIG. 2.

Referring to FIG. 3, one word line (WL) 6 is formed extending from above field oxide film 1 to prescribed regions of the pair of active regions 2. As shown in FIG. 3, word line 6 has two linear portions approximately parallel to each other and a linear portion connecting these two linear portions.

It becomes possible to form the word line 6 having such a shape by the provision of the pair of active regions 2 sandwiching field oxide film 1 in one memory cell formed region. By proving word line 6 by one interconnection layer, the memory cell area can be reduced than in the prior art. The word line will be the first layer of interconnection.

Figure 4:
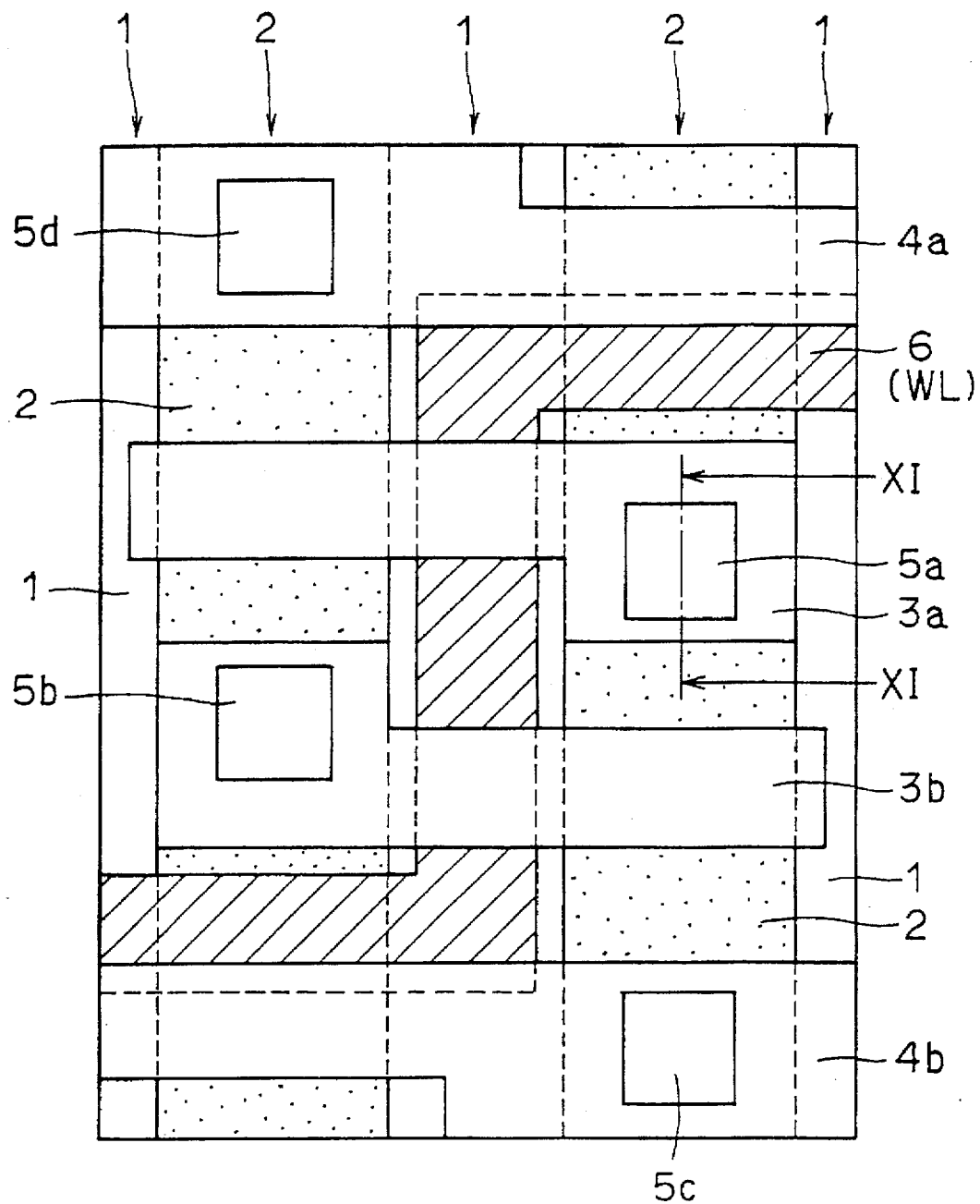
FIG. 4 is a plan view showing a GND line and a gate electrode of the driver transistor formed on the word line shown in FIG. 3.

Referring to FIG. 4, on word line 6, a pair of gate electrodes 3a and 3b of driver transistors, and a pair of GND lines 4a and 4b are formed, with an insulating layer (not shown) interposed. These interconnection layers are formed by patterning one same interconnection material. As shown in FIG. 4, by providing gate electrodes 3a and 3b of the driver transistors and word line 6 in vertical directions with an insulating layer interposed, the area of the memory cell can be reduced than in the prior art.

Again referring to FIG. 4, gate electrodes 3a and 3b of the driver transistors are electrically connected to active region 2 through contact portions 5a and 5b. GND lines 4a and 4b are electrically connected to active region 2 through contact portions 5c and 5d.

Figure 5:
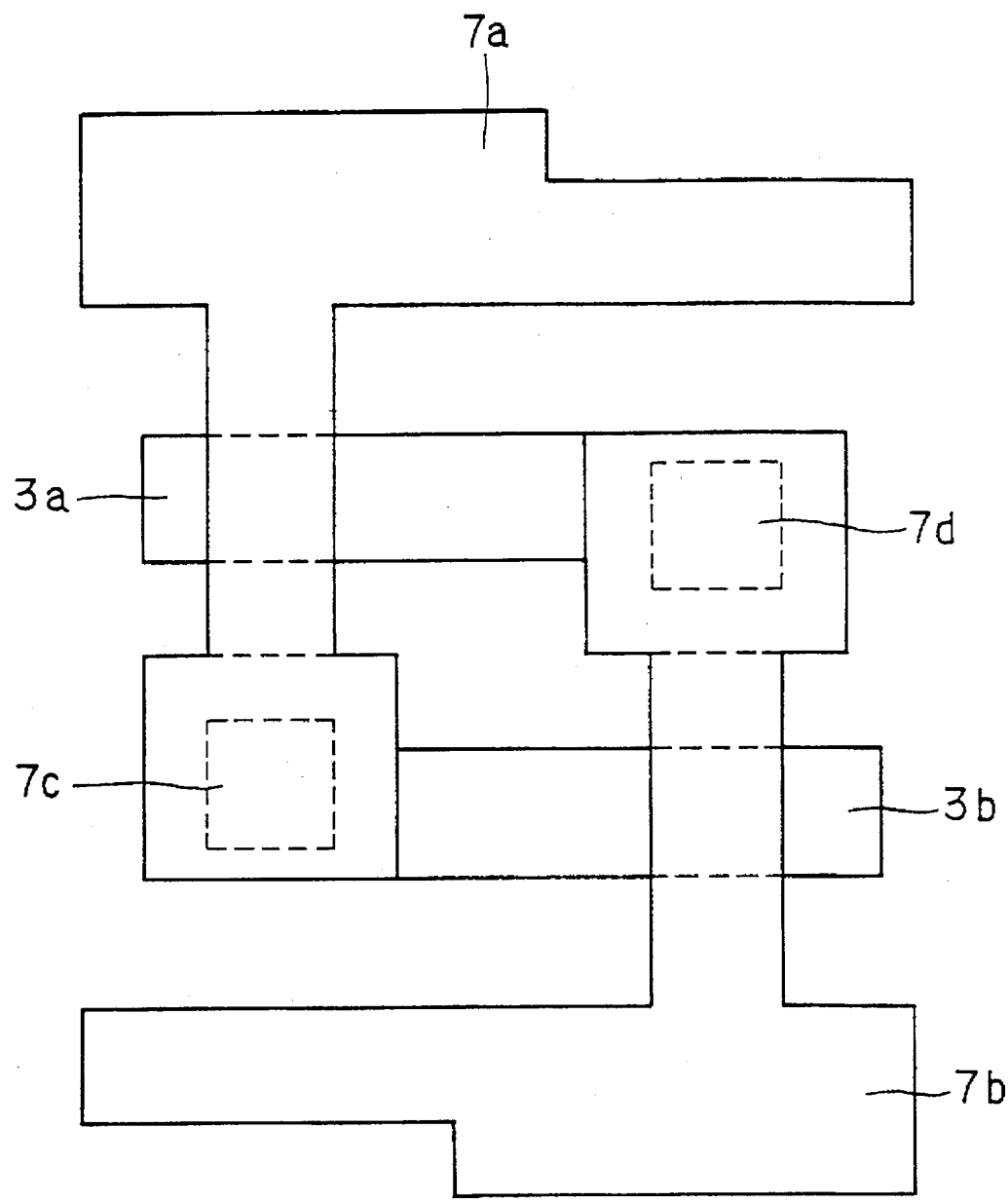
FIG. 5 is a plan view showing a state in which a TFT is formed on the gate electrode of the driver transistor shown in FIG. 4.
Figure 6:
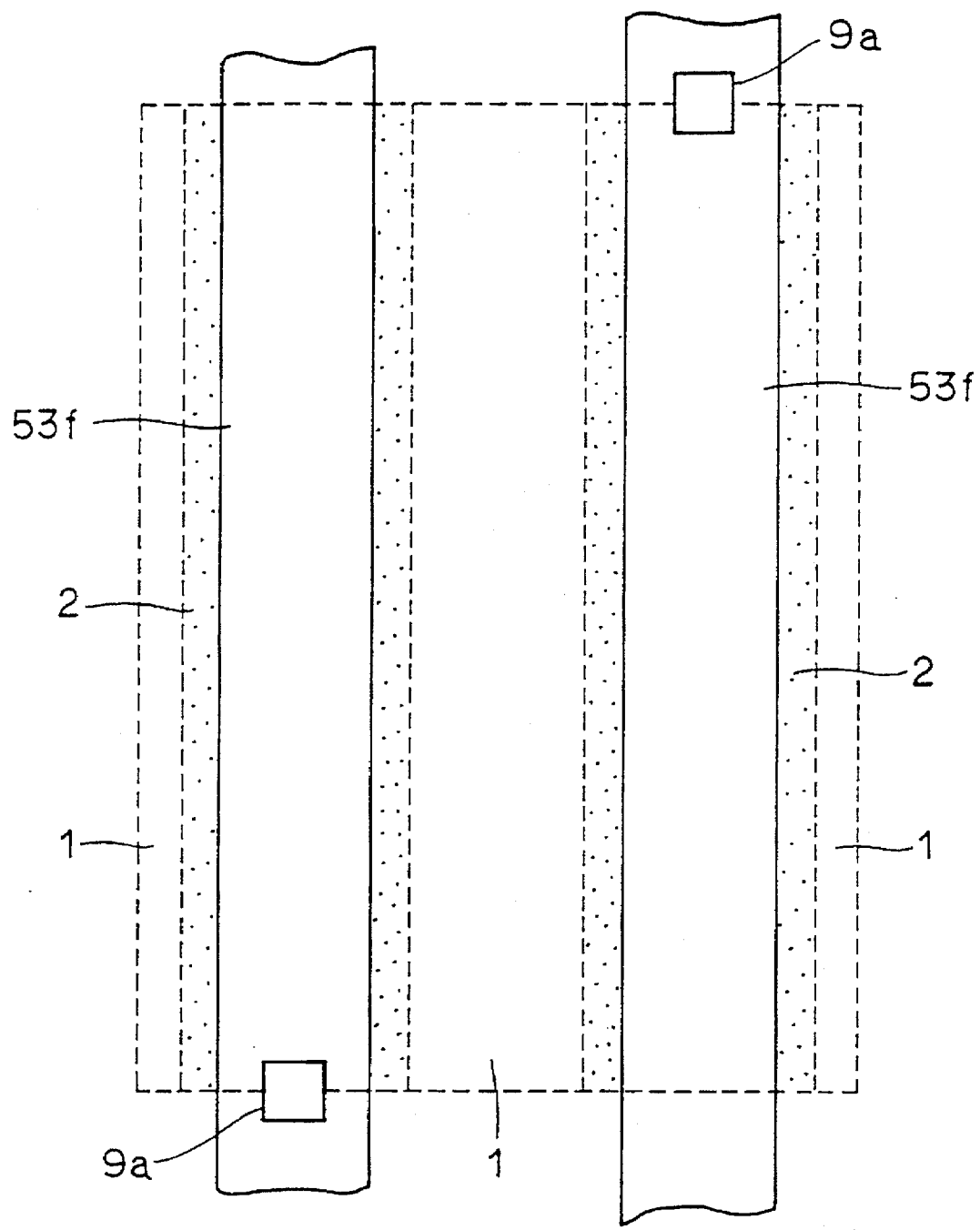
FIG. 6 is a plan view showing a state in which a bit line is formed on the TFT shown in FIG. 5.

The aforementioned gate electrodes 3a and 3b of the driver transistors and GND lines 4a and 4b constitute the second layer of interconnection. On the second layer of interconnection, interconnection layers (polycrystalline silicon layers) 7a and 7b for forming channels of the TFT are formed at prescribed positions with an insulating layer (not shown) interposed, as shown in FIG. 5. These interconnection layers constitute a third layer of interconnection. The interconnection layers 7a and 7b are electrically connected to gate electrodes 3a and 3b of the driver transistors through contact portions 7c and 7d. Then, referring to FIG. 6, on the interconnection layers 7a and 7b for forming the channels of the TFT mentioned above, a metal interconnection 53f of Al, AlCu, W or the like is formed. The metal interconnection 53f serves as a bit line, and is electrically connected to a prescribed diffusion layer through a bit line contact 9a.

Figure 48:
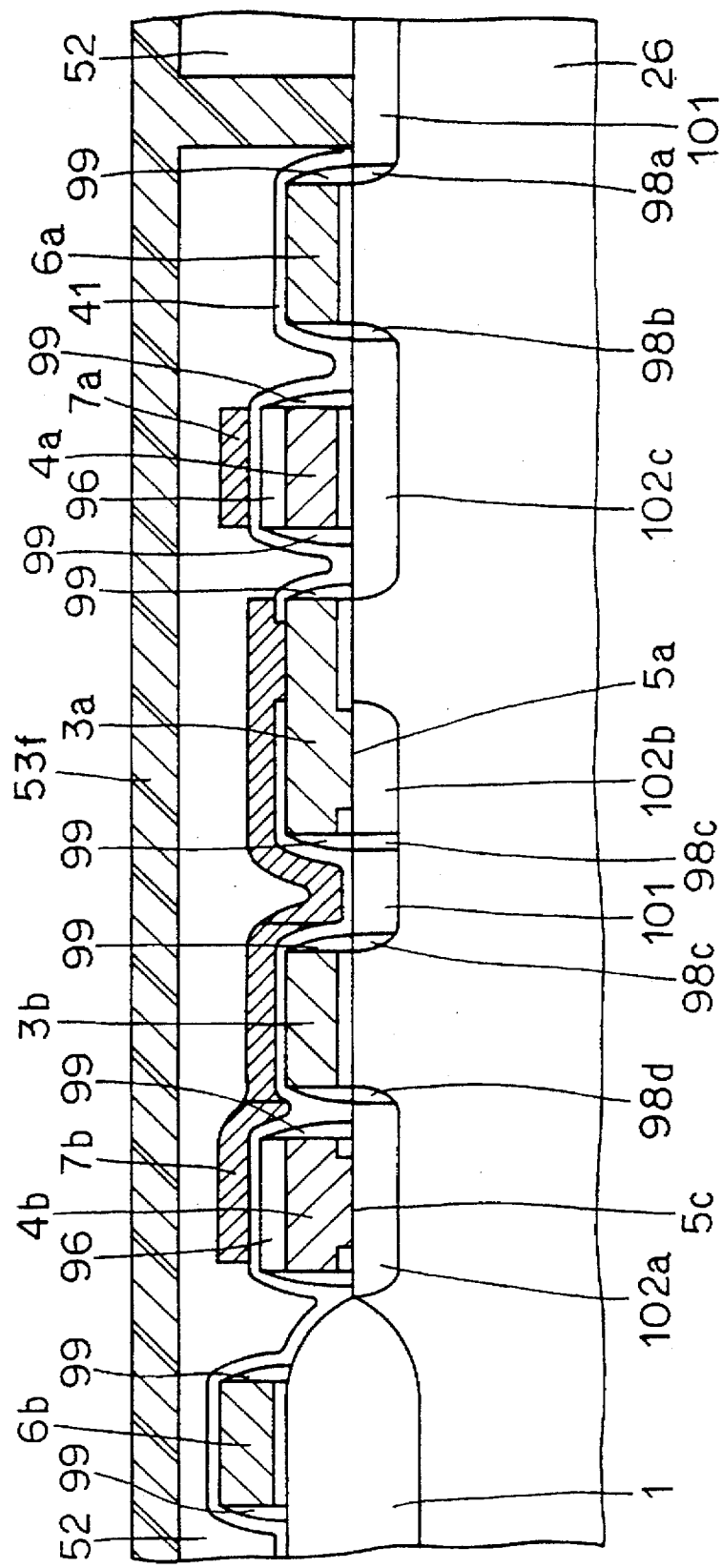
FIG. 48 is an enlarged cross section taken along the line Y—Y of FIG. 47.

As described above, in the present invention, to provide the elements up to the interconnection layers for forming channels of the TFT, three layers of interconnection layers are stacked. By contrast, in the prior art, four layers of interconnection layers must be provided until the interconnections for channels of the TFTs are formed, as shown in FIG. 48. Therefore, the reduction of the SRAM in its height becomes possible as well.

Figure 7:
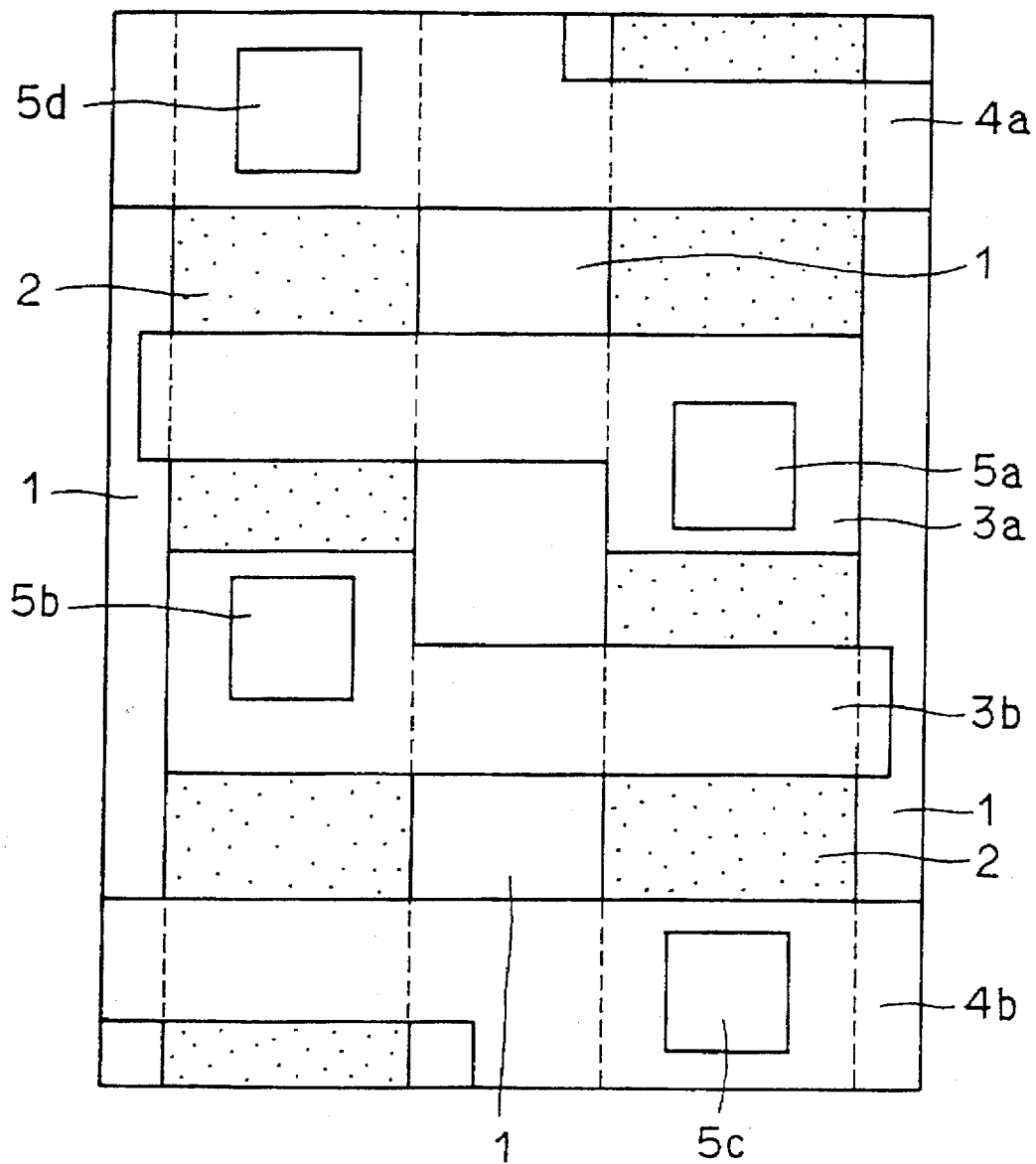
FIG. 7 is a plan view showing a state in which a GND line and a gate electrode of a driver transistor are formed on the active region and the field oxide film shown in FIG. 2.
Figure 8:
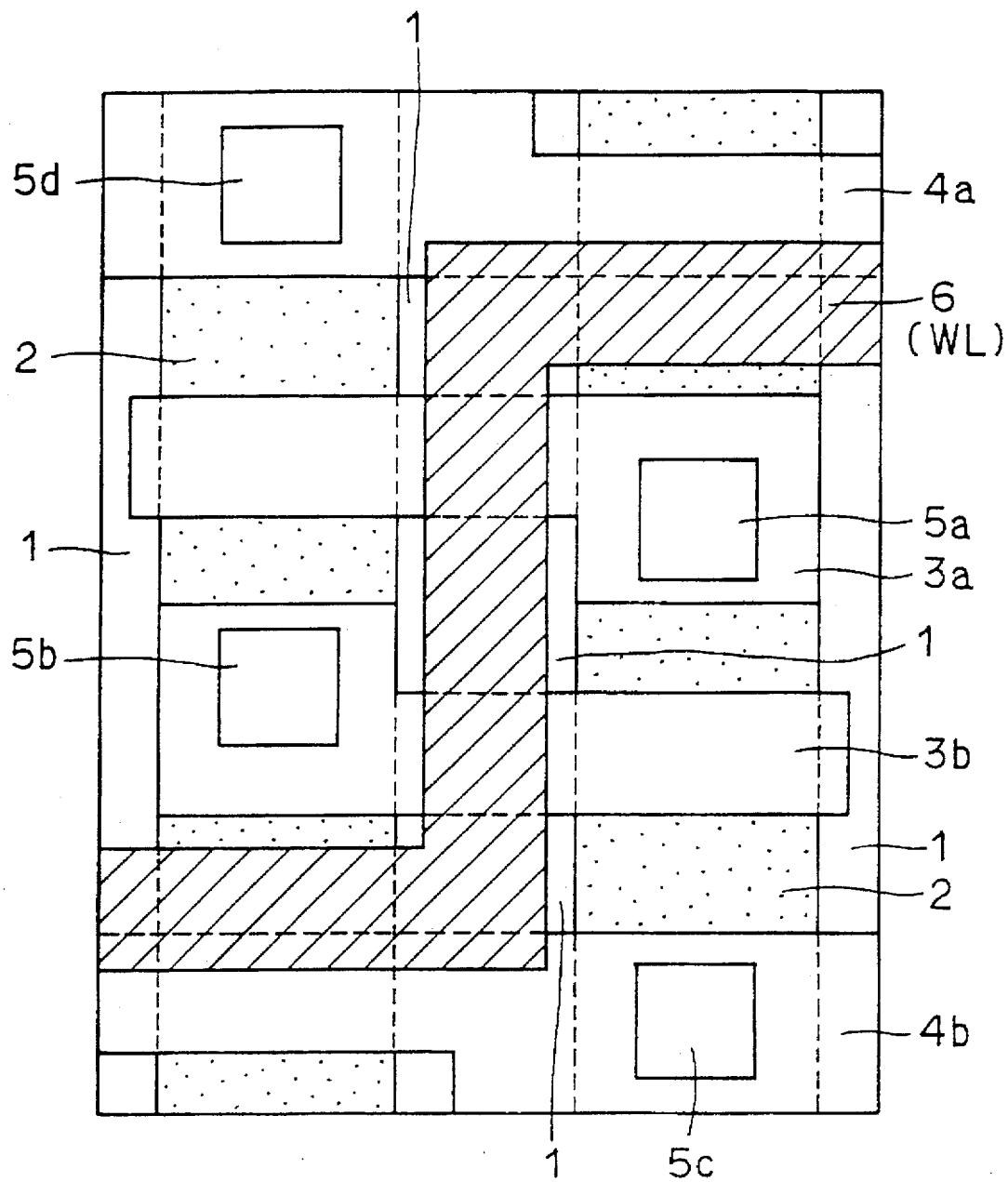
FIG. 8 is a plan view showing a state in which a word line is formed on the GND line and the gate electrode of the driver transistor shown in FIG. 7.
Figure 9:
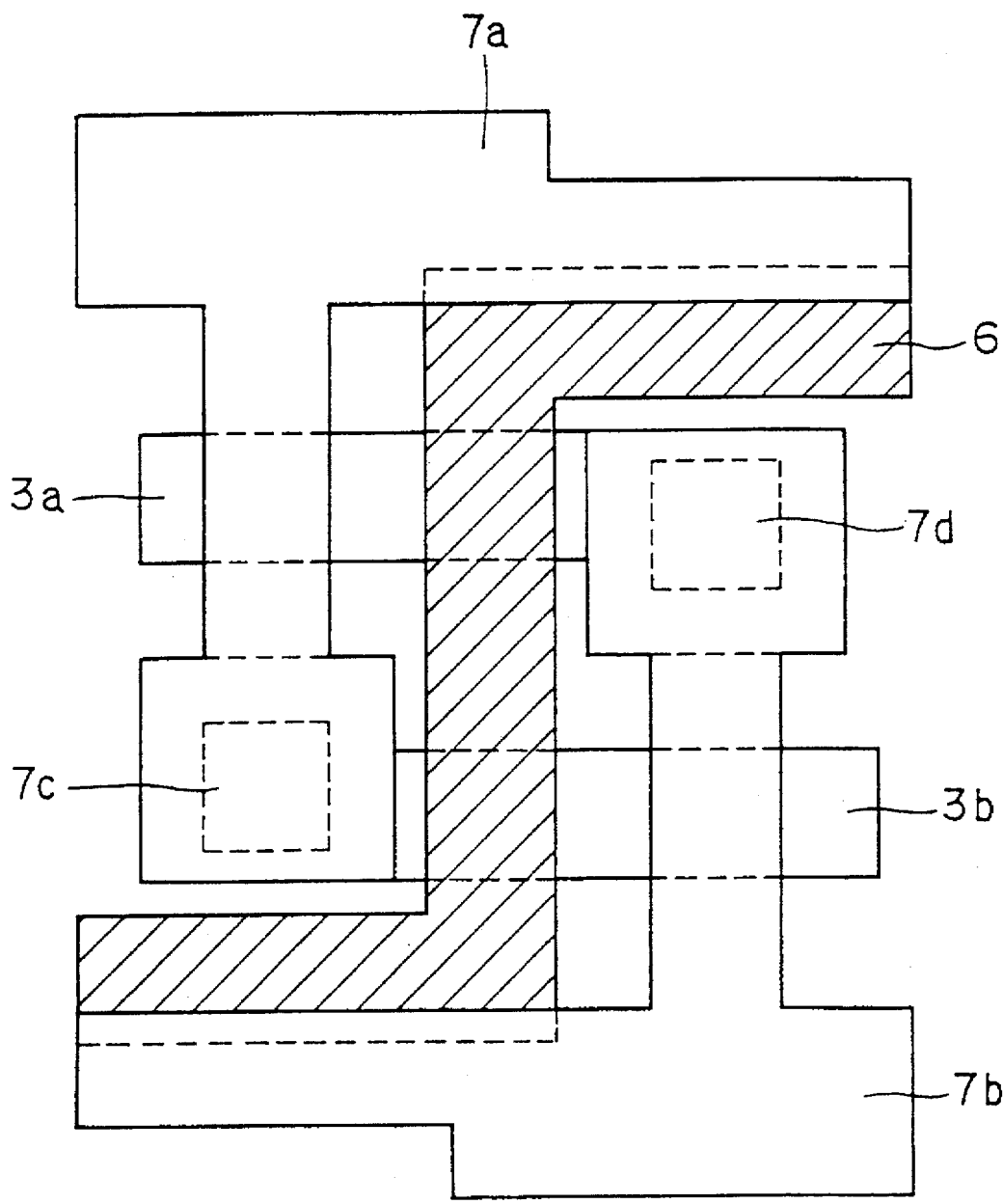
FIG. 9 is a plan view showing a state in which an interconnection layer at which channel region of the TFT is formed, is provided on the word line shown in FIG. 8.

A modification of the stacked structure of the interconnection layers will be described with reference to FIGS. 7 to 9. FIGS. 7 to 9 are plan views showing stepwise the layout of the memory cell of the SRAM of this modification, starting from a lower layer.

Referring first to FIG. 7, in this modification, gate electrodes 3a and 3b of the driver transistors and GND lines 4a and 4b are formed as the first layer of interconnection layer. Then, referring to FIG. 8, on the aforementioned first layer of interconnection (gate electrodes 3a, 3b of the driver transistors and GND lines 4a and 4b), a word line (WL) 6 is formed with an insulating layer (not shown) interposed. The word line 6 serves as a second layer of interconnection layer. Then, referring to FIG. 9, interconnection layers 7a and 7b for forming channels of the TFT are formed as the third layer of interconnection layer, on word line 6 with an insulating layer (not shown) interposed. As in the above described example, the size of the memory cell of the SRAM can be reduced in its height than in the prior art.

Further characteristic portions of the present embodiment will be described with reference to FIGS. 10 to 13.

Figure 10:
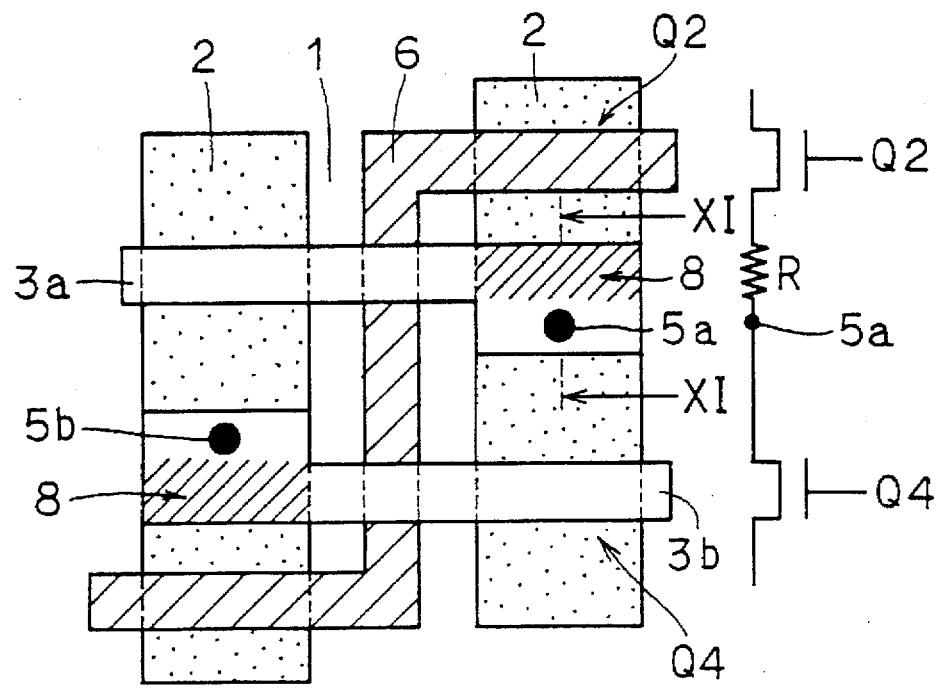
FIG. 10 shows a planar schematic view showing a resistance portion formed in the active region, together with an equivalent circuit diagram thereof.

FIG. 10 shows a layout of the memory cell and corresponding equivalent circuit diagram, illustrating characteristic portions mentioned above. Referring to FIG. 10, in the present embodiment, offset regions 8 are provided in those regions of active regions 2 which are positioned adjacent to contact portions 5a and 5b between the active regions 2 and gate electrodes 3a and 3b of the driver transistors and positioned below gate electrodes 3a and 3b of the driver transistors, respectively.

The offset region 8 serves as a resistance portion. Provision of such an offset region 8 serving as a resistance portion is to adjust the cell ratio at a desired value. Therefore, in this embodiment, active regions 2 come to have uniform width in one memory cell forming region. As a result, the edge shape of the field oxide film 1 defining the shape of the active region 2 can be made straight and parallel to each other. Therefore, generation of the leak current in the memory cell forming region (at the storage node portion) can be prevented.

Again referring to FIG. 10, an access transistor Q2 is formed at a crossing between word line 6 and active region 2. One impurity region of access transistor Q2 is electrically connected to contact portion 5a through resistance R. The resistance R corresponds to the aforementioned offset region 8. At a crossing between gate electrode 3b of the driver transistor and active region 2, driver transistor Q4 is formed. One impurity region of driver transistor Q4 is electrically connected to contact portion 5a.

Figure 11:
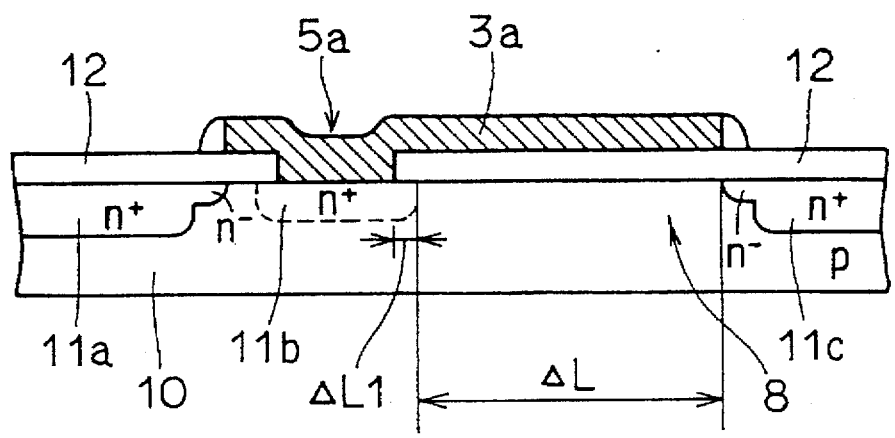
FIG. 11 is a cross section taken along the line XI—XI of FIG. 10.

The offset region 8 mentioned above will be described in greater detail with reference to FIG. 11. FIG. 11 is a cross section taken along the line XI—XI of FIGS. 10 and 4. Referring to FIG. 1, on a surface of a p type semiconductor substrate 10, an n type diffusion layer 11c, which will be one impurity region of driver transistor Q4, and an n type diffusion layer 11a which will be one impurity region of access transistor Q2, are formed, respectively.

On the main surface of p type semiconductor substrate 10, at a contact portion 5a between gate electrode 3a of the driver transistor and p type semiconductor substrate 10, an n type diffusion layer 11 is formed. Offset region 8 is formed between n type diffusion layer 11b and n type diffusion layer 11c.

More specifically, the offset region 8 is a region in which n type impurity has not yet been introduced. Therefore, the impurity concentration of offset region 8 is approximately the same as the concentration of the main surface of p type semiconductor substrate 10. More specifically, it is about 3.0E16 to 1.0E17cm$^{-3}$. The sheet resistance is 1.5KΩ/□.

The value of the resistance R shown in FIG. 10 is adjusted by the length (offset amount) ΔL of offset region 8. It is considered that there is not much amount ΔL1 diffused in the lateral direction of n type diffusion layer 11b, and therefore offset region 8 can almost surely be formed. In FIG. 11, the reference numeral 12 denotes an insulating layer.

Figure 12:
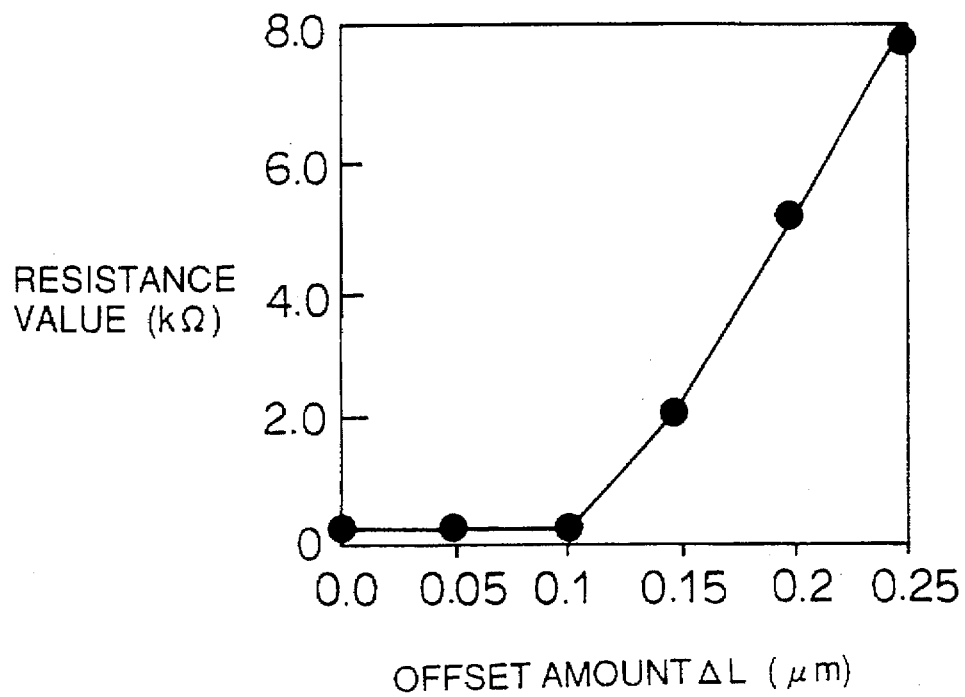
FIG. 12 shows a relation between resistance value and offset amount of the offset region.
Figure 13:
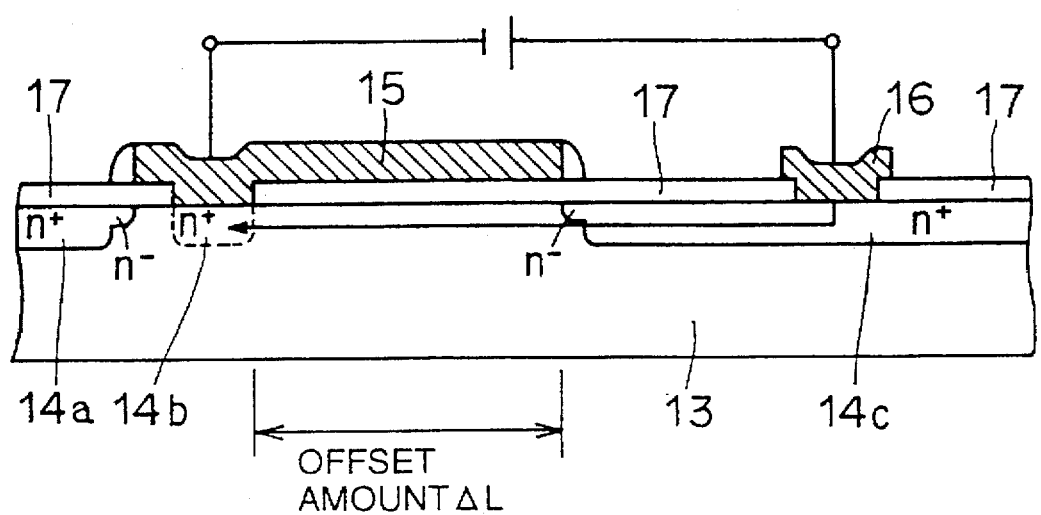
FIG. 13 is an illustration showing a method of measuring the data shown in FIG. 12.

The relation between the offset amount ΔL (μm) and resistance value (Ω) of the offset region 8 will be described with reference to FIGS. 12 and 13. FIG. 12 is a graph showing the relation between offset amount ΔL and the resistance value of offset region 8. FIG. 13 is a cross section illustrating measurement method for obtaining the data of FIG. 12.

First, referring to FIG. 13, n type diffusion layers 14a, 14b and 14c are formed in a main surface of a p type semiconductor substrate 13. On the main surface of p type semiconductor substrate 13, a first electrode 15 electrically connected to n type diffusion layer 14b, and a second electrode 16 electrically connected to n type diffusion layer 14c are formed. That region between n type diffusion layers 14b and 14c to which impurity has not yet been introduced corresponds to the offset region 8. A prescribed potential was applied between the first and the second electrodes 15 and 16 so as to study the relation between the offset amount ΔL and the resistance value of offset region 8. In FIG. 13, the reference numeral 17 denotes an insulating layer.

The result of measurement is as shown in FIG. 12. Referring to FIG. 12, it can be seen that the larger the offset amount ΔL (μm), the larger the resistance value. Namely, the larger the area of the offset region (impurity non-introduced region) 8, the larger the resistance value thereof. Therefore, by ensuring large offset amount ΔL of offset region 8 mentioned above, it becomes possible to increase source resistance at the access transistor at the time of reading, so as to reduce the amount of current flowing through the access transistor. Consequently, a desired cell ratio can be surely obtained.

The method of manufacturing the SRAM having the above structure will be described with reference to FIGS. 18 to 30. In the following description also, a method of manufacturing a BiCMOS type SRAM will be discussed as an example, as in the description of the prior art.

Figure 18:
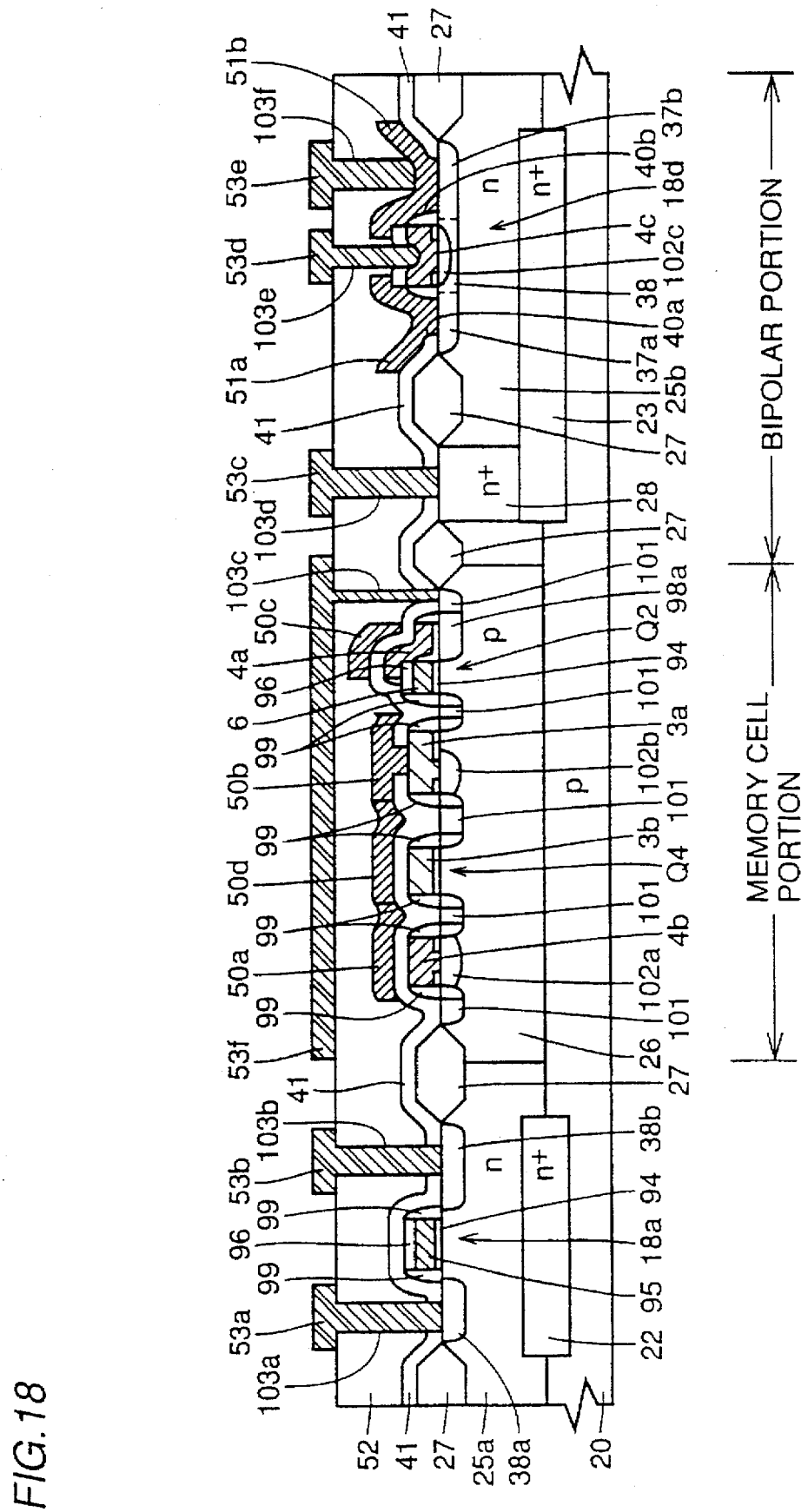
FIG. 18 is a partial cross section showing a BiCMOS type SRAM.

FIG. 18 is a partial cross section of a BiCMOS type SRAM. Referring to FIG. 18, on a main surface of a p type semiconductor substrate 20, a p channel MOS transistor 18a, an access transistor Q2, a driver transistor Q4 and a bipolar transistor 18d are formed. In the BiCMOS type SRAM of the present embodiment, different from the conventional example, external base electrode and 51b of polycrystalline silicon is formed below metal electrode 53e formed of Al, AlCu, W or the like. Therefore, as compared with the prior art, a bipolar transistor of higher performance with the capacitance between base/collector reduced can be obtained. Further, the gate electrode of the TFT is formed so that it also serves as the gate electrode 3b of the driver transistor. This eliminates the step of forming the gate electrode of the TFT.

Other than the above described points, the structure is similar to the prior art example. The method of manufacturing the SRAM shown in FIG. 18 will be described with reference to FIGS. 19 to 30. FIGS. 19 to 29 are cross sections showing the first to the eleventh steps of manufacturing the SRAM shown in FIG. 18.

Figure 19:
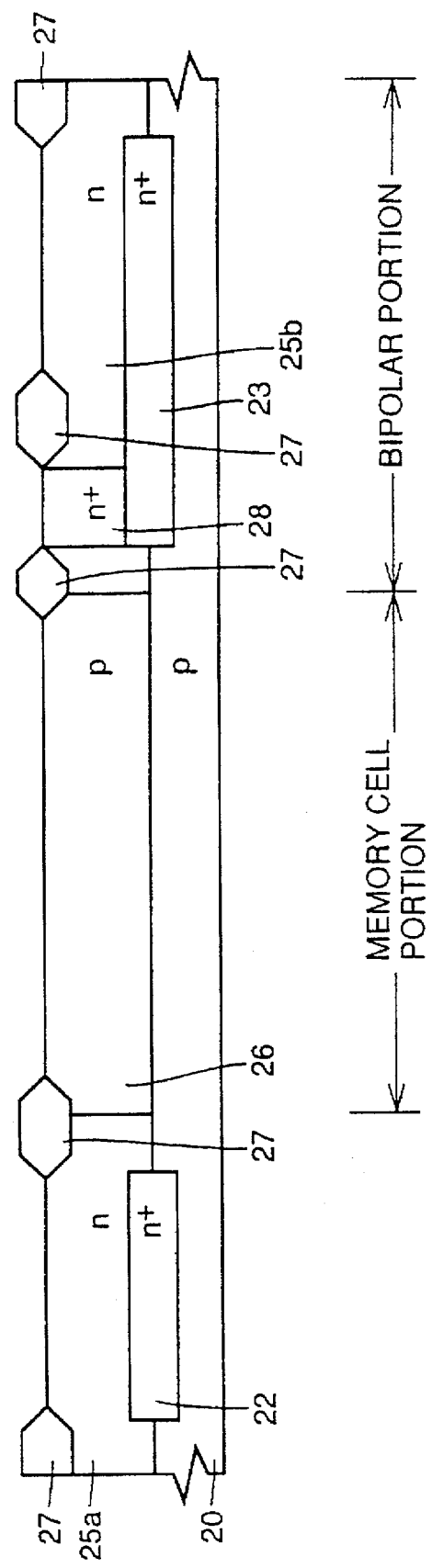
FIGS. 19 to 29 are cross sections showing the first to eleventh steps of manufacturing the BiCMOS type SRAM shown in FIG. 18.

Referring FIG. 19, through the similar steps as the prior art, an n type well region 25a, a p type well region 26, n type diffusion layers 22, 23, 28, an n type epitaxial layer 25b and a field oxide film 27 are formed at the main surface of p type semiconductor substrate 20.

Figure 20:
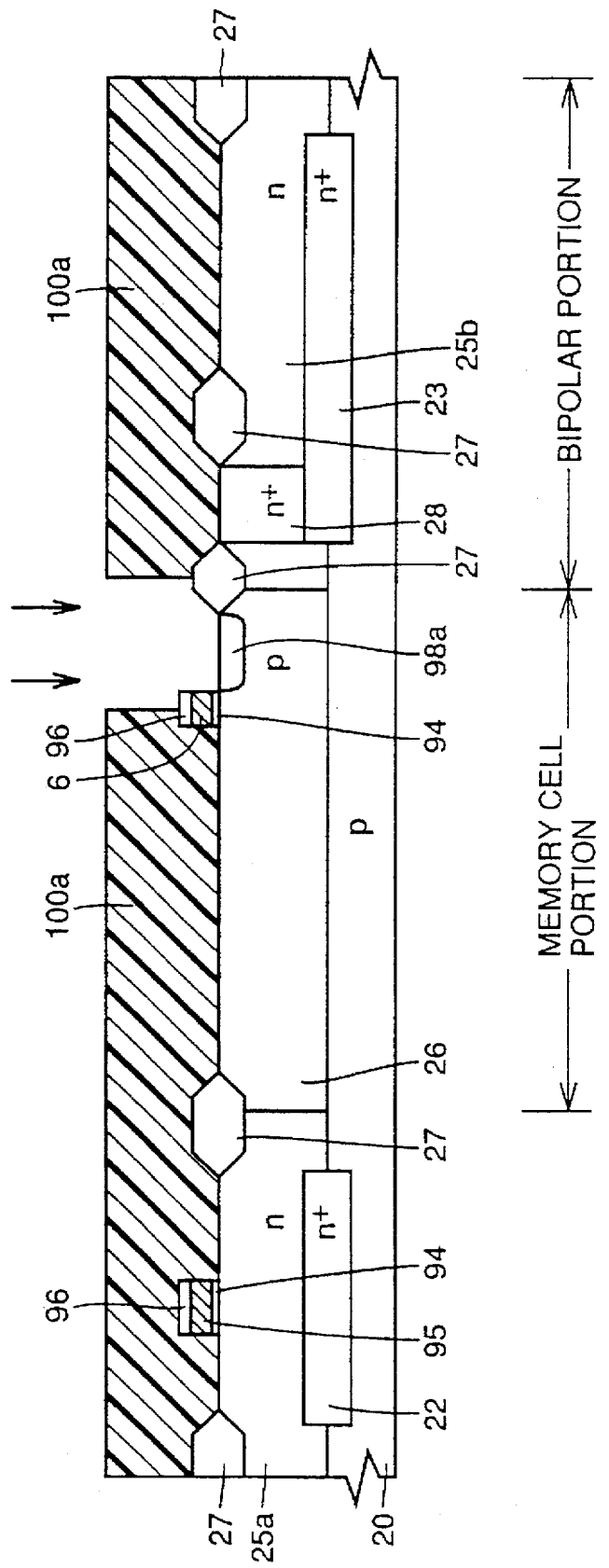

Then, referring to FIG. 20, a gate oxide film 94 is formed entirely over main surface of p type semiconductor substrate 20 by thermal oxidation, for example. On gate oxide film 94, a polycrystalline silicon layer 95 including n type impurity and an oxide film 96 are successively deposited by the LPCVD method, for example. By patterning gate oxide film 94, polycrystalline silicon layer 95 and oxide film 96, a gate electrode 95 of the p channel MOS transistor and a gate electrode 6 of the access transistor Q2 are formed. Then, a resist pattern 100a exposing a bit line contact portion is formed, and an n type impurity is introduced to the surface of p type well region 26 using the resist pattern 100a as a mask. Thus an n type diffusion layer 98a is formed.

Figure 21:
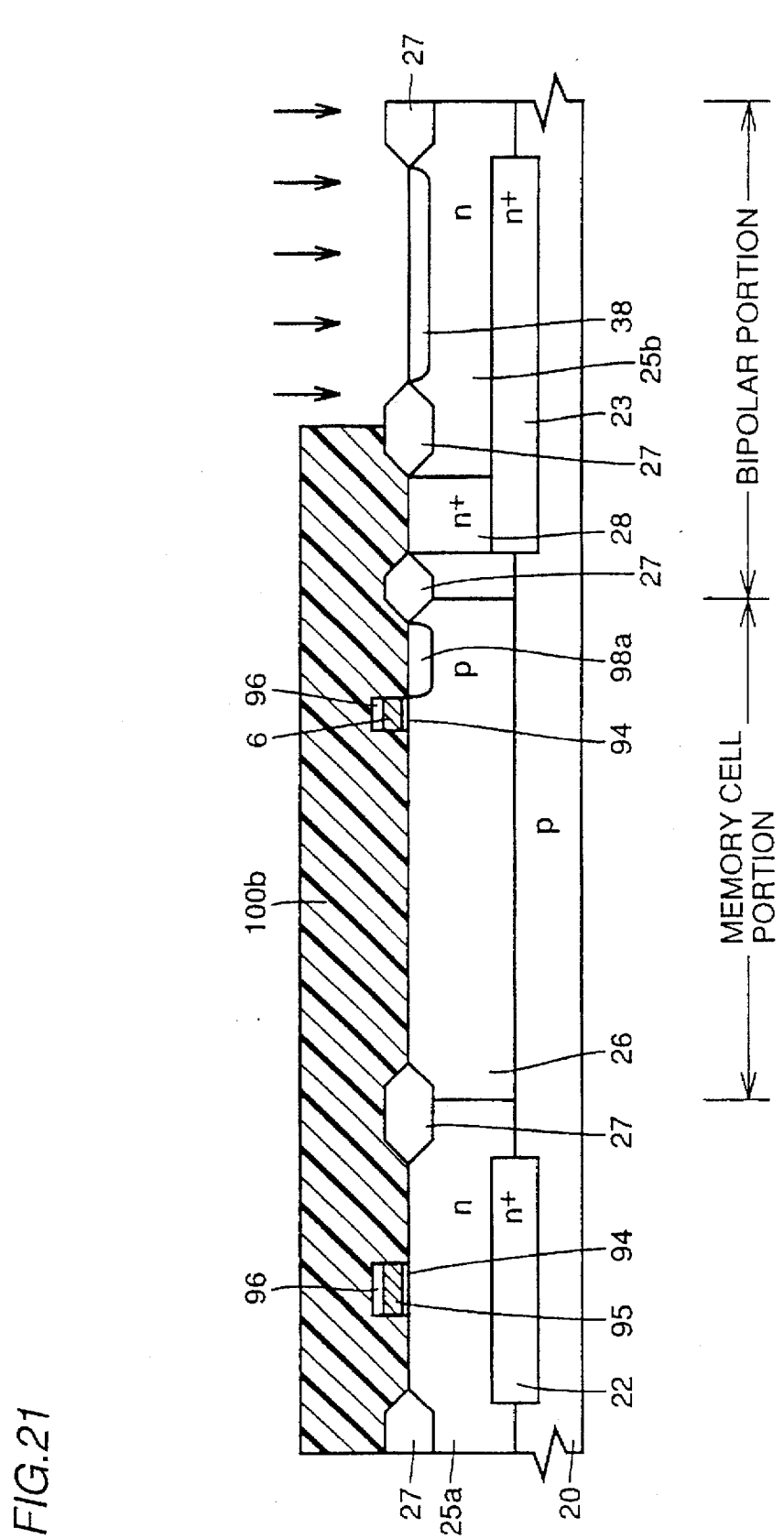

Then, referring to FIG. 21, on the main surface of p type semiconductor substrate 20, a resist pattern 100b exposing a region for forming base region 38 of the bipolar transistor is formed. Boron (B), BF$_2$ or the like is introduced to the surface of an n type epitaxial layer 25b using the resist pattern 100b as a mask. Thus the base region 38 is formed.

Figure 22:
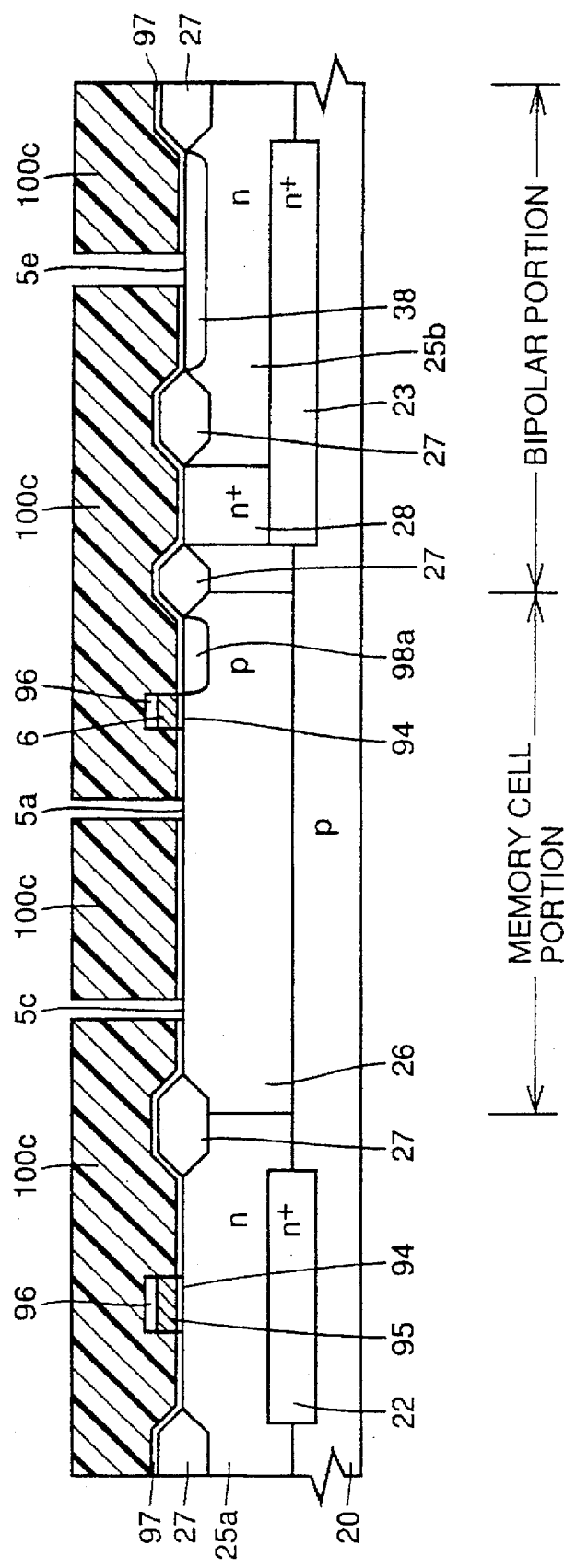

Referring to FIG. 22, an oxide film 97 is formed by thermal oxidation, on the main surface of p type semiconductor substrate 20. A resist pattern 100c having openings at portions positioned above contact portions 5a and 5b and above an emitter forming region 5e of oxide film 97 is formed. Openings are formed in oxide film 97 by using resist pattern 100c as a mask. At this time, an n type impurity may be introduced to the surface of p type well region 26 and to the surface of n type epitaxial layer 25b through the aforementioned openings. This allows reduction of contact resistance.

Figure 23:
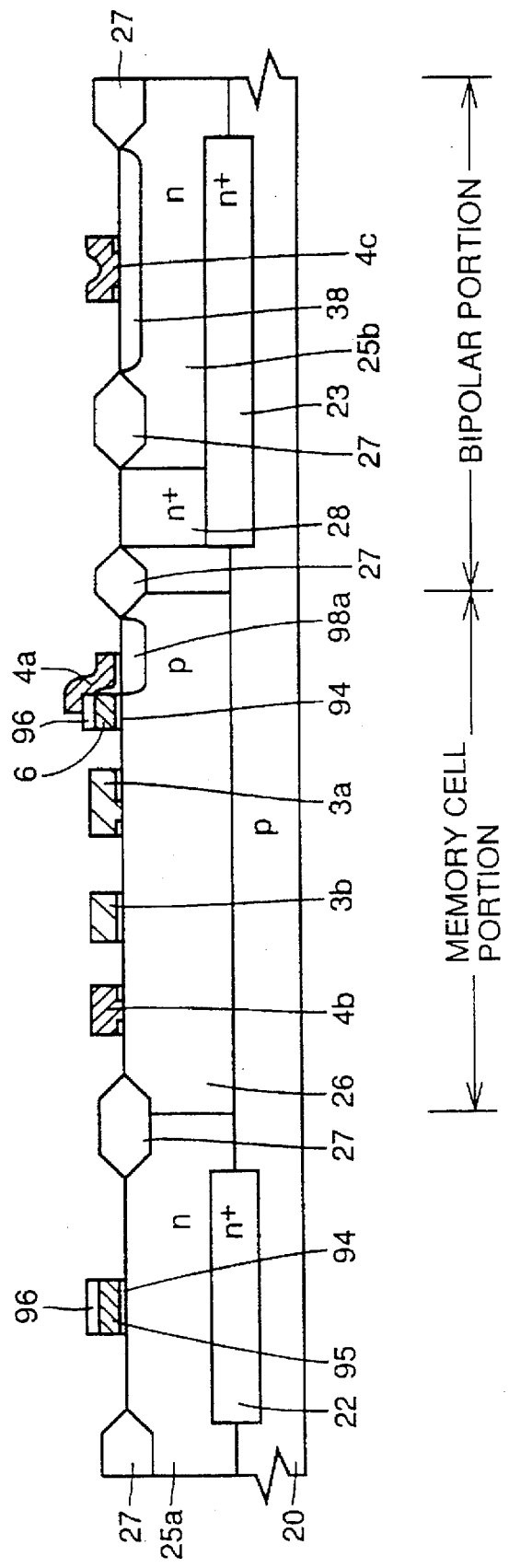

Next, referring to FIG. 23, a polycrystalline silicon including an n type impurity is deposited by the LPCVD method on oxide film 97. By patterning the polycrystalline silicon layer, GND lines 4a and 4b, gate electrodes 3a and 3b of the driver transistors and an emitter electrode 4c of the bipolar transistor are formed.

Figure 24:
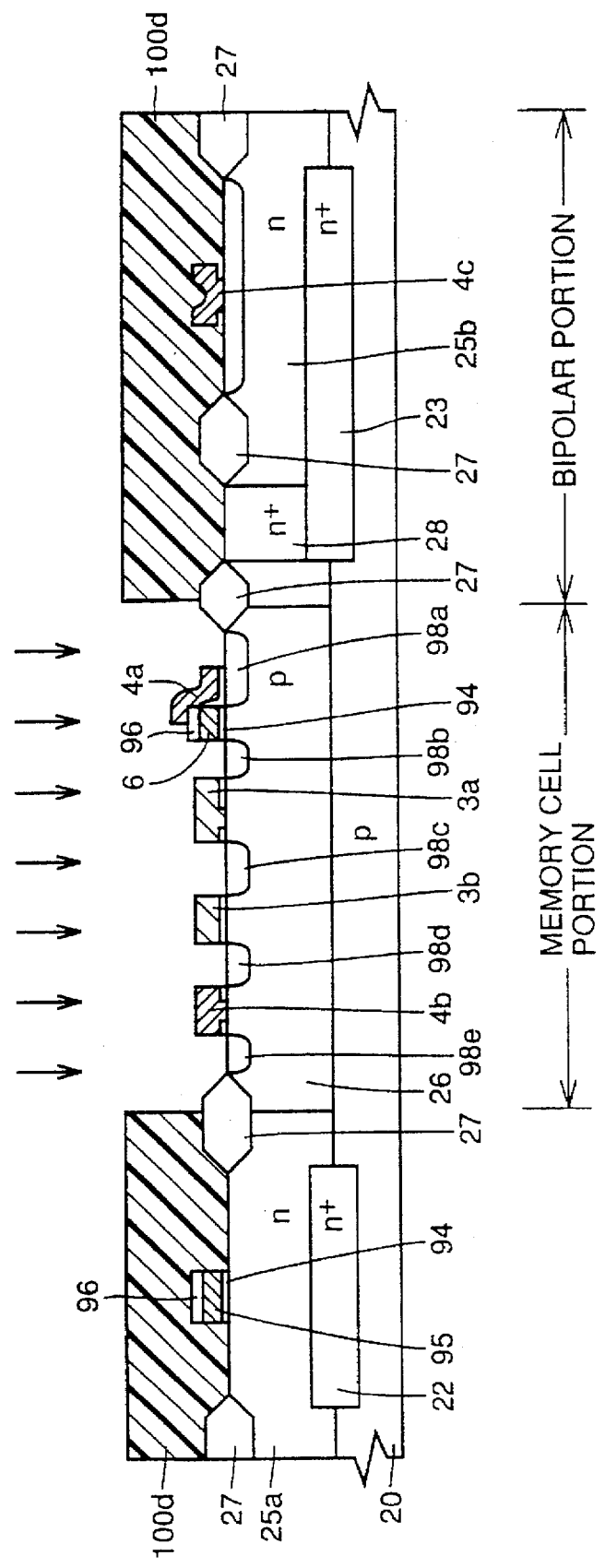

Then, referring to FIG. 24, on the main surface of p type semiconductor substrate 20, a resist pattern 100d exposing a memory cell portion is again formed. An n type impurity is introduced to the surface of p type well region 26, using resist pattern 100d as a mask. Thus, n type diffusion layers 98a, 98b, 98c, 98d, 98e are formed.

Figure 25:
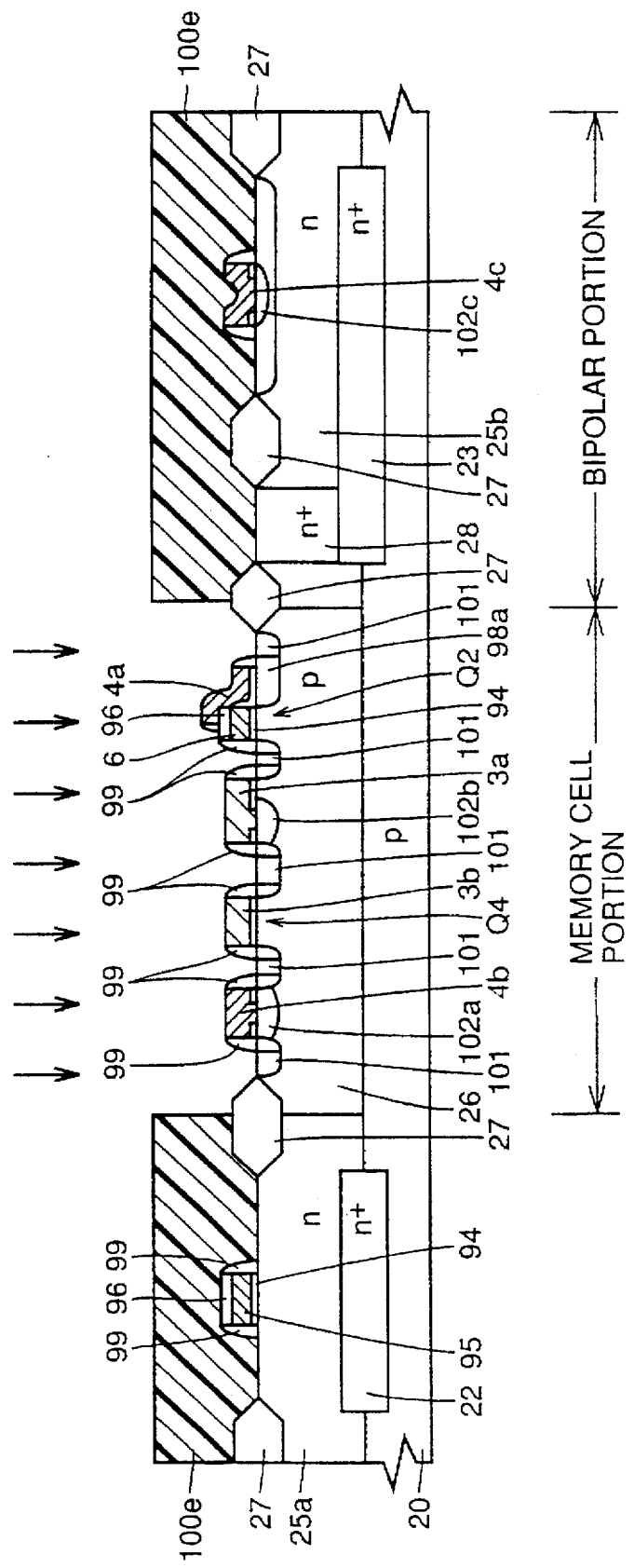

Then, referring to FIG. 25, a sidewall insulating layer 99 is formed on sidewalls of each of the above mentioned gate electrodes. A resist pattern 100e exposing the memory cell portion is formed. An n type impurity is introduced to the surface of p type well region 26 using the resist pattern 100e as a mask. Thus an n$^+$ diffusion layer 101 is formed. As a result, an LDD structure is formed. At this time, by thermal processing, n type impurity included in the gate electrode is diffused into the substrate, resulting in n type layers 102a, 102b and 102c. The n type layer 102c serves as the emitter region of the bipolar transistor.

Figure 26:
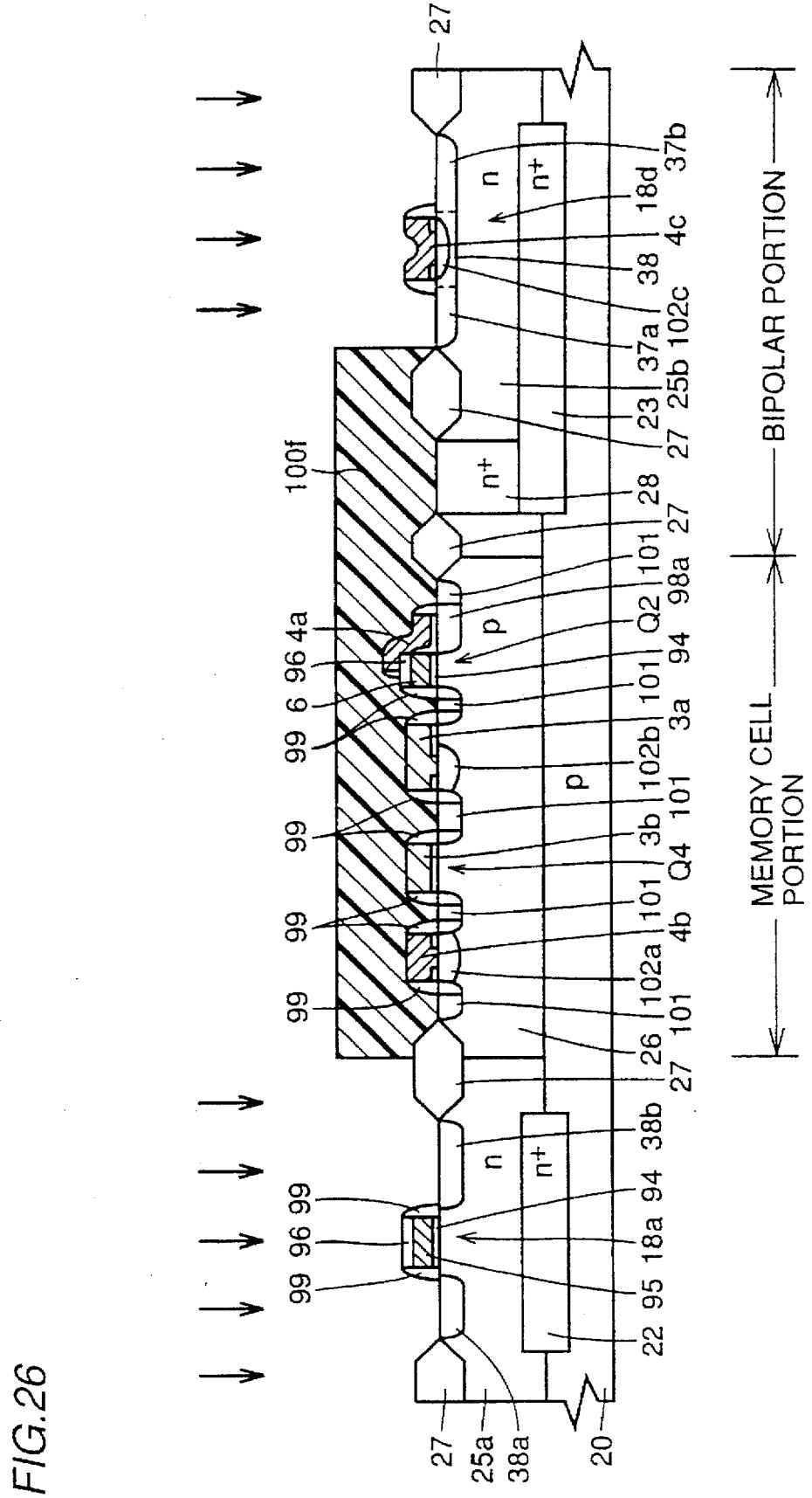

Next, referring to FIG. 26, on the main surface of p type semiconductor substrate 20, a resist pattern 100f exposing a region for forming a p channel MOS transistors 18a and a region for forming a bipolar transistor 18d is formed. By using resist pattern 100f, gate electrode 95 and emitter electrode 4c as a mask, a p type impurity is introduced to the surfaces of n type well region 25a and n type epitaxial layer 25b. Consequently, p$^+$ diffusion layers 38a and 38b which will be source/drain regions of p type MOS transistor 18a, and external base regions 37a and 37b of bipolar transistor 18d are formed, respectively.

Figure 27:
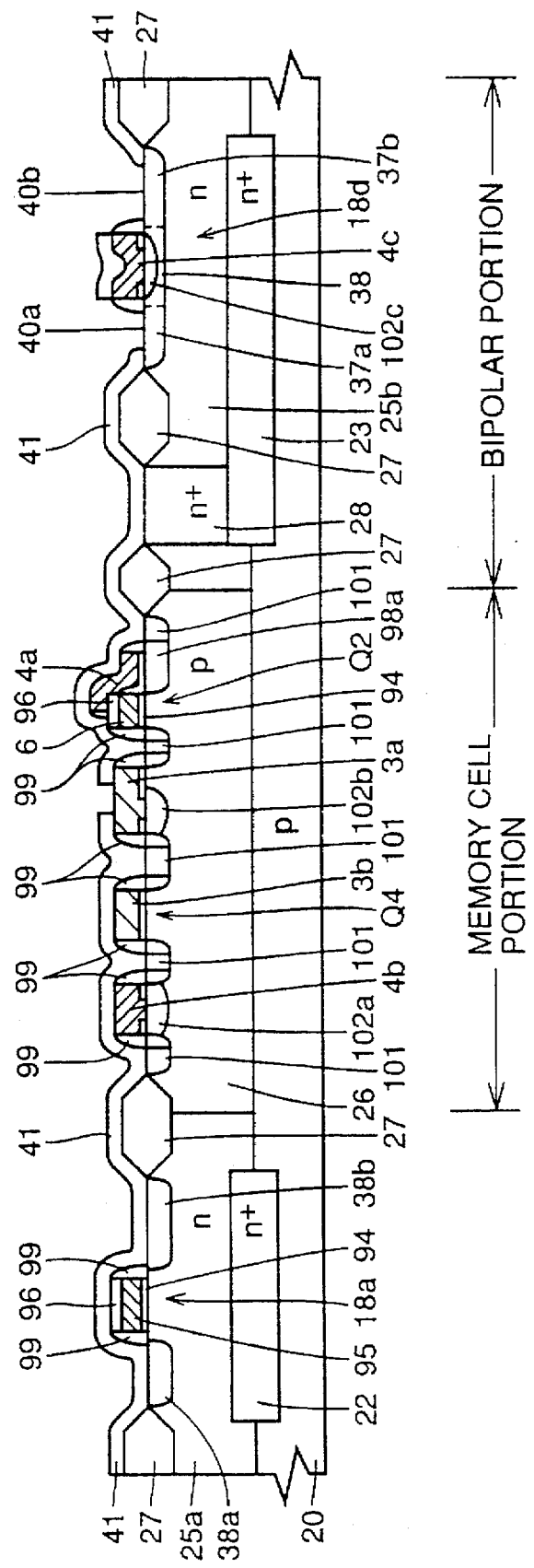

Then, referring to FIG. 27, an insulating layer 41 such as a silicon oxide film is used, for example, by the LPCVD method, entirely over the main surface of p type semiconductor substrate 20. By etching the insulating layer 41, openings are formed above gate electrode 3a, and contact holes 40a, 40b exposing portions of the surfaces of external base regions 37a and 37b are provided.

Figure 28:
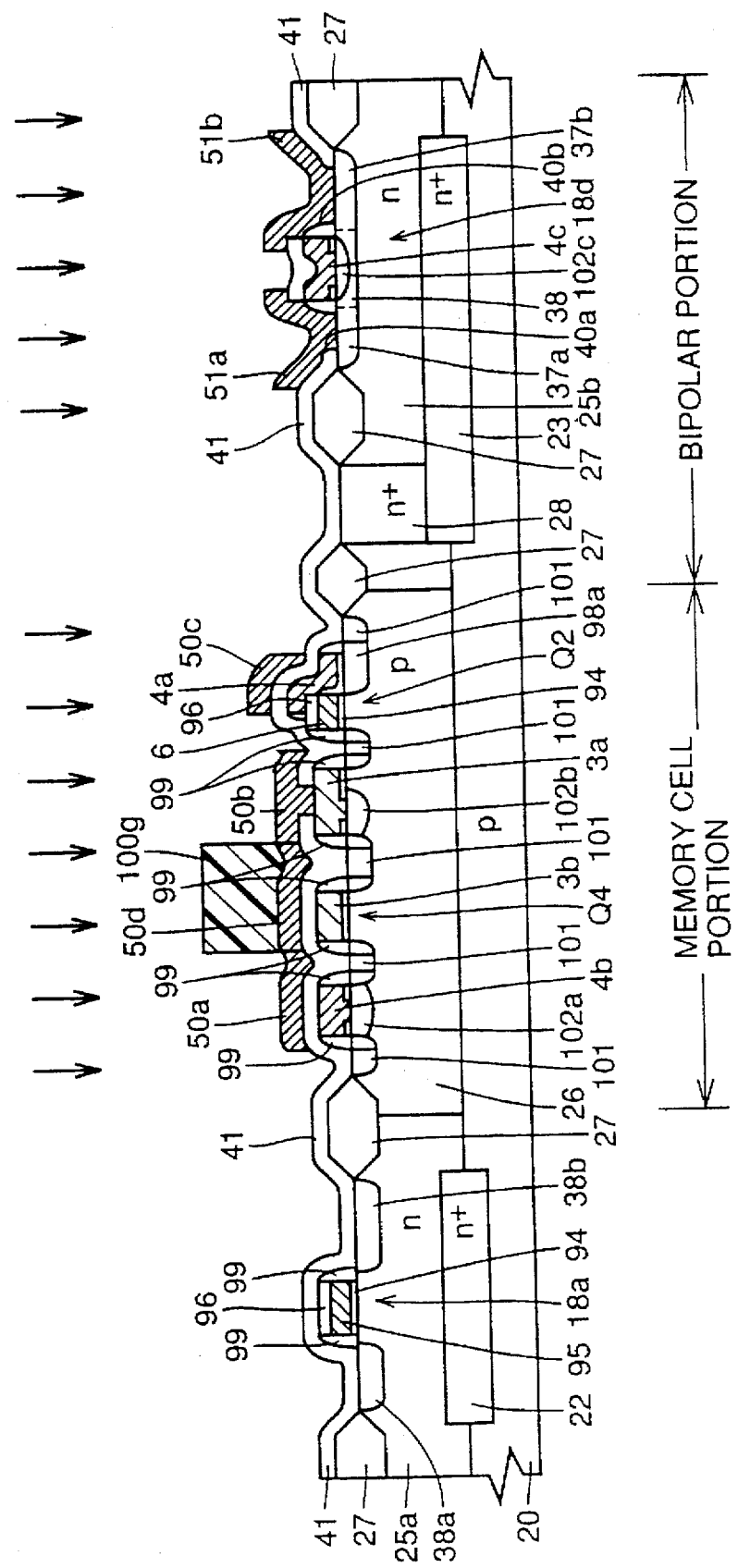

Referring to FIG. 28, a polycrystalline silicon layer (or an amorphous silicon layer) having a prescribed thickness is formed entirely on the main surface of p type semiconductor substrate 20 by using, for example, LPCVD method. The polycrystalline silicon layer is patterned and thereafter, on the polycrystalline silicon layer, a resist pattern 100g having openings at prescribed positions is formed. A p type impurity is introduced to the polycrystalline silicon layer, using the resist pattern 100g as a mask. Consequently, source/drain regions 50a, 50b, 50c of the TFTs and external base regions 51a and 51b are formed simultaneously.

By providing external base electrodes 51a and 51b as described above, a so called double polysilicon type bipolar transistor is provided. This enables higher speed of operation of the bipolar transistor, and the capacitance between the base/collector is reduced, for example. Details of this phenomenon is disclosed, for example, in *IEEE SYMPOSIUM ON VLSI TECHNOLOGY DIGEST OF TECHNICAL PAPERS*, Jun. 2–4, 1992, PP. 34–35.

In order to realize higher speed of operation of the SRAM, it is necessary to employ a bipolar transistor of high performance. In such an occasion, it is effective to use the double polysilicon type bipolar transistor of the type described above. However, in the conventional structure, formation of such a double polysilicon type bipolar transistor was not preferable. The reason for this is that formation of the double polysilicon type bipolar transistor in the conventional example requires complicated steps of manufacturing.

More specifically, in the prior art, four layers of polycrystalline silicon layers are formed in the memory cell. If the external base electrodes 51a and 51b of polycrystalline silicon layer such as provided in the present embodiment are to be formed, an additional polycrystalline silicon layer is further required. To avoid this, it may be possible to use the polycrystalline silicon layer in the memory cell also as the polycrystalline silicon layer for the external base electrodes 51a and 51b. In that case, the polycrystalline silicon layer constituting the first gate mentioned above would be shared. However, the first gate in the memory cell is doped with n type impurity, while polycrystalline silicon layer for the external base electrodes 51a and 51b must be doped with p type impurity. Therefore, it becomes necessary to implant different impurities separately into the polycrystalline silicon layer. This requires complicated processes of manufacturing.

In view of the foregoing, in the prior art, a double polysilicon type bipolar transistor has not been provided. By contrast, in the present embodiment, the polycrystalline silicon layer in which the source/drain regions of the TFT are formed is formed simultaneously with the external base electrodes 51a and 51b. Consequently, an SRAM having superior performance can be obtained without making the manufacturing process complicated.

Now, the points which allow simultaneous formation of the source/drain regions 50a, 50b and 50c of the TFTs and the base lead out electrode (external base electrodes 51a, 51b) of the bipolar transistor in the present invention will be described.

In the prior art, the interconnection layer in which the channel region of the TFT is formed is not formed in the same step as the base lead out electrode, since optimal thicknesses of these layers differ from each other.

More specifically, it has been preferred that the interconnection layer in which source/drain regions and the channel region of the TFTs are formed is relatively thinner than that required for the base lead out electrode. The reason for this is that primary requirement in the TFT is the reduction of leak current, while the primary requirement of the base lead out electrode is the reduction of the resistance value. If the interconnection layer in which the channel region and the source/drain regions of the TFT is made thick, it is likely that the leak current is increased in proportion to the thickness. Therefore, the interconnection layer in which the channel region and the source/drain regions of the TFT are formed cannot be made thick.

In view of the foregoing, conventionally, it was impossible to form the interconnection layer in which the channel region and the source/drain regions of the TFT are formed in the same step as the base electrodes. However, thanks to recent improvement of the devices, and optimization of conditions for thermal processing, it becomes possible to enlarge grain diameter of silicon included in polycrystalline silicon layer even if the layer is relatively thick.

Figure 30:
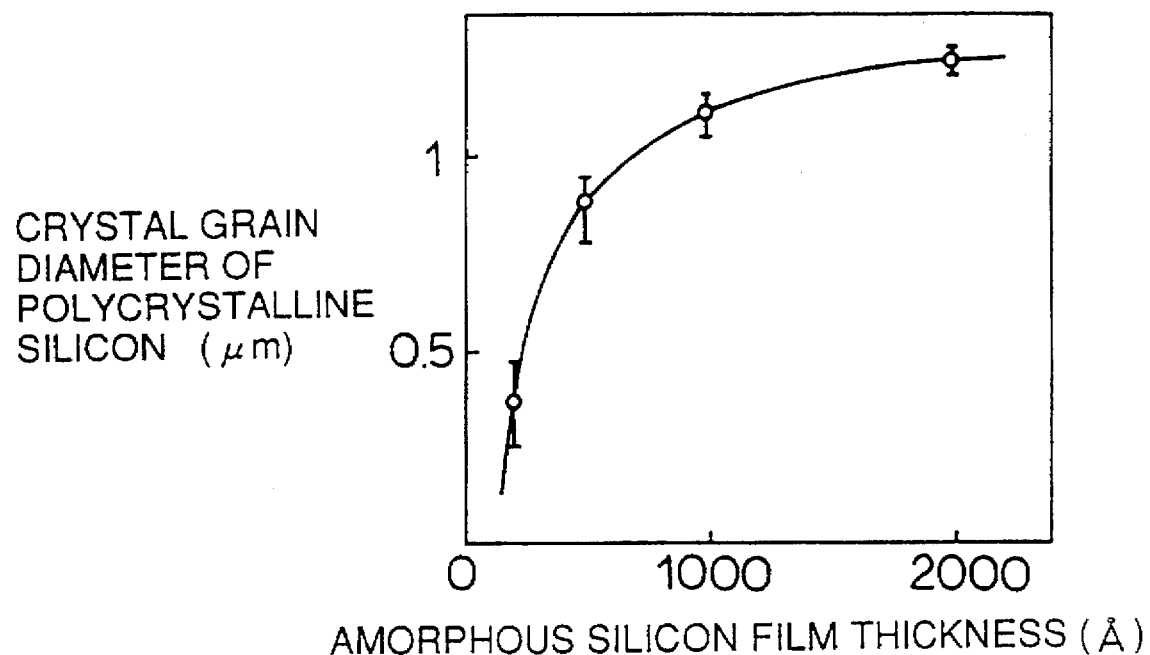
FIG. 30 is a graph showing a relation between film thickness of amorphous silicon and crystal grain diameter of polycrystalline silicon.

FIG. 30 is a graph showing the relation between the film thickness of an amorphous silicon and crystalline grain diameter of polysilicon, when thermal processing at 600° C. is performed for about 12 hours. As can be seem from FIG. 30, even if the thickness of amorphous silicon exceeds 1000 Å, crystal grain diameter of 1 μm or larger can be obtained stably. When the grain size is enlarged as in this example, the leak current of the TFT can be reduced even when the layer is used as the interconnection layer for forming the channel region and the source/drain regions of the TFT.

From the foregoing, it becomes possible to form the interconnection layer 50 in which the channel region and the source/drain regions of the TFT are formed and the external base electrodes 51a and 51b in the same step, by setting the thicknesses of the interconnection layer 50 in which the channel region and the source/drain regions of the TFT are formed and of the polycrystalline silicon layer for forming external base electrodes 51a and 51b to about 1000 Å to about 2000 Å and by carrying out thermal processing at 600° C. for about 12 hours. Consequently, a BiCMOS type SRAM including a double polysilicon type bipolar transistor of superior performance and a TFT in the memory cell portion can be formed without much increasing the number of manufacturing steps with relatively small number of layers, that is, three layers of polycrystalline silicon layers deposited.

Figure 29:
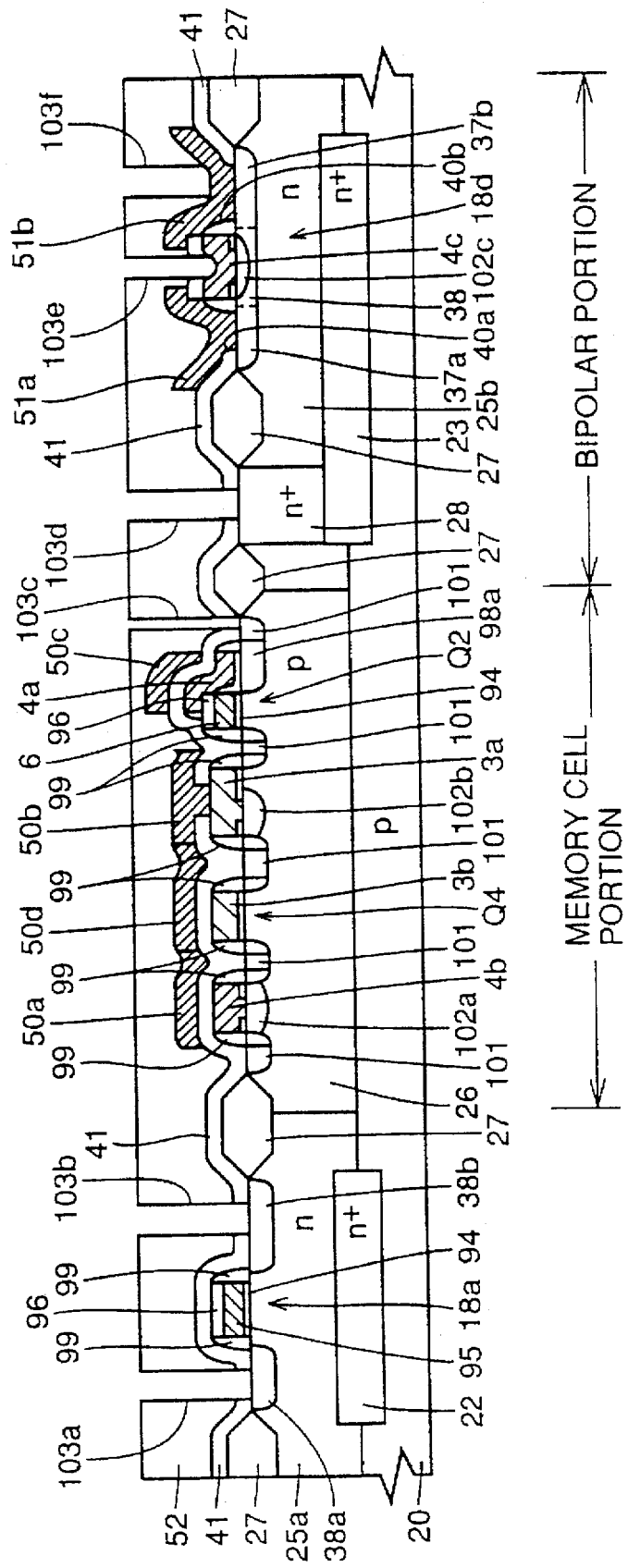

Thereafter, through the similar steps as in the prior art, an insulating layer 52 of silicon oxide film, for example, is formed as shown in FIG. 29, and contact holes 103a, 103b, 103c, 103d, 103e and 103f are formed. Metal electrodes 53a, 53b, 53c, 53d, 53e and 53f of Al, AlCu, W or the like are formed. Through these steps, the BiCMOS type SRAM shown in FIG. 18 is completed. In place of the polycrystalline silicon layer, a polycide film such as a laminated film of WSi and polycrystalline silicon, a laminated film of TiSi and polycrystalline silicon or the like may be used. By doing so, interconnection resistance can be reduced.

<Other Example of the Manufacturing Method>

Figure 31:
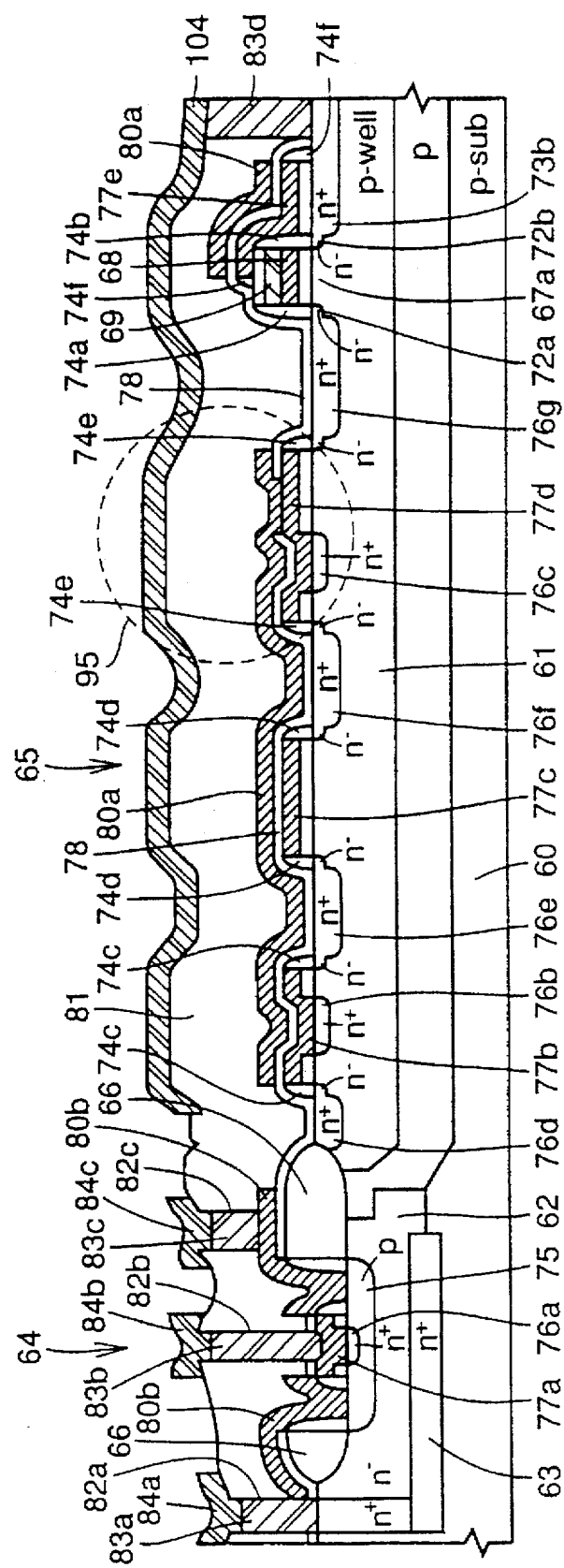
FIG. 31 is a partial cross section of a BiCMOS type SRAM manufactured through another method in accordance with the present invention.

Another method of manufacturing the BiCMOS type SRAM will be described with reference to FIGS. 31 to 46. FIG. 31 is a cross section showing the structure of the BiCMOS type SRAM formed through the following manufacturing steps. In the cross section of FIG. 31, different from the example of FIG. 18, a p channel MOS transistor is not shown. In the BiCMOS type SRAM shown in FIG. 31, a field oxide film is etched and a bipolar transistor is formed therein. Except these points, the device is similar to the BiCMOS type SRAM shown in FIG. 18.

The method of manufacturing the BiCMOS type SRAM shown in FIG. 31 will be described with reference to FIGS. 32 to 46. FIGS. 32 to 46 are cross sections showing the first to fifteenth steps of manufacturing the BiCMOS type SRAM shown in FIG. 31.

Figure 32:
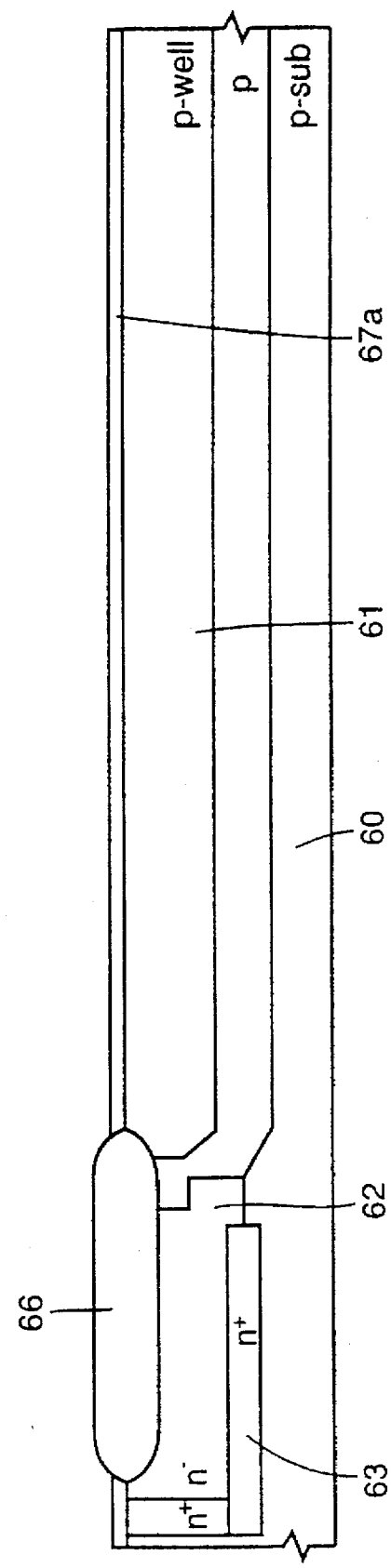
FIGS. 32 to 46 are cross sections showing the first to fifteenth steps of manufacturing the BiCMOS type SRAM shown in FIG. 31.

Referring to FIG. 32, through the similar steps as in the prior art, a p type well region 61, an n type epitaxial layer 62, an $n^+$ diffusion layer 63, a filed oxide film 66 and a gate oxide film 67a are formed on a main surface of a p type semiconductor substrate 60.

Figure 33:
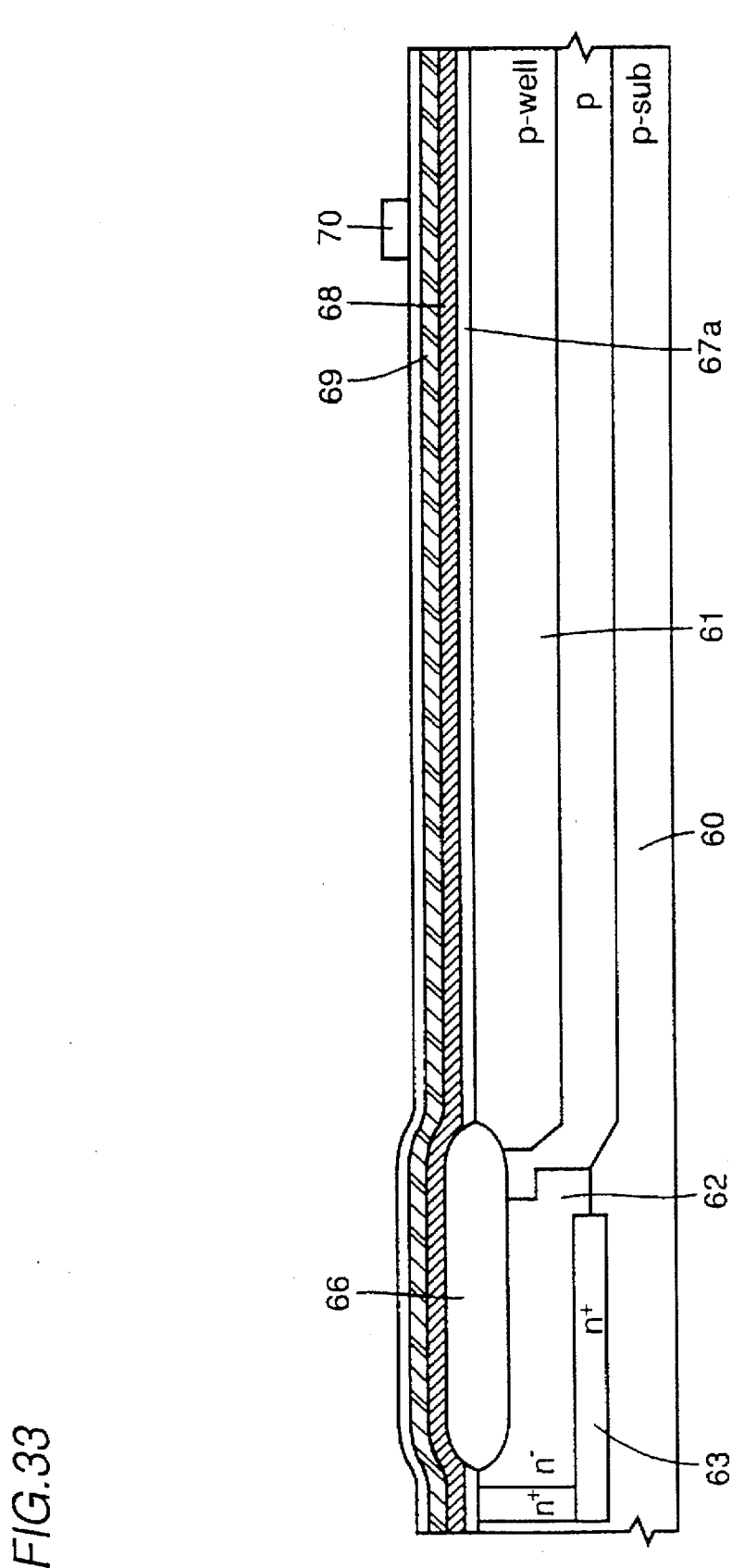

Then, referring to FIG. 33, a polycrystalline silicon layer 68, a WSi layer 69 (or other silicide layer such as TiSi) and a TEOS (Tetraethyl Orthosilicate) film 70 are formed successively by, for example, the CVD method. Then, the TEOS film 70 is patterned to have a prescribed shape.

Figure 34:
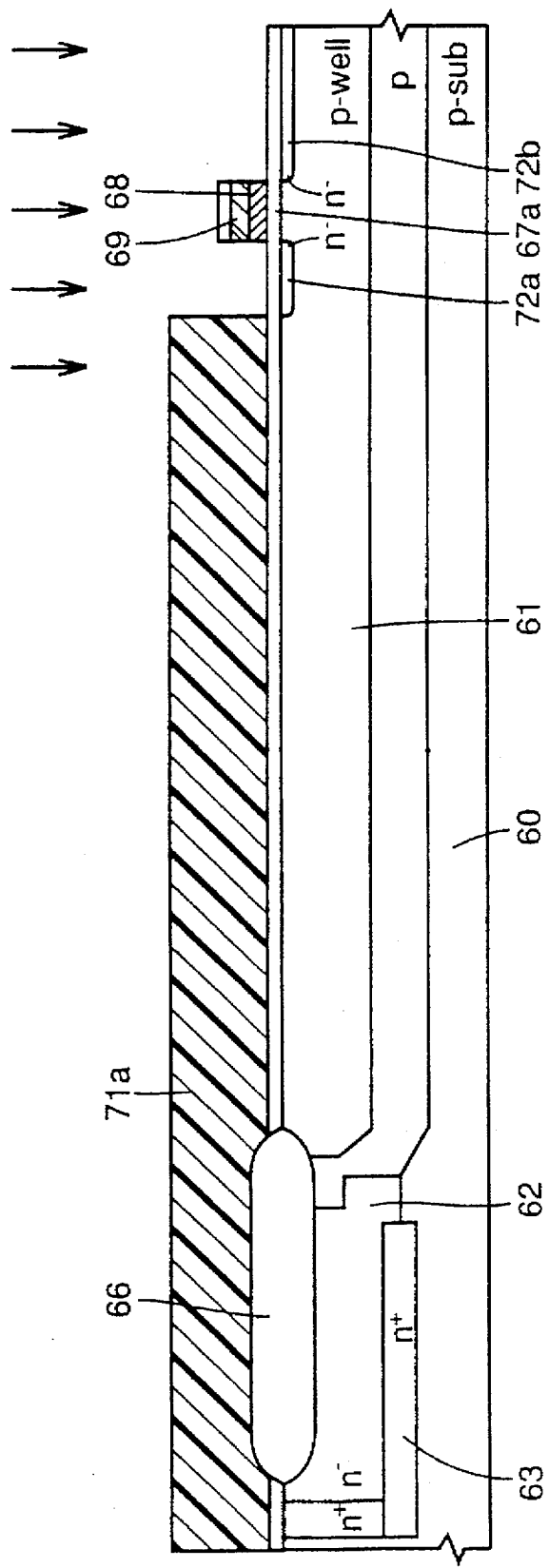

Then, referring to FIG. 34, polycrystalline silicon layer 68 and WSi layer 69 are patterned, using TEOS film 70 as a mask. Consequently, a gate electrode 6 of access transistor Q2 which will be the word line shown in FIG. 3 is formed. Namely, the gate electrode of the access transistor is formed by the first layer of interconnection layer. Then, on the main surface of p type semiconductor substrate 60, a resist pattern 71a exposing an access transistor forming region is formed. By using resist pattern 71a and gate electrodes 68 and 69 as a mask, an n type impurity is introduced to the surface of p type well region 61. Thus $n^-$ type diffusion layers 72a and 72b are formed, respectively. These will be the source/drain regions of the access transistor.

Figure 35:
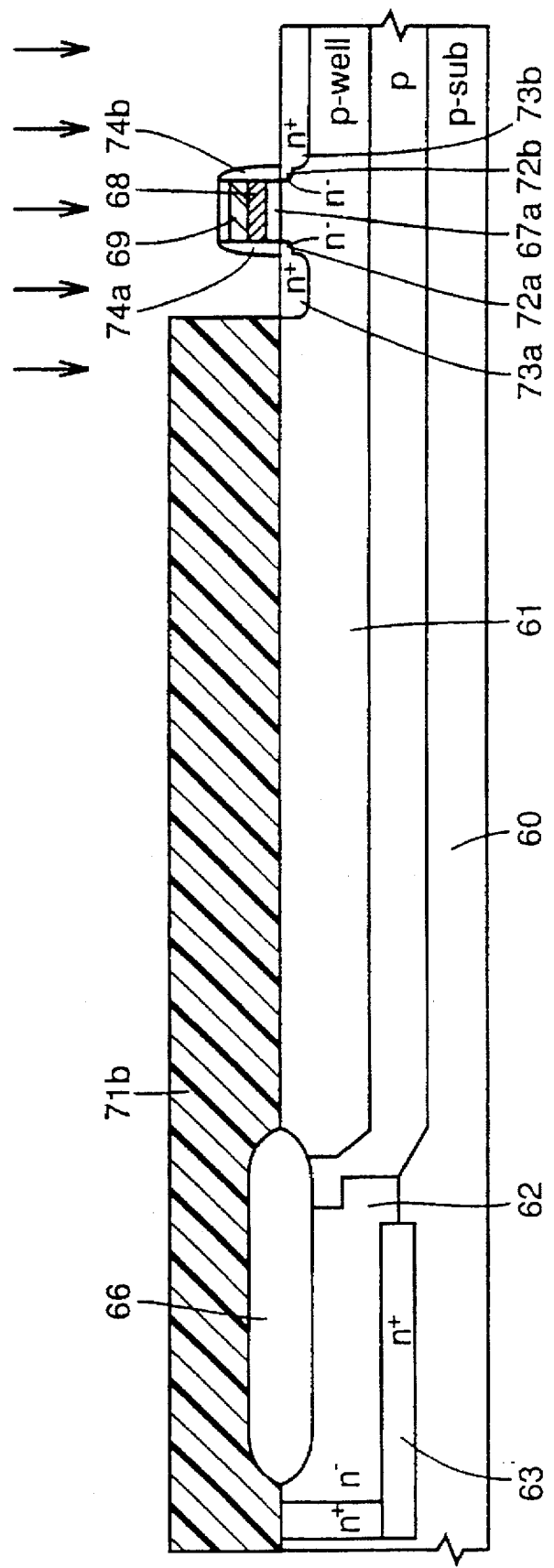

Then, referring to FIG. 35, the resist pattern 71a mentioned above is removed, and then a silicon oxide film (not shown) is deposited entirely over the main surface of p type semiconductor substrate 60. The silicon oxide film is anisotropically etched to form sidewall oxide films 74a and 74b.

Then, on the main surface of p type semiconductor substrate 60, a resist pattern 71b exposing the access transistor forming region is formed again. By using resist pattern 71b, gate electrodes 68 and 69 of the access transistor and sidewall oxide films 74a and 74b as a mask, an n type impurity is introduced to the surface of p type well region 61. Consequently, $n^+$ diffusion layers 73a and 73b are formed. Thus, the LDD structure is provided.

Figure 36:
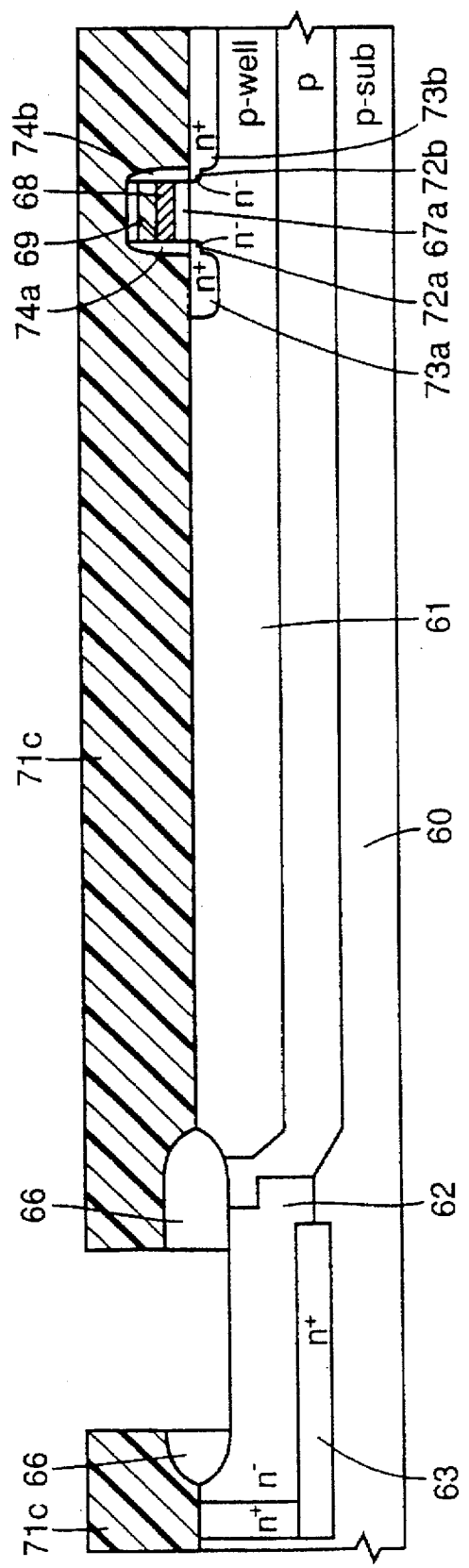

Then, referring to FIG. 36, a resist pattern 71c exposing a portion of the surface of field oxide film 66 is formed on the main surface of p type semiconductor substrate 60. Using resist pattern 71c as a mask, field oxide film 66 is etched. Consequently, a portion of the surface of n type epitaxial layer 62 is exposed. Thereafter, resist pattern 71c is removed.

Figure 37:
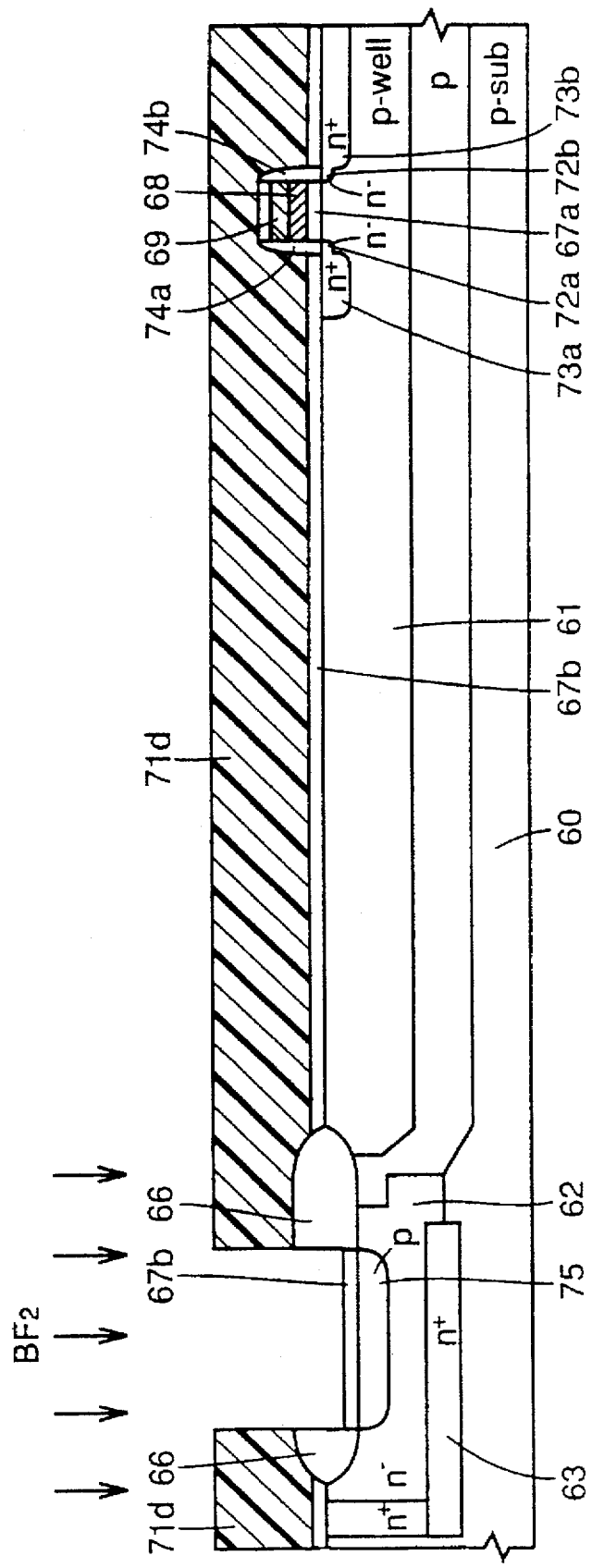

Then, referring to FIG. 37, a gate oxide film 67b for the driver transistor is formed, for example, by thermal oxidation, on the entire surface of p type semiconductor substrate 60. Then, on the main surface of p type semiconductor substrate 60, a resist pattern 71d having an opening at the bipolar transistor forming region is formed. By using resist pattern 71d as a mask, a p type impurity such as $BF_2$ is introduced to the surface of n type epitaxial layer 62. Consequently, a base region 75 is formed.

Figure 38:
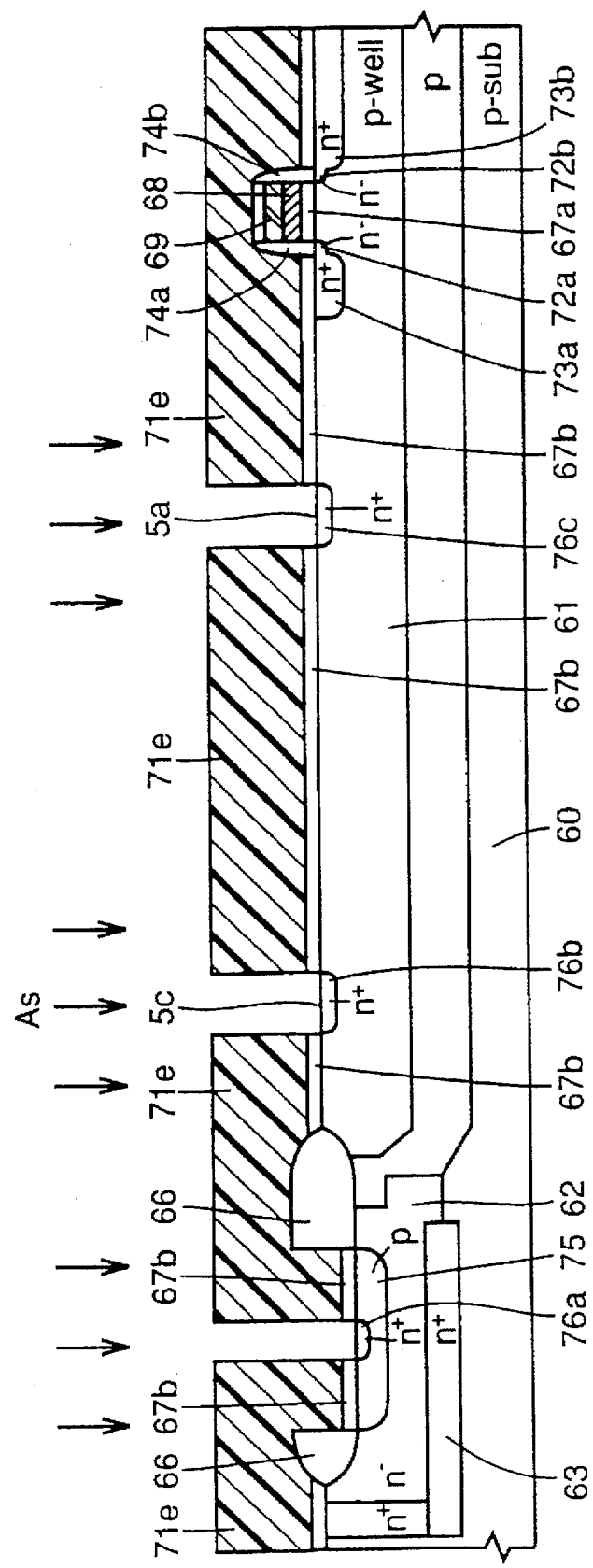

Then, referring to FIG. 38, a resist pattern 71e having openings at prescribed positions is formed on the main surface of p type semiconductor substrate 60. By using resist pattern 71e, gate oxide film 67b is selectively etched. Consequently, gate oxide film 67b positioned on the surface of the emitter region of the bipolar transistor, at the contact portion 5a between the gate electrode of the driver transistor and the active region, and at the contact portion 5c between the GND line and the active region are selectively removed.

Thereafter, by using resist pattern 71e as a mask, an n type impurity such as As is introduced to the surface of p type well region 61 as well as to a portion of the surface of base region 75. Consequently, emitter region 76a and $n^+$ diffusion layers 76b and 76c are formed, respectively. Thereafter, resist pattern 71e is removed.

Figure 39:
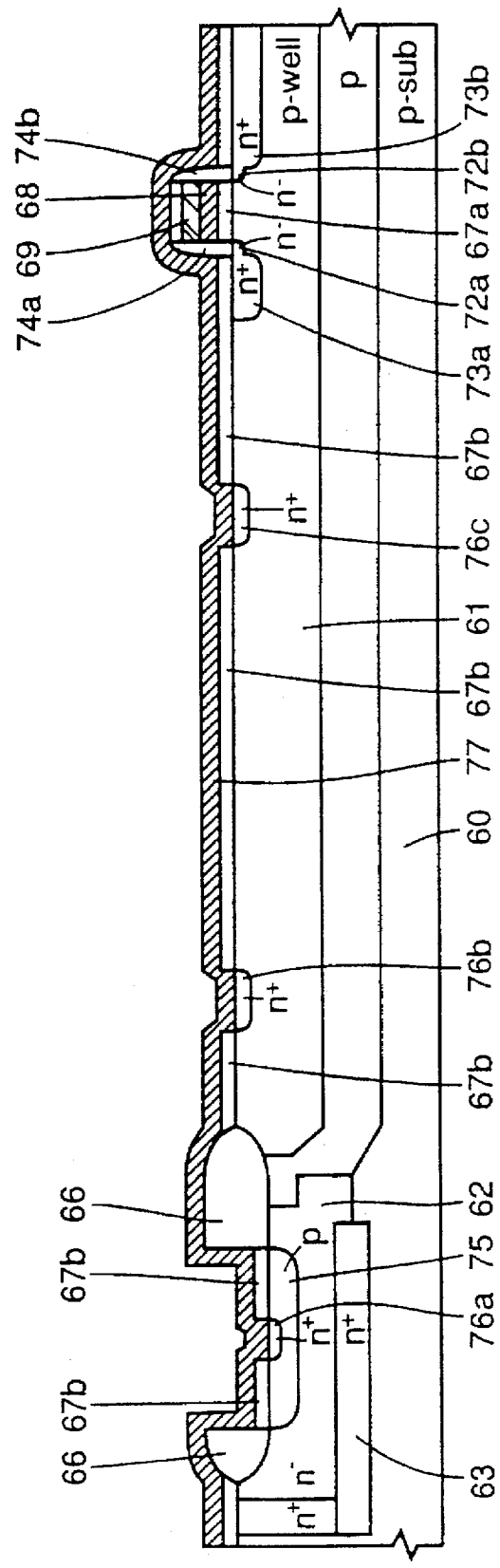
Figure 40:
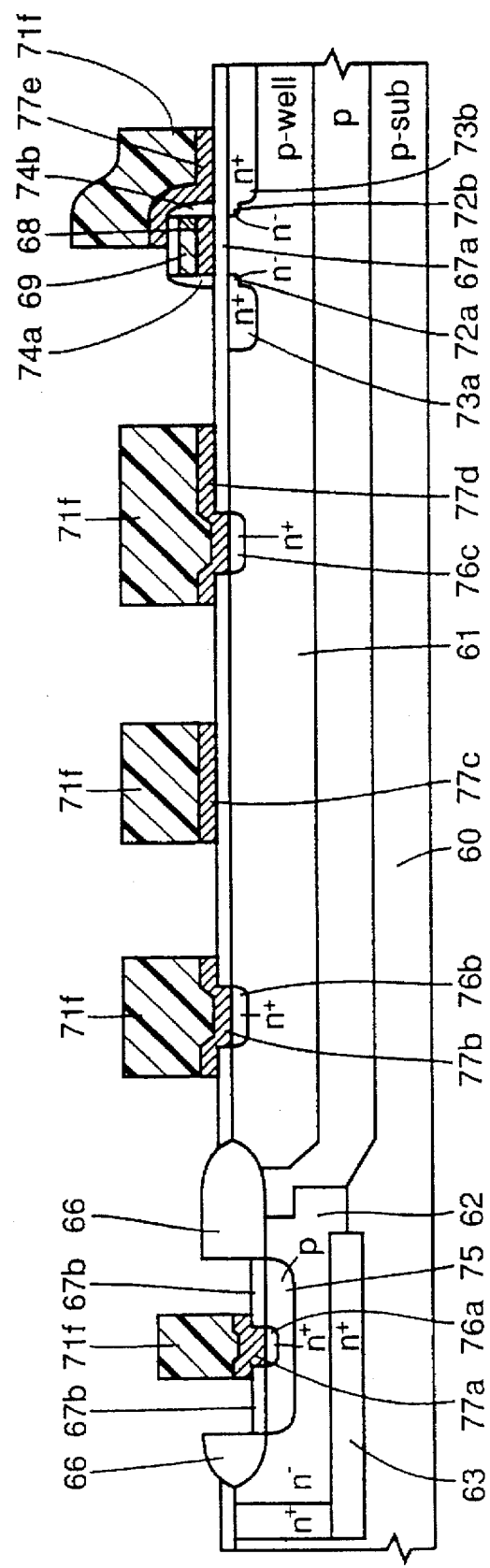

Then, referring to FIG. 39, a polycrystalline silicon layer 77 (or a silicide layer including refractory metal) is formed by LPCVD method, for example, entirely over the main surface of p type semiconductor substrate. Referring to FIG. 40, a resist pattern 71f patterned to a prescribed shape is formed on polycrystalline silicon layer 77. By using resist pattern 71f as a mask, polycrystalline silicon layer 77 is patterned. By doing so, an emitter electrode 77a, a direct contact electrode 77b of the GND line, one gate electrode 77c of the driver transistor which also serves as the gate electrode of the TFT, a direct contact electrode 77b of the other gate electrode of the driver transistor and the active region, and a GND line 77e are formed, respectively. Namely, the aforementioned various interconnection layers are formed simultaneously by the material of the second layer of interconnection layer.

Figure 41:
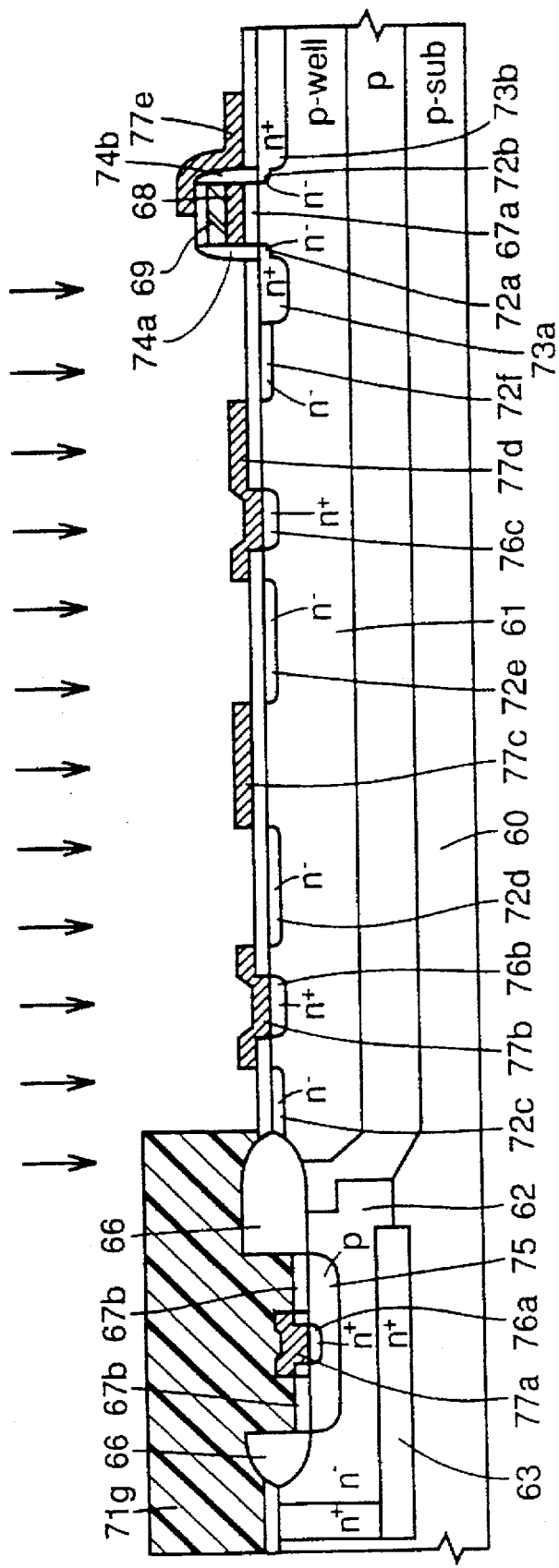

Referring to FIG. 41, resist pattern 71f is removed, and then, a resist pattern 71g covering the bipolar transistor is formed on the main surface of p type semiconductor substrate 60. By using resist pattern 71g as a mask, an n type impurity is introduced to the surface of p type well region 61. Thus, $n^+$ diffusion layers 72c, 72d, 72e, and 72f are formed.

Figure 42:
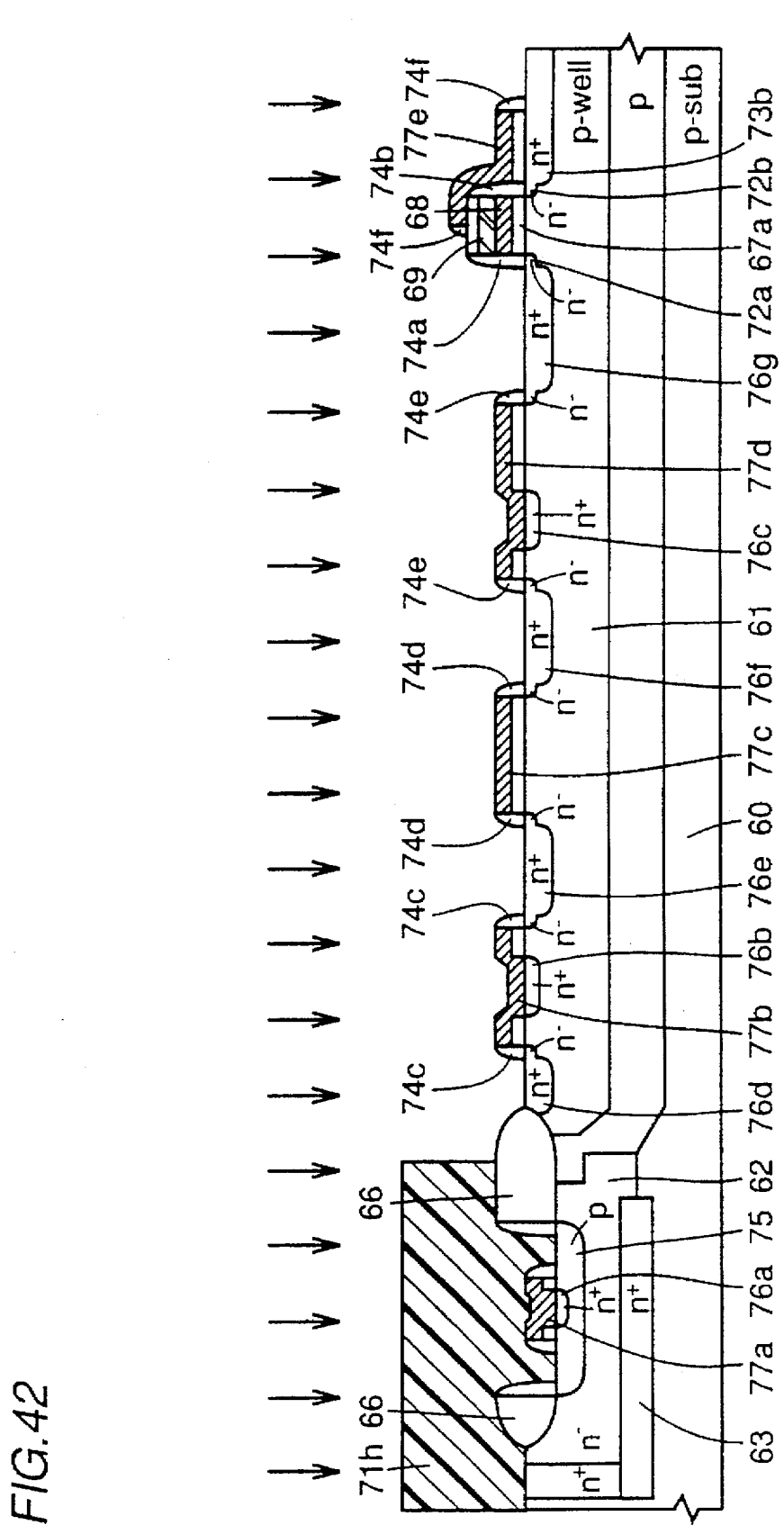

Referring to FIG. 42, the resist pattern 71g is removed, and thereafter a silicon oxide film (not shown) is deposited, for example, by the LPCVD method, entirely over the main surface of p type semiconductor substrate 60. Then, the silicon oxide film is anisotropically etched, for example, by the RIE method. Consequently, sidewall oxide films 74c, 74d, 74e and 74f are formed. On the main surface of p type semiconductor substrate 60, a resist pattern 71h covering a bipolar transistor forming region is formed. By using resist pattern 71h as a mask, an n type impurity is introduced to the surface of p type well region 61. Thus $n^+$ diffusion layers 76d, 76e, 76f and 76g are formed.

Figure 43:
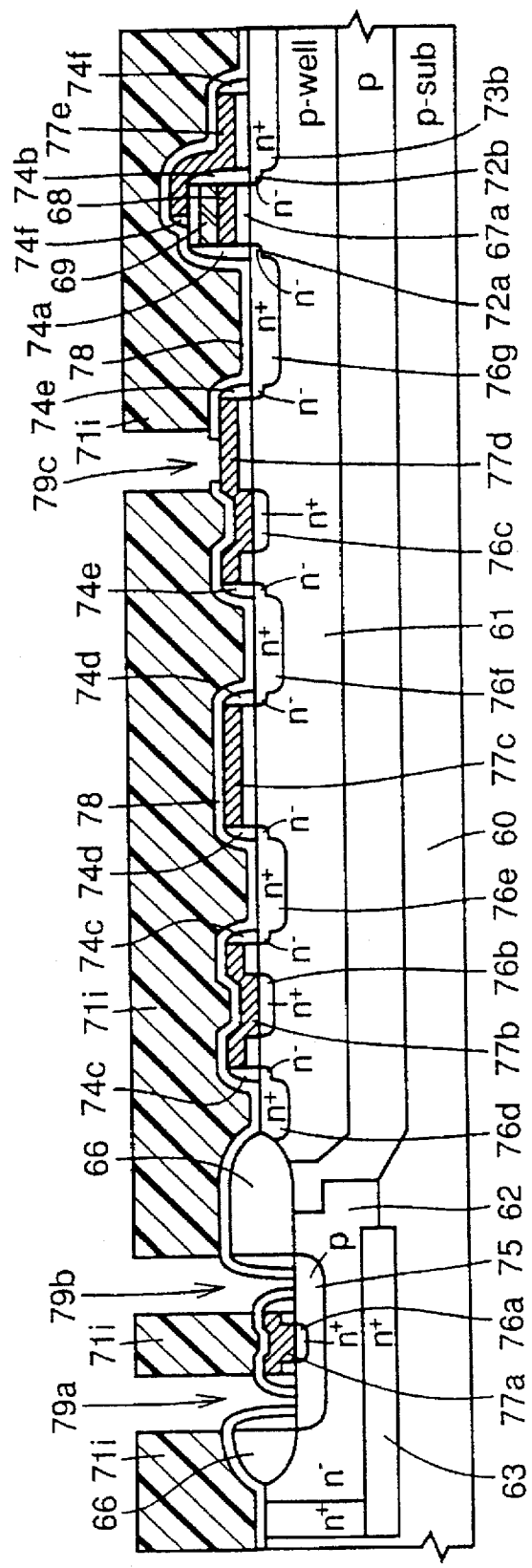

Then, referring to FIG. 43, a resist pattern 71i having openings at prescribed positions is formed on the main surface of p type semiconductor substrate 60. By etching using this resist pattern 71i as a mask, openings 79a, 79b and 79c are formed. These openings 79a and 79b are the openings for forming the base lead out electrodes of the bipolar transistor. Opening 79c will be the opening in which a contact portion between one of the source/drain regions of the TFT and the gate electrode of the driver transistor is formed. Thereafter, resist pattern 71i is removed.

Figure 44:
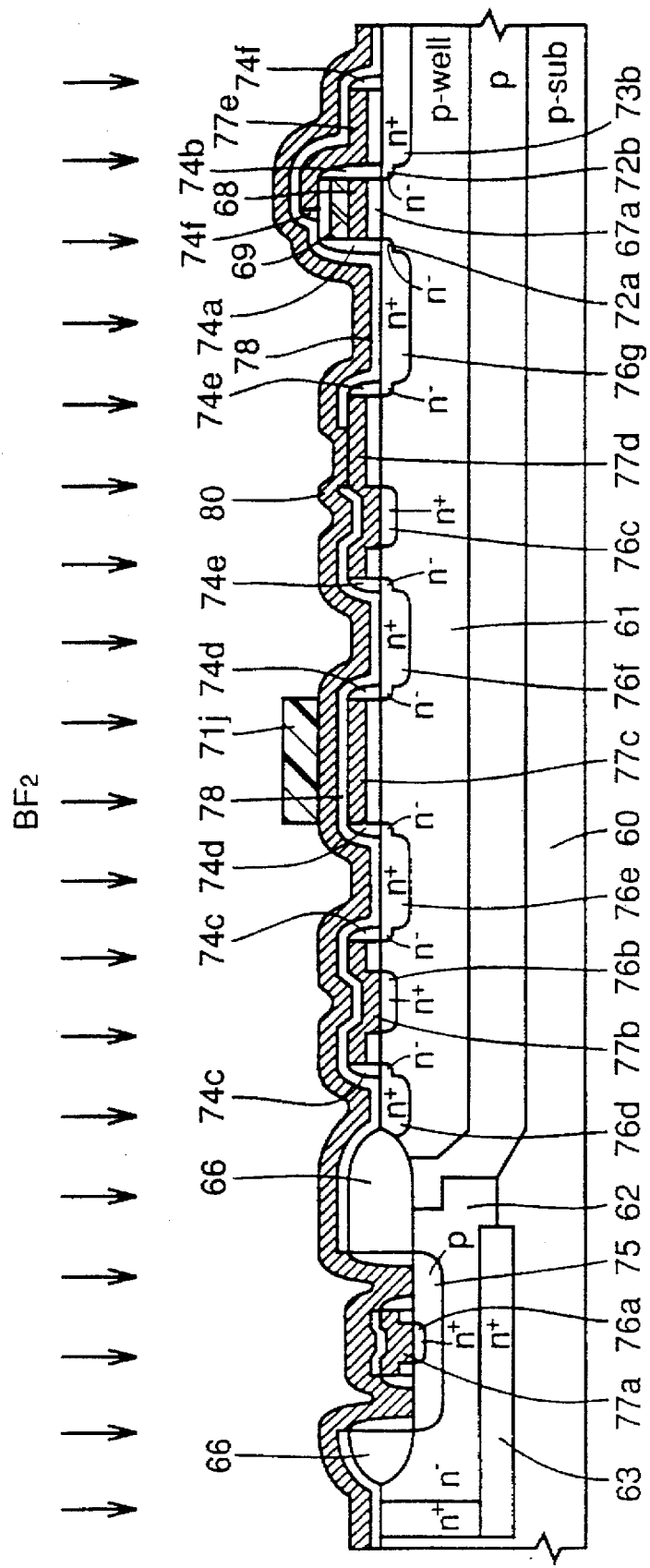

Then, referring to FIG. 44, by using the LPCVD method or the like, a polycrystalline silicon layer 80 having the thickness of about 1000 Å to about 2000 Å or more is formed entirely over the main surface of p type semiconductor substrate 60. Thermal processing similar to that performed in the above described manufacturing method is effected on the polycrystalline silicon layer. Thereafter, a resist pattern 71j is formed to cover a region in which the channel region of the TFT is to be formed. By using resist pattern 71j as a mask, a p type impurity such as $BF_2$ is introduced to polycrystalline silicon layer 80. Thereafter, resist pattern 71j is removed.

Figure 45:
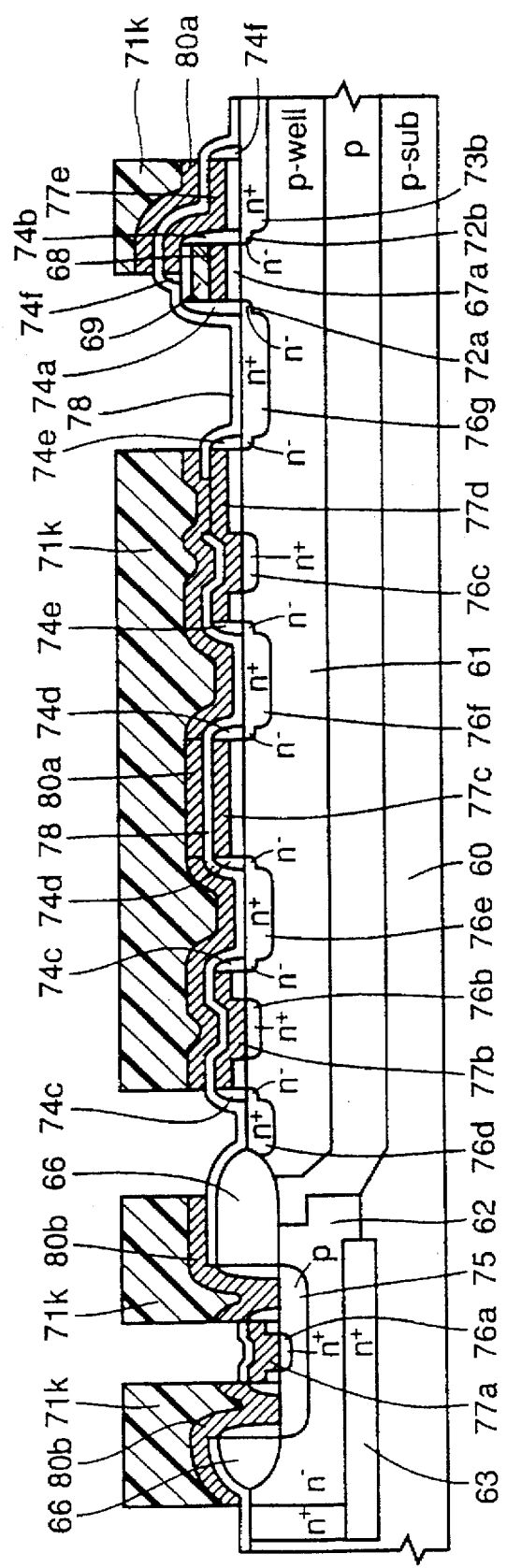

Then, referring to FIG. 45, a resist pattern 71k patterned to have a prescribed shape is formed on polycrystalline silicon layer 80. By using resist pattern 71k as a mask, polycrystalline silicon layer 80 is patterned. Thus an interconnection layer 80a, in which the channel region and the source/drain regions of the TFT are formed, and an external base electrode 80b of the bipolar transistor are formed, respectively. More specifically, by the third layer of polycrystalline silicon layer, the interconnection layer 80a in which the channel region and the source/drain regions of the TFT are formed and external base electrode 80b of the bipolar transistor are formed simultaneously. The p type impurity may be introduced after the patterning of polycrystalline silicon layer 80.

Figure 46:
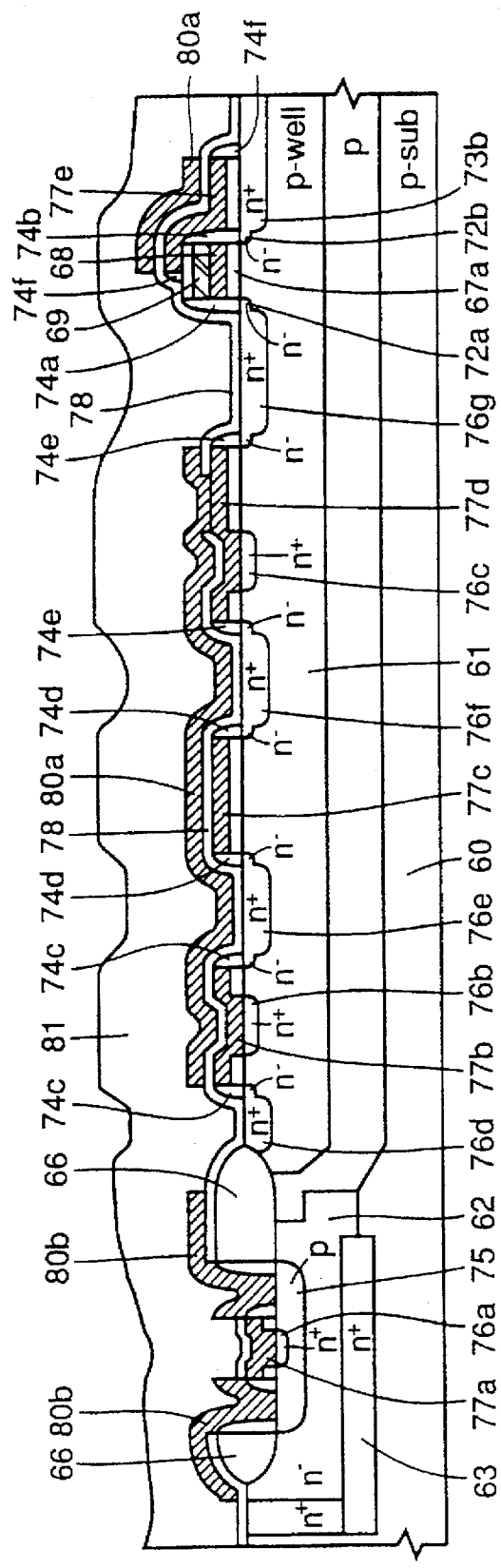

Then, referring to FIG. 46, entirely on the main surface of p type semiconductor substrate 60, an oxide film 81 is formed by the LPCVD method, for example. Thereafter, through the similar steps as in the prior art, contact holes 82a, 82b, 82c and 82b are formed at prescribed positions of oxide film 81, W plugs 83a to 83d and metal interconnections 84a to 84d of Al, AlCu, W or the like are formed in the contact holes 82 to 82d. The W plug may be omitted. Through these steps, the BiCMOS type SRAM shown in FIG. 31 is formed. The method of manufacturing the memory cells shown in FIGS. 7 to 9 are similar to the method described above.

Figure 14:
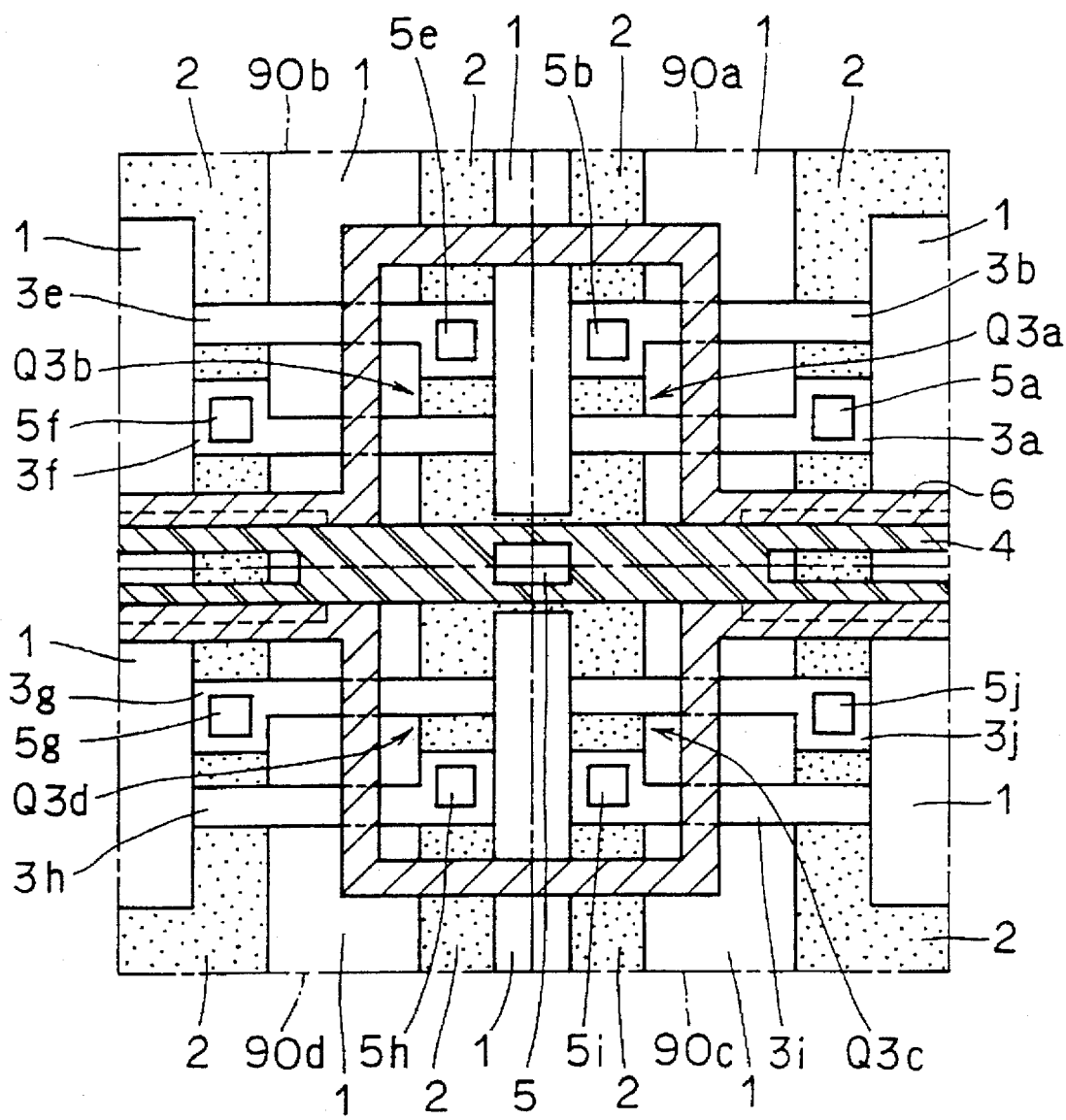
FIG. 14 is a plan view showing arrangement of contact portions of the GND line.

The arrangement of contact portion 5 of GND line 4 in the present embodiment will be described with reference to FIG. 14. FIG. 14 is a plan view showing arrangement of the contact portion 5 of GND line 4 in the present embodiment.

Referring to FIG. 14, note four memory forming regions 90a, 90b, 90c and 90d arranged in the matrix in the memory cell portion of the SRAM. The first memory cell forming region 90a is adjacent to the second memory cell forming region 90b in the row direction. The first memory cell forming region 90a is adjacent to the third memory cell forming region 90c in the column direction. The fourth memory cell forming region 90d is adjacent to the third memory cell forming region 90c in the row direction.

One word line 6 is formed to extend on the first and second memory cell forming regions 90a and 90b. Another word line 6 is formed to extend on third and fourth memory cell forming regions 90c and 90d. In respective memory cell forming regions, gate electrodes 3a, 3b, 3e, 3f, 3g, 3h, 3i and 3j of the driver transistors are formed, respectively. At prescribed positions of respective memory cell forming regions, contact portions 5a, 5b, 5e, 5f, 5g, 5h, 5i and 5j are formed, respectively.

Near the central portion of the region constituted by the first to fourth memory cell forming regions 90a to 90b, first to fourth driver transistors Q3a, Q3b, Q3c and Q3d are formed. At the central portion of the region formed by the four memory cell forming regions 90a to 90d, a contact portion 5 for electrically connecting a GND line 4 and one impurity region of each of the first to fourth driver transistors Q3a to Q3d is formed.

More specifically, one contact portion 5 to one GND line is formed for four memory cell forming regions 90a to 90d. In the prior art, one contact portion to the GND line has been formed for two memory cell forming regions. Therefore, compared with the prior art, it becomes possible to reduce the number of contact portions between the GND line and one impurity region of each of the driver transistors, and hence to reduce the area of the memory cell forming region.

Figure 15:
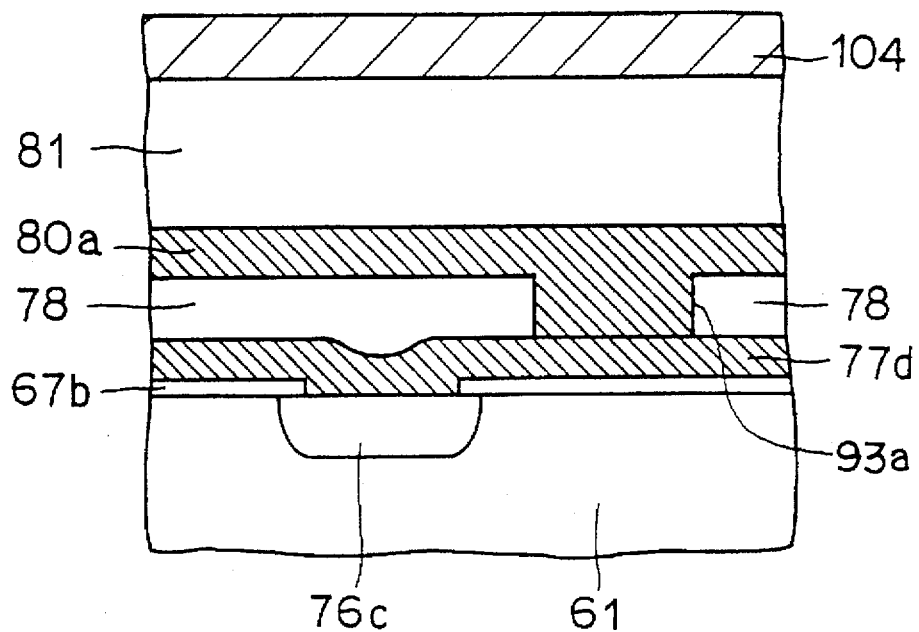
FIGS. 15 and 16 are partial cross sections showing connection structure of the interconnection layer.
Figure 16:
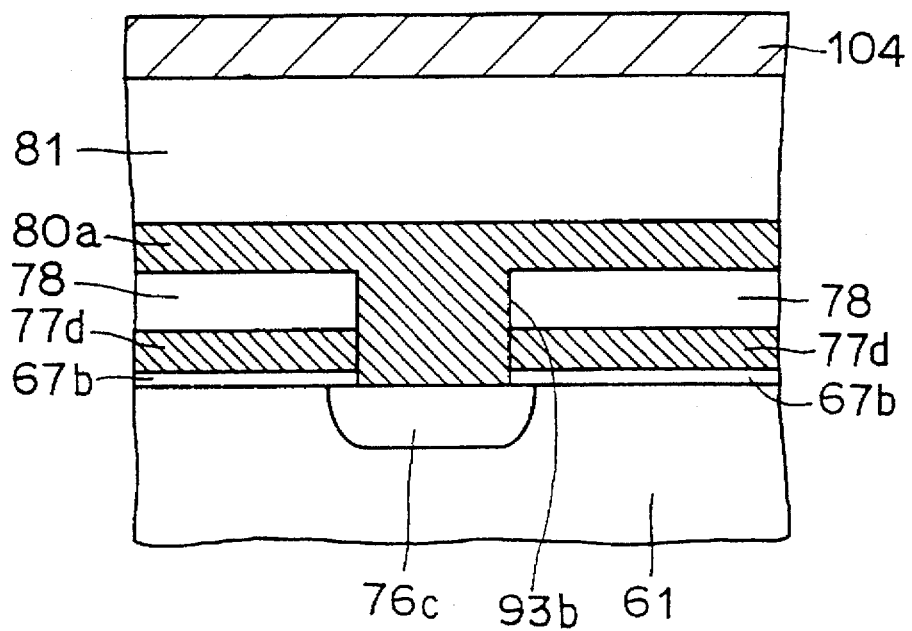
Figure 17:
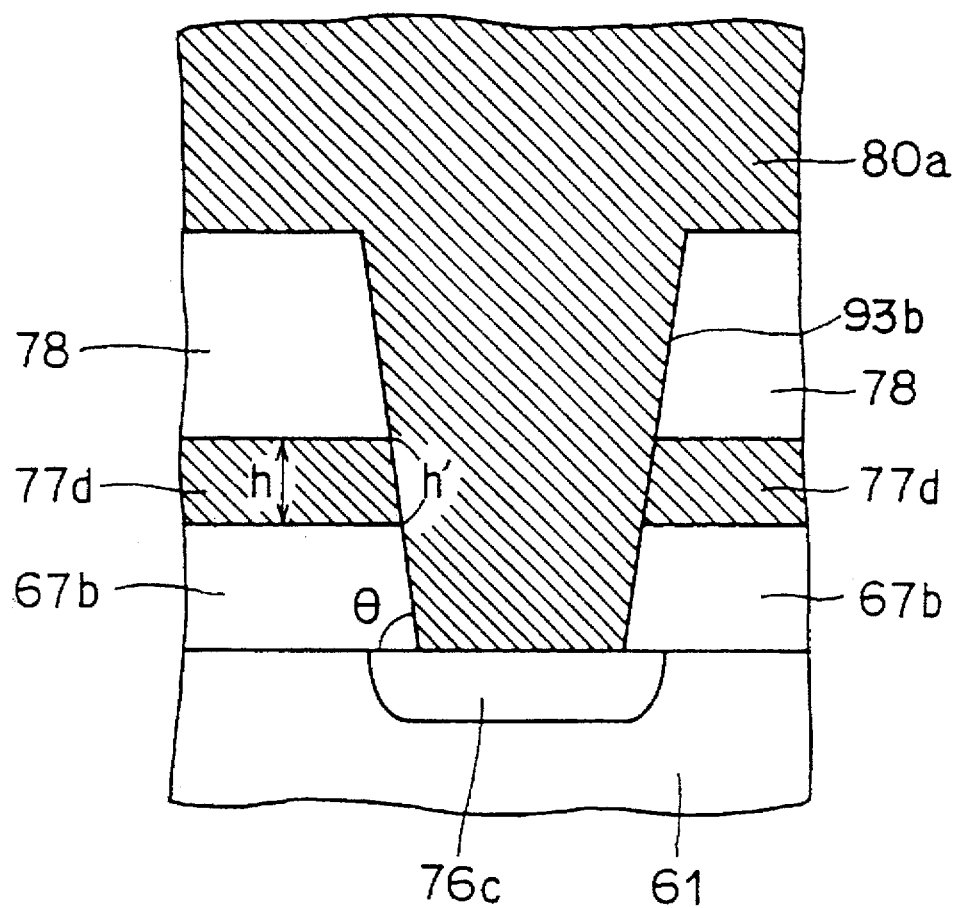
FIG. 17 is a cross section showing a modification of the interconnection structure shown in FIG. 16.

Referring to FIGS. 15 to 17, connection structure of interconnection layers in the memory cell portion of the SRAM particular in the present embodiment will be described. FIG. 15 is a partial cross section showing the connection structure of the interconnection layers in the present embodiment. The interconnection structure shown in FIG. 15 can be applied to the interconnection structure in the region corresponding to the region 95 of FIG. 31.

Referring to FIG. 15, a contact hole 93a is formed through an interconnection layer 80a, in which source/drain regions and channel region of the TFT are formed, and through a gate oxide film 78 of the TFT. Through the contact hole 93a, the interconnection layer 80a in which the channel region and the source/drain regions of the TFT is electrically connected to a contact electrode 77d.

Figure 55:
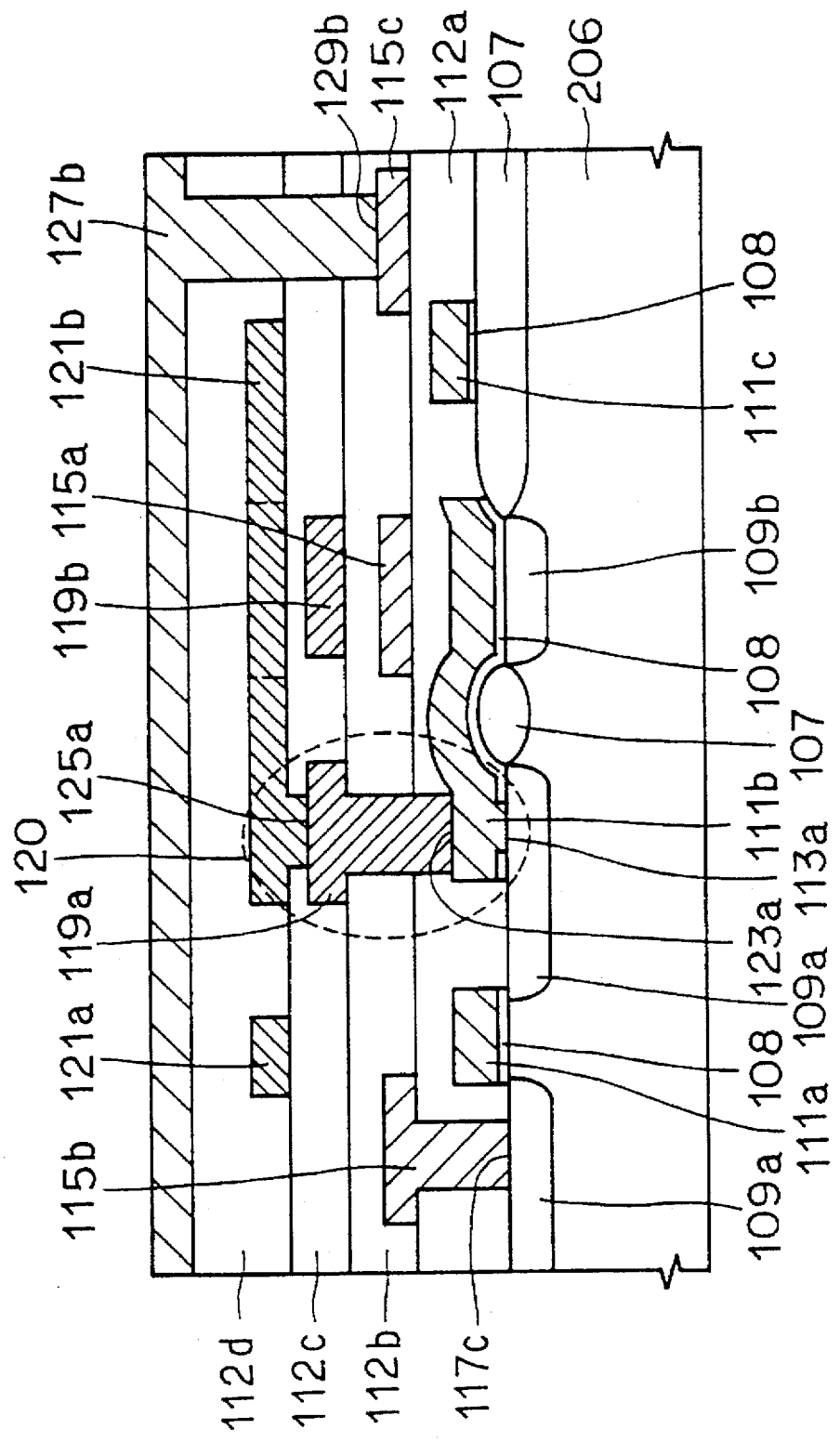
FIG. 55 shows a cross section corresponding to the line A—A in FIGS. 51 to 54.
Figure 56:
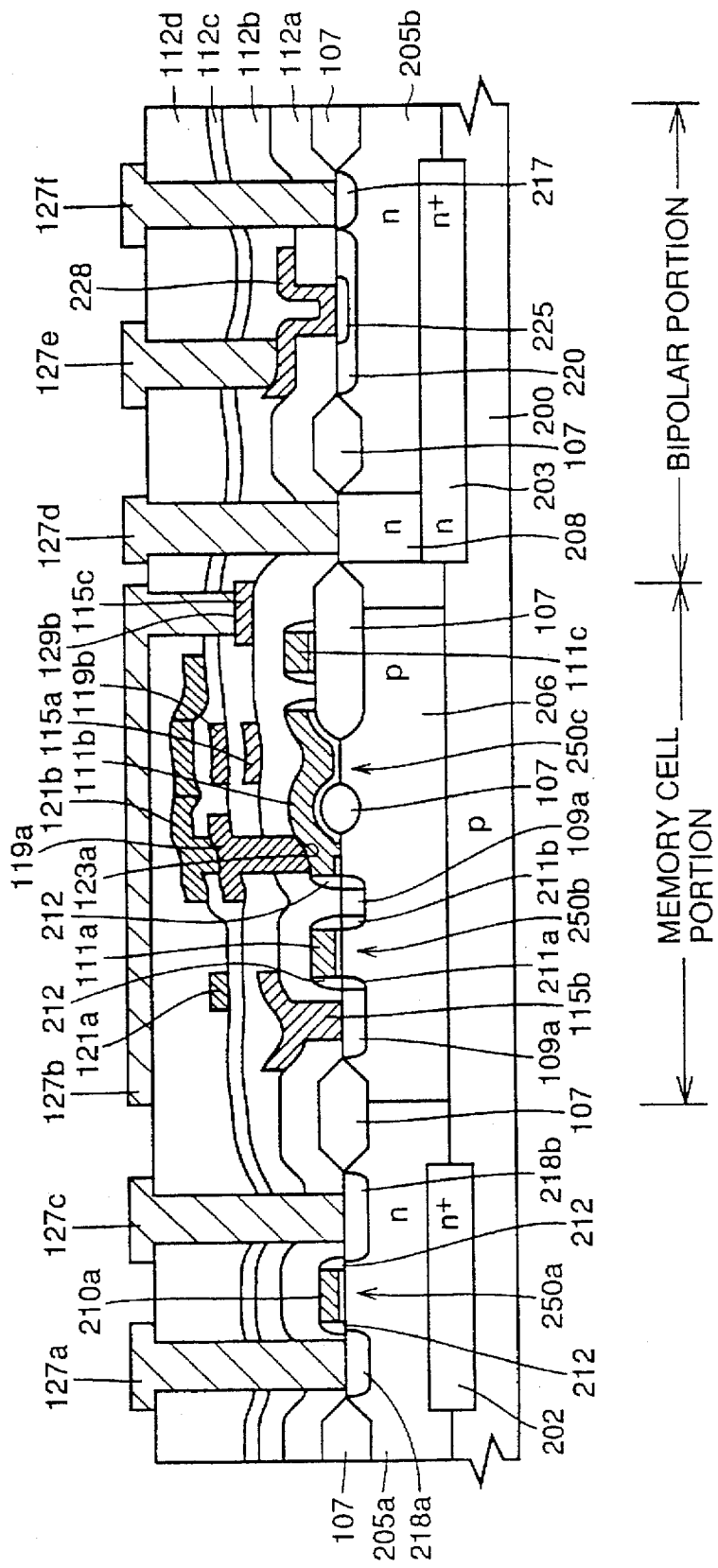
FIG. 56 is a partial cross section showing a conventional BiCMOS type SRAM.
Figure 57:
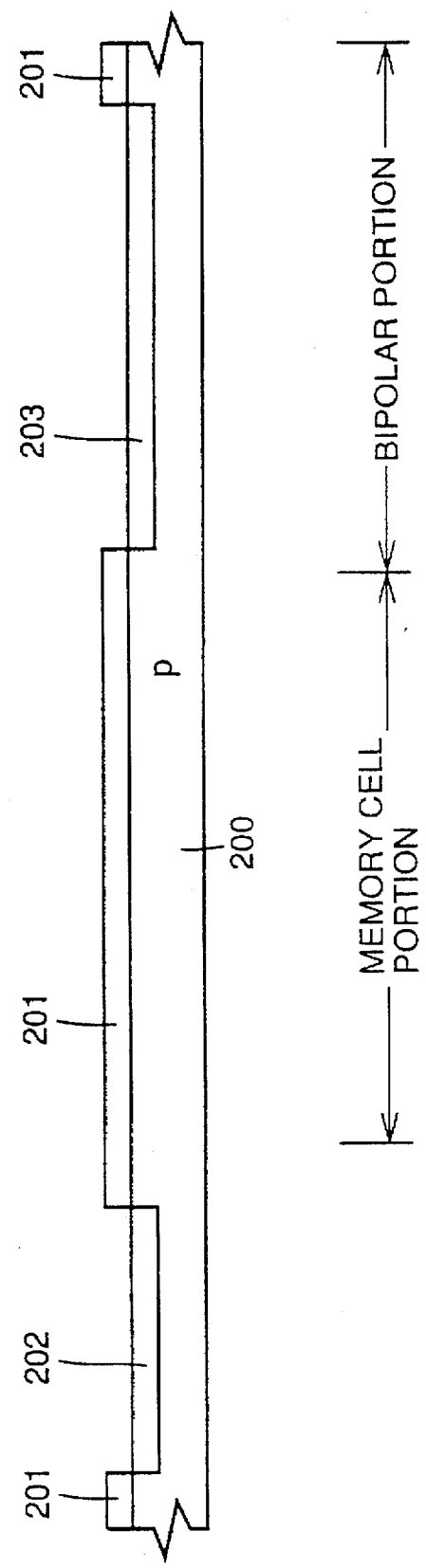
FIGS. 57 to 69 are cross sections showing the first to thirteenth steps of manufacturing the BiCMOS type SRAM shown in FIG. 56.
Figure 58:
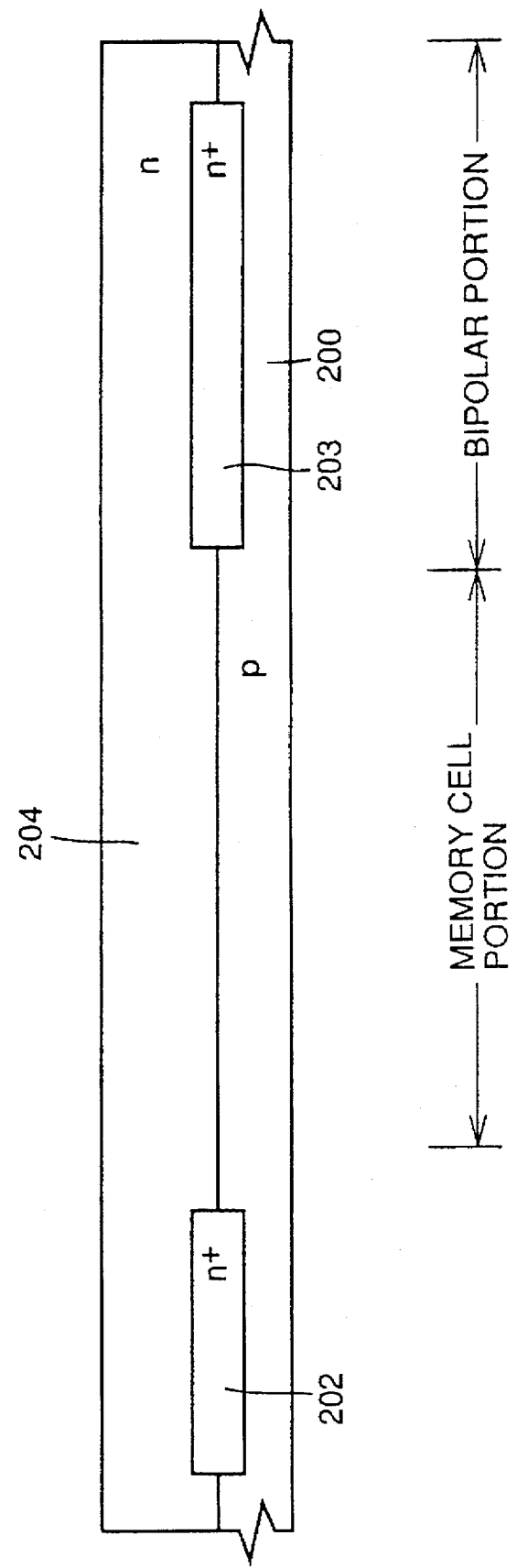
Figure 59:
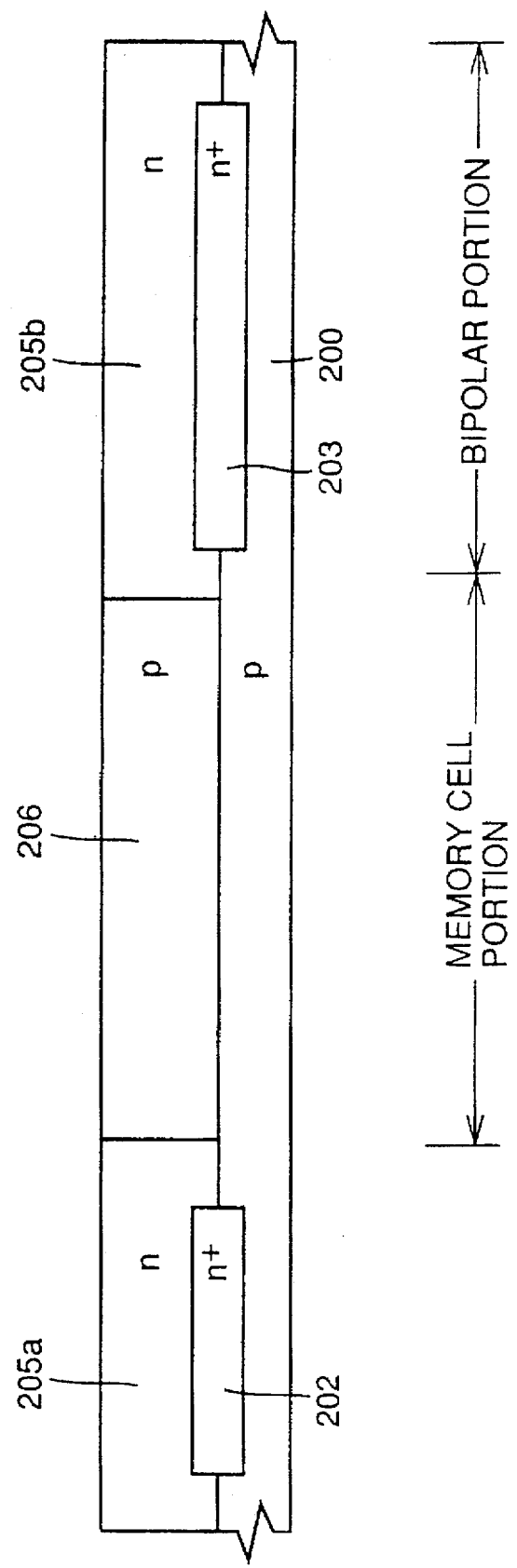
Figure 60:
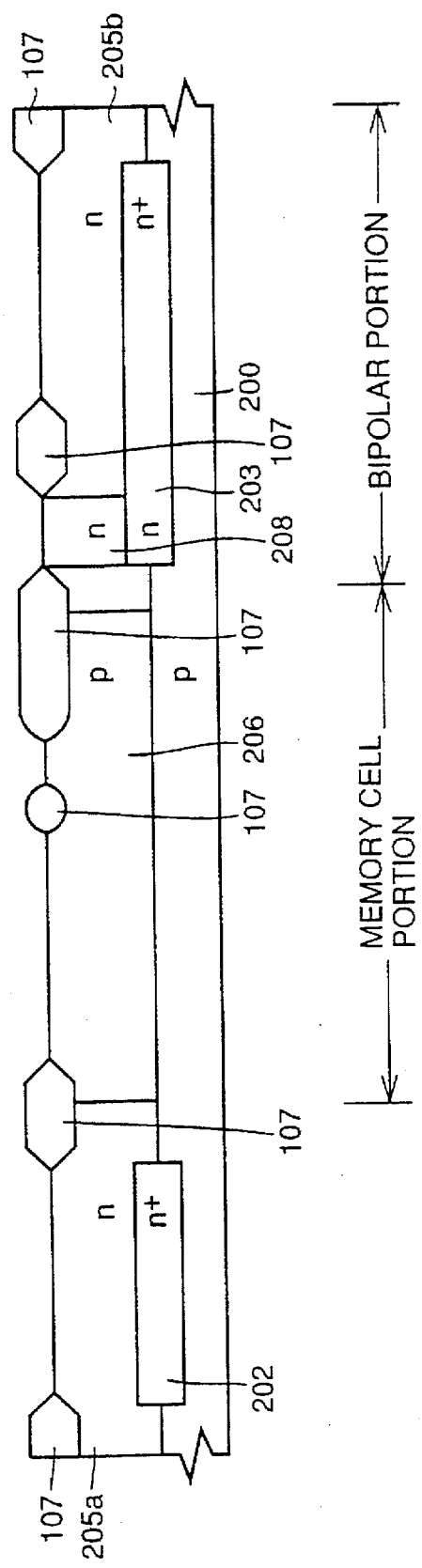
Figure 61:
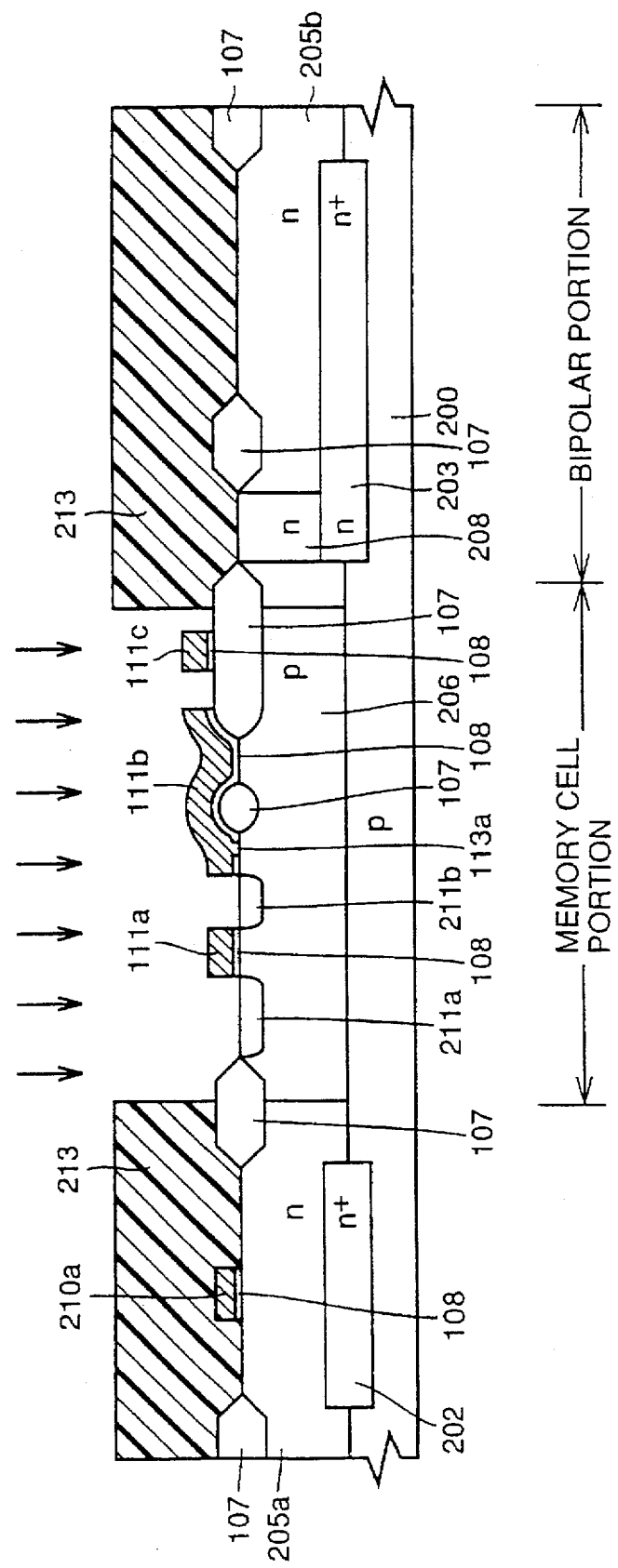
Figure 62:
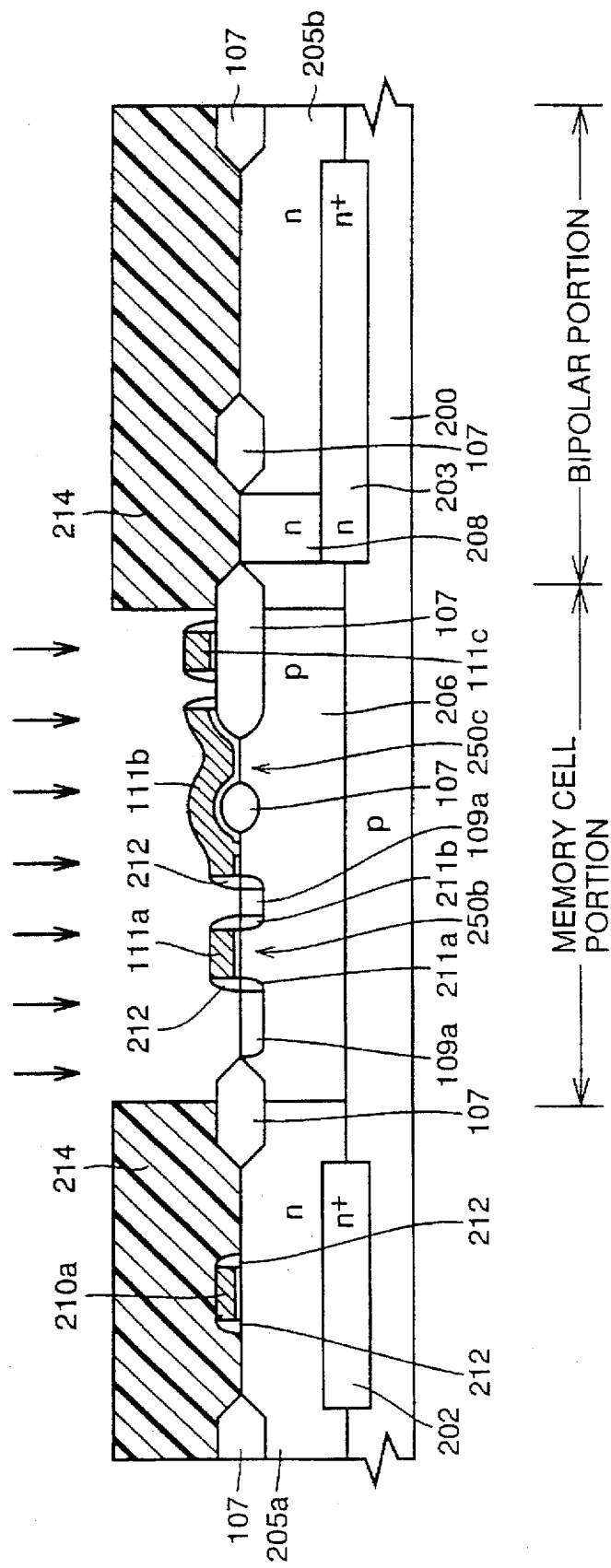
Figure 63:
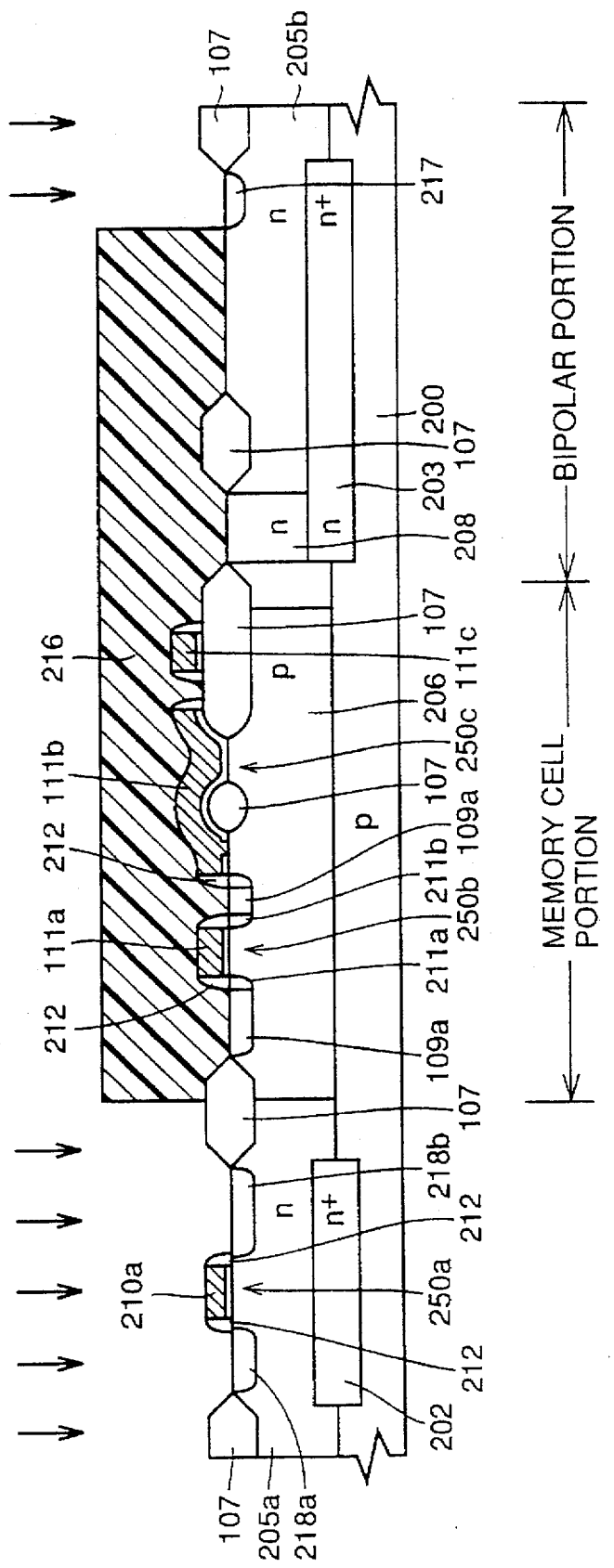
Figure 64:
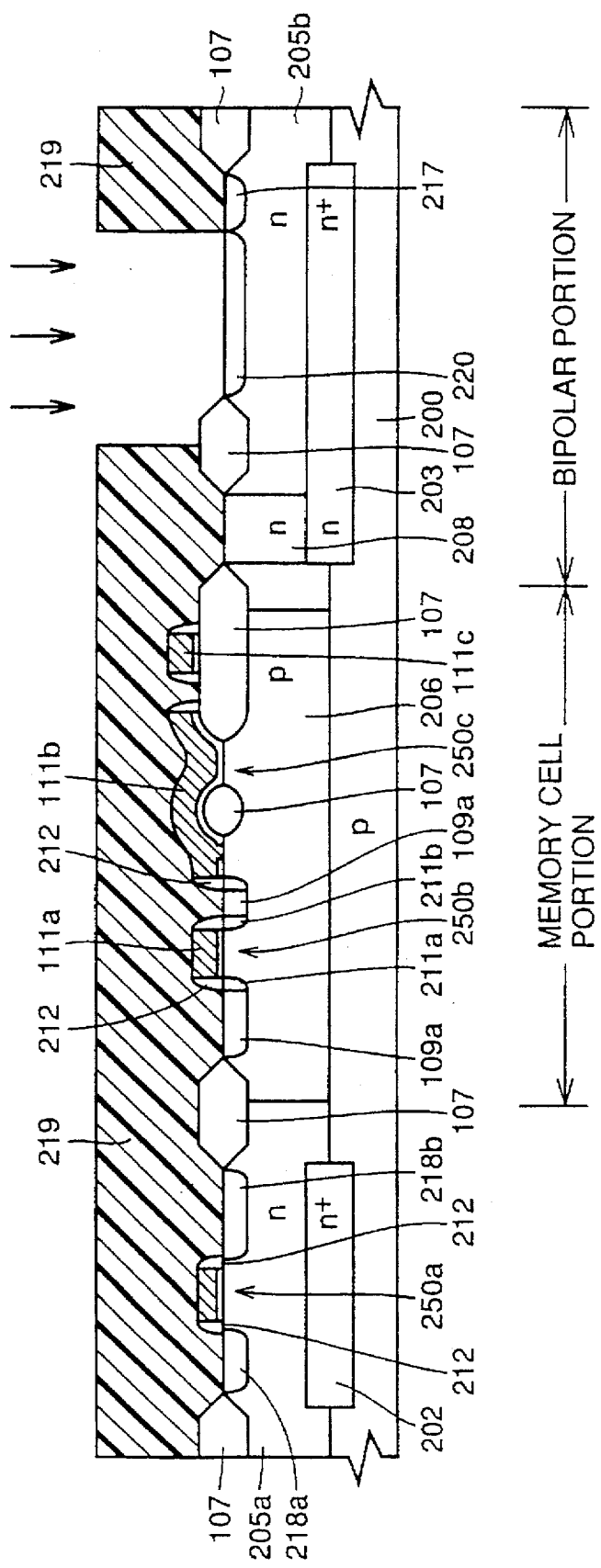
Figure 65:
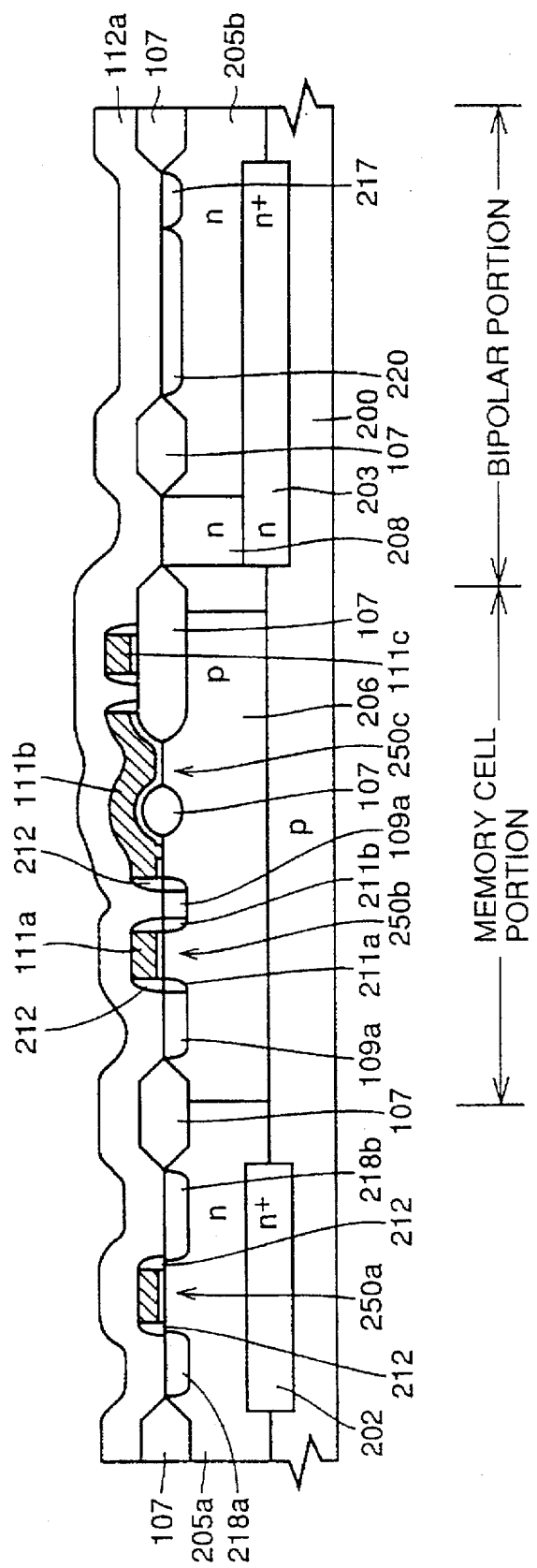
Figure 66:
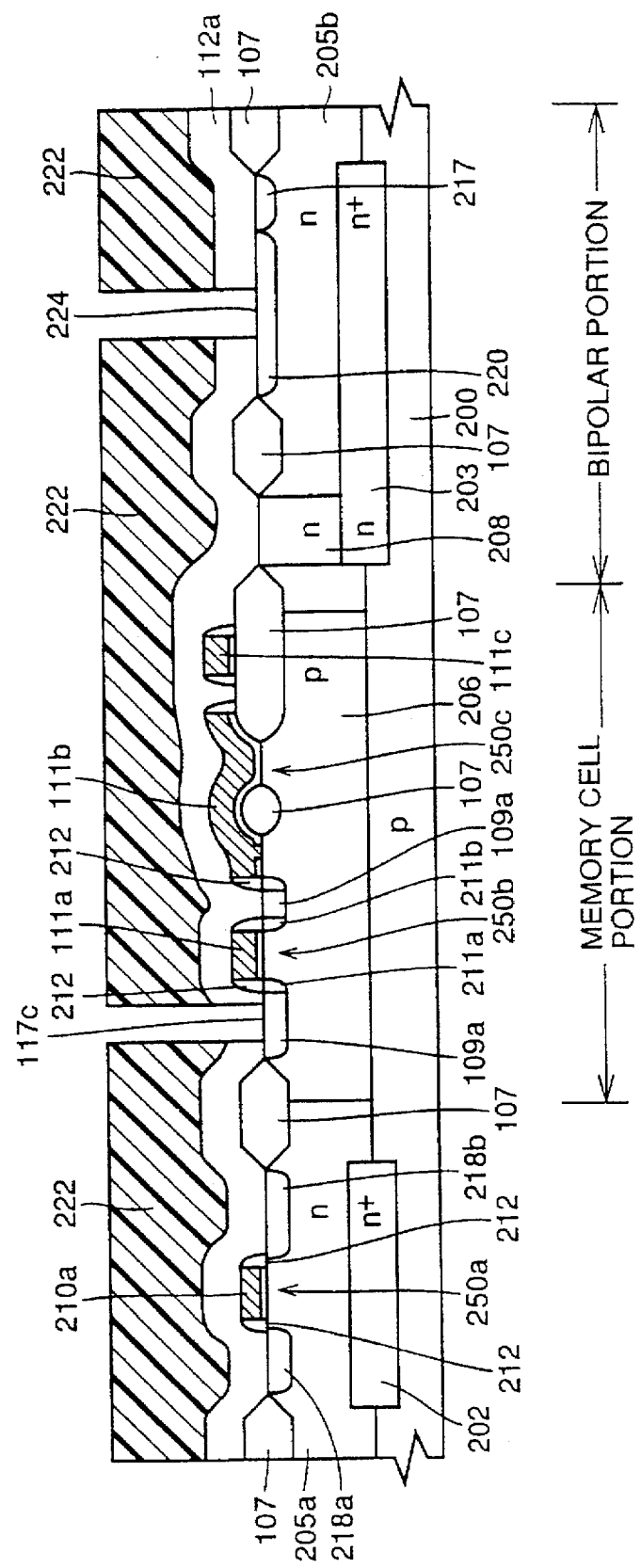
Figure 67:
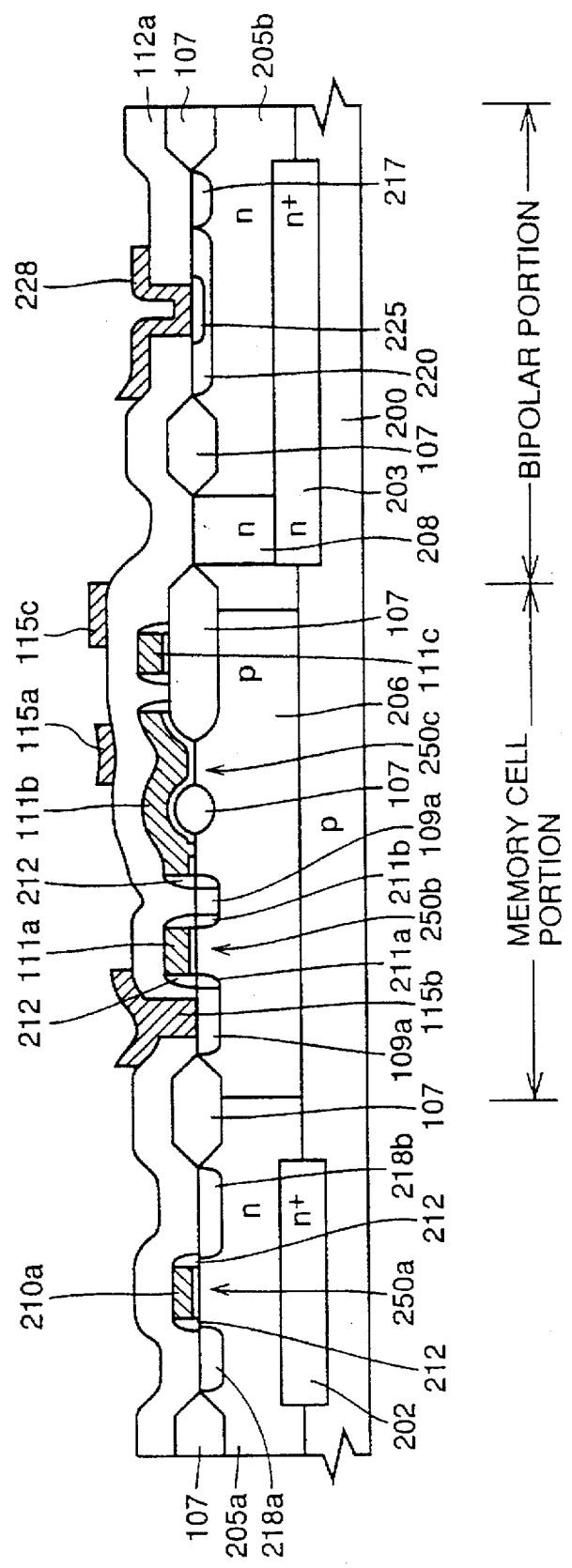
Figure 68:
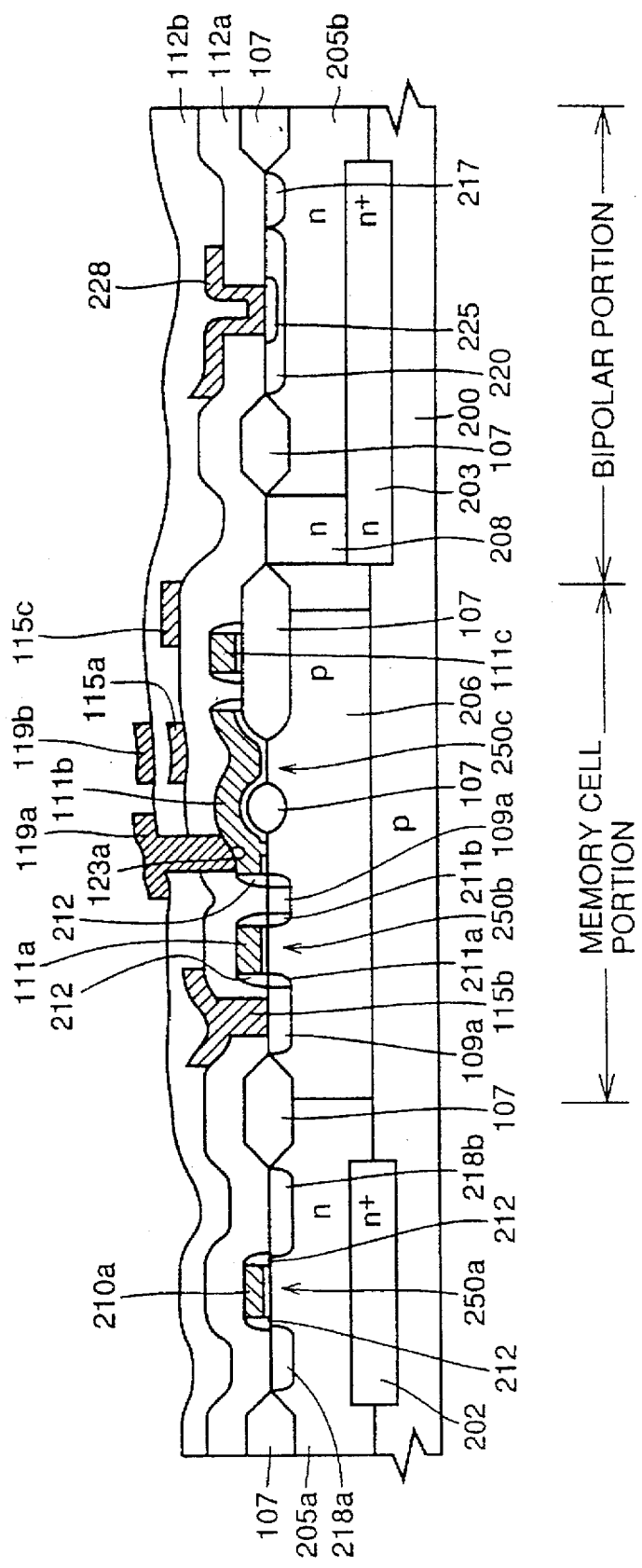
Figure 69:
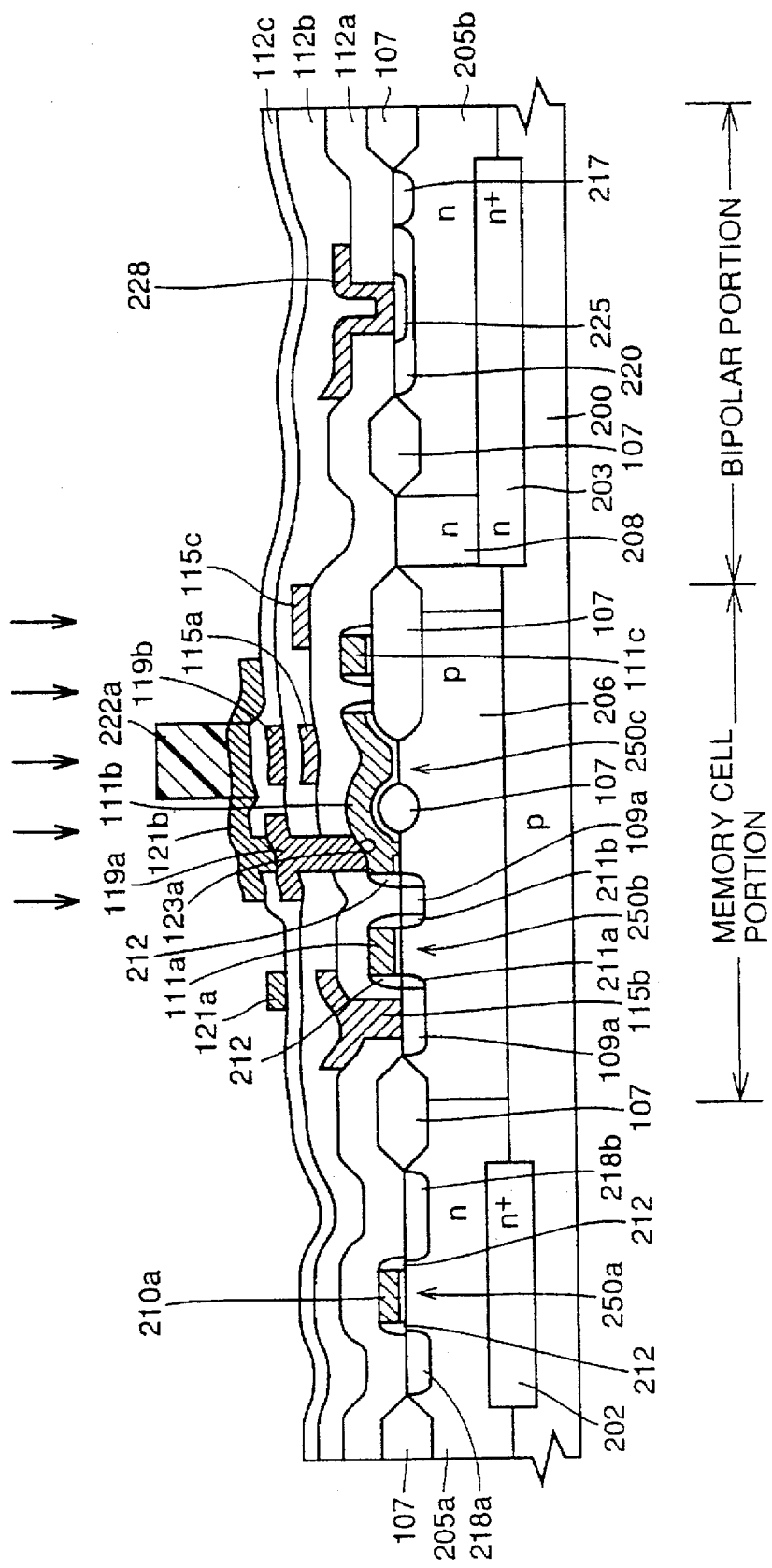
Figure 70:
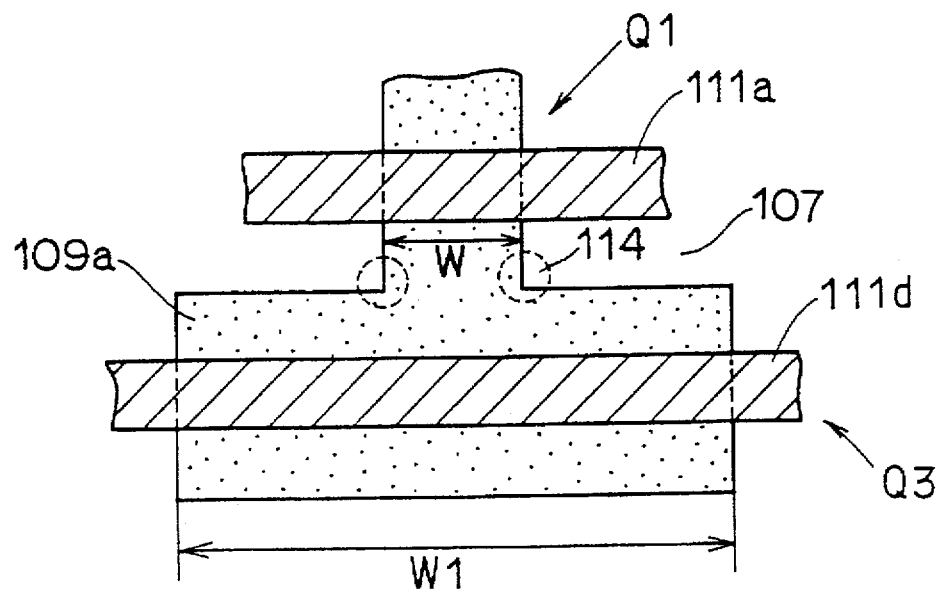
FIG. 70 is a partial schematic plan view illustrating disadvantages of the prior art.
Figure 71:
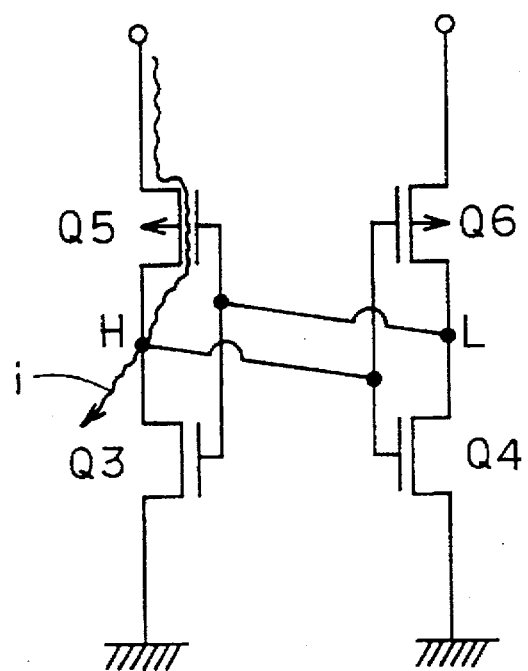
FIG. 71 is an equivalent circuit diagram showing disadvantages of the prior art.
Figure 72:
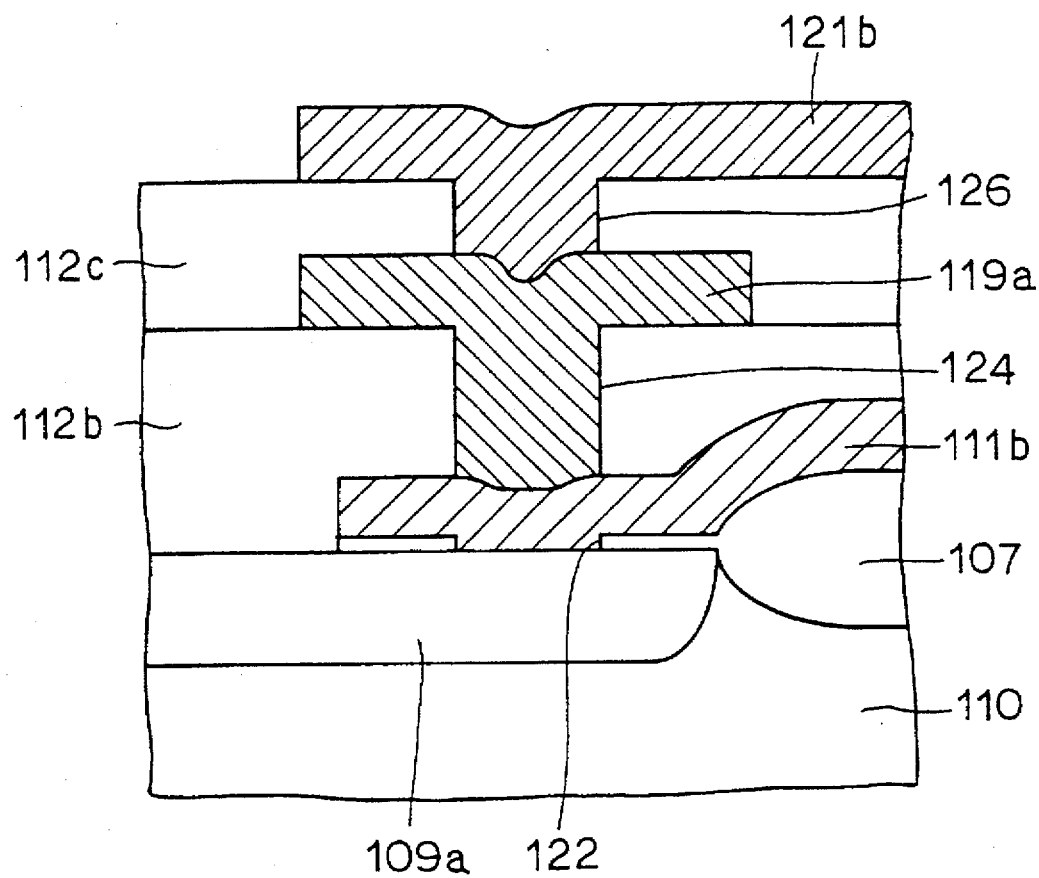
FIG. 72 is an enlarged cross section showing the region 120 of FIG. 55.

However, referring to FIG. 16, only by forming one contact hole 93b, it becomes possible to electrically connect three conductive layers (interconnection layer 80a, contact electrode (gate electrode) 77d and $n^+$ diffusion layer 76c). The $n^+$ diffusion layer 76c may be formed by introducing impurity at the time of forming contact hole 93b. In the prior art, referring to FIG. 72, when the first gate 111b and the fourth gate 121b are to be electrically connected, contact holes 124 and 126 are formed in two interlayer insulating layers 112c and 112b, respectively, existing between the first gate 111b and the fourth gate 121b. This has lead to increased number of manufacturing steps. However, according to the present embodiment, three conductive layers can be connected at one time by providing only one contact hole. This can significantly reduce the number of manufacturing steps. FIG. 72 is an enlarged cross section of the region 120 of FIG. 55.

Referring to FIG. 17, a modification of the connection structure of interconnection layers shown in FIG. 16 will be described. FIG. 17 is a partially enlarged cross section showing the modification of the interconnection structure shown in FIG. 16. Referring to FIG. 17, in this modification, the sidewalls of the contact hole 93b are tapered, which brings about the following effects.

Referring to FIG. 17, the thickness of gate electrode 77d is represented by h, and the width of contact between interconnection layer 80a and gate electrode 77d is represented by h'. It is assumed that the sidewall of contact hole 93b has an angle of θ (0<θ<90) with respect to the horizontal direction. If the sidewall of the contact hole has such a shape as shown in FIG. 16, then it holds h=h'. However, in this modification, h'=h/sinθ (0<θ<90). Therefore, h'>h. Accordingly, it becomes possible to increase the contact area between the interconnection layer 80a and gate electrode 77d. Therefore, the contact resistance between gate electrode 77d and interconnection layer 80a can be reduced as compared with the example of FIG. 16.

(Second Embodiment)

Figure 47:
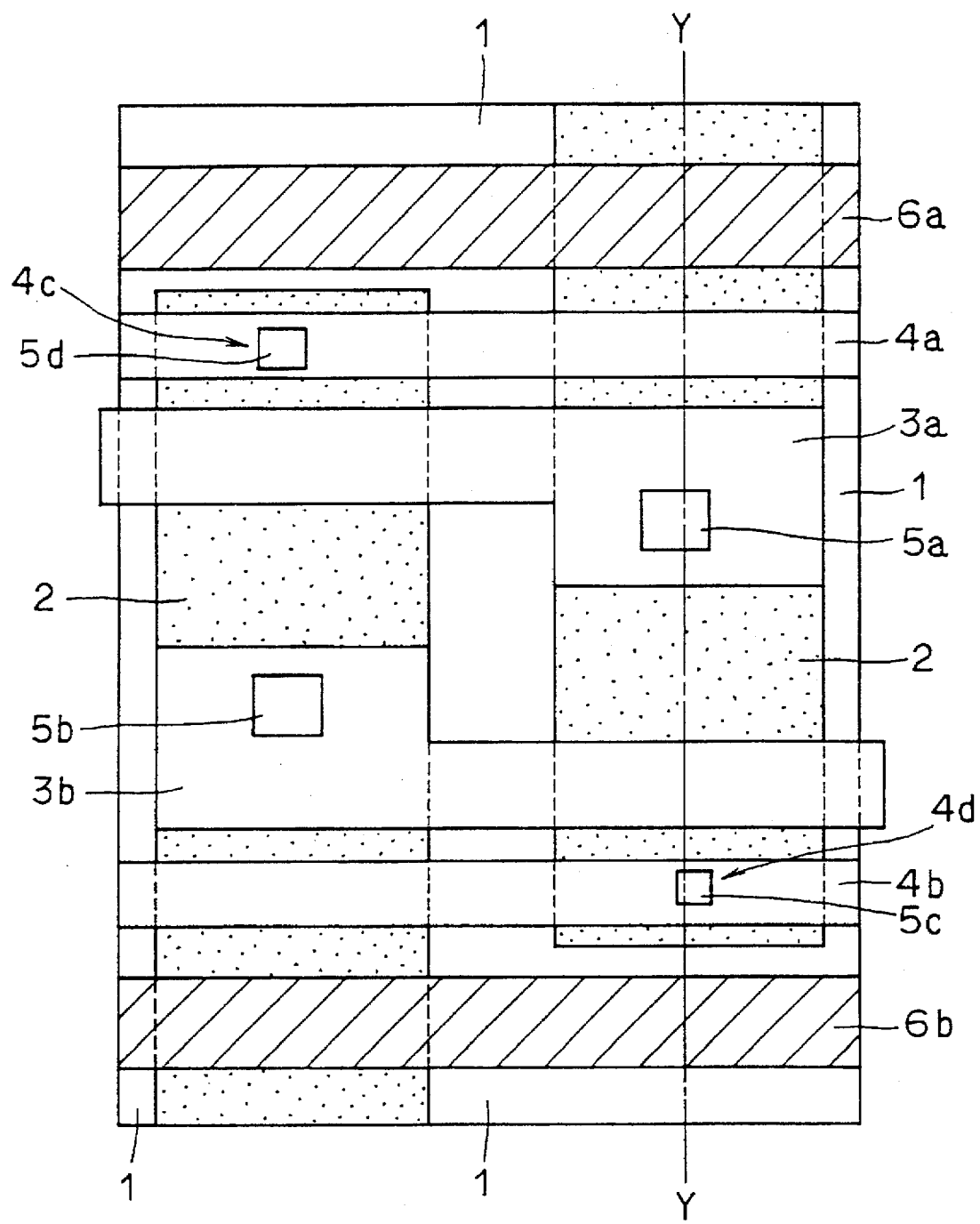
FIG. 47 is a plan view of a memory cell of an SRAM in accordance with a second embodiment of the present invention.
Figure 49:
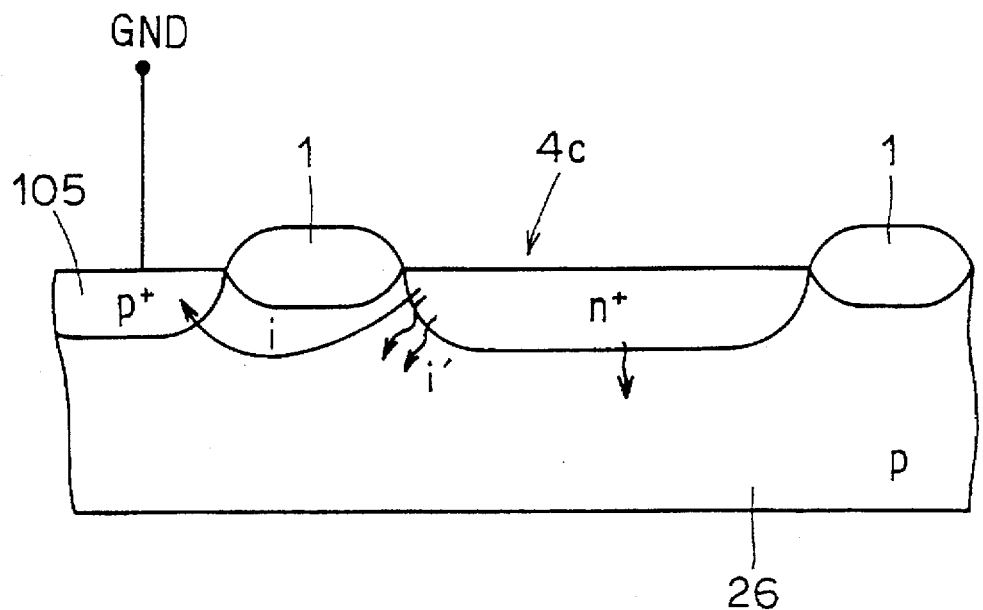
FIG. 49 is a cross section showing a method in which formation of the GND line is omitted.
Figure 50:
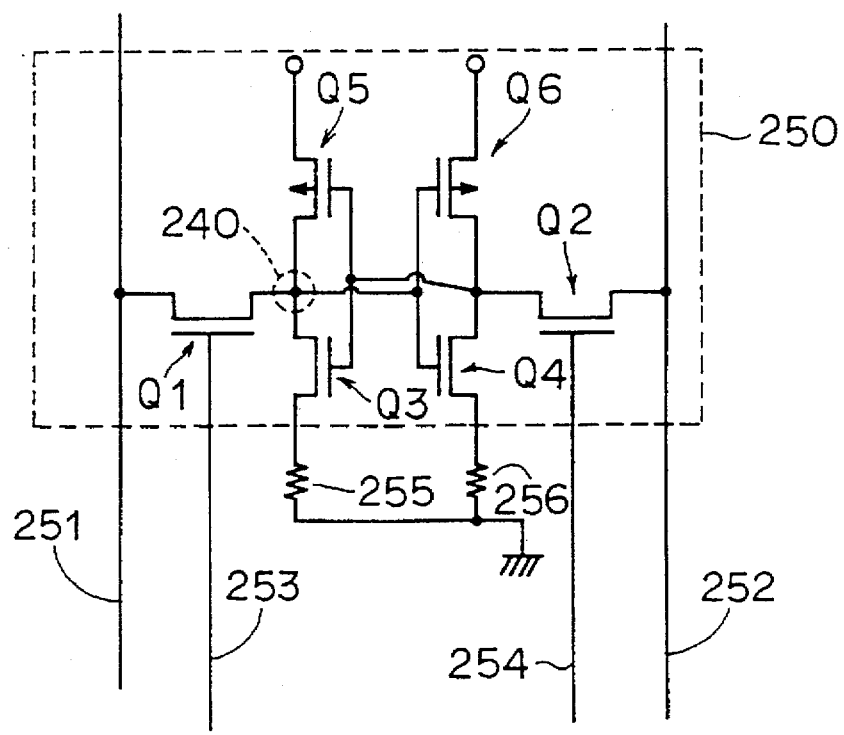
FIG. 50 is an equivalent circuit diagram of a conventional SRAM.
Figure 51:
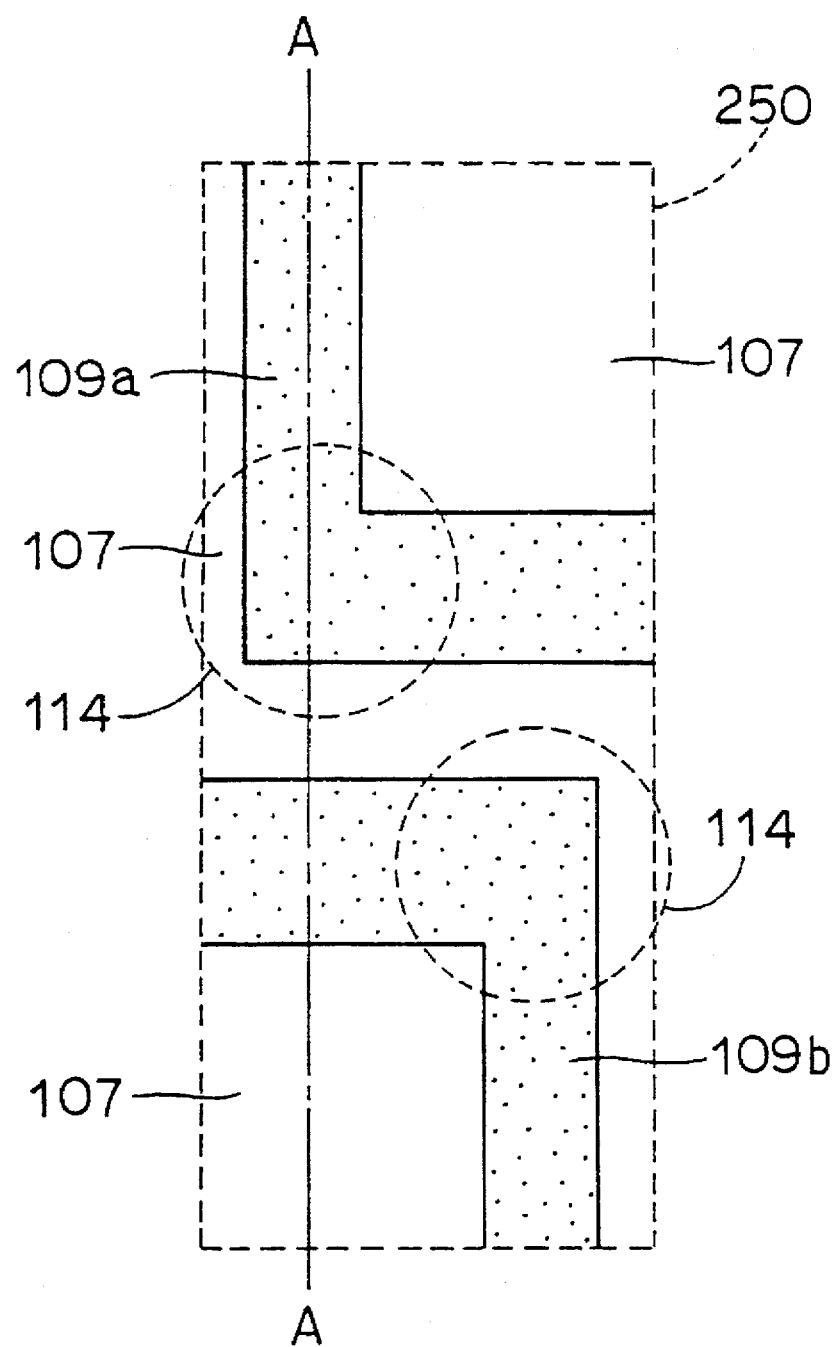
FIG. 51 is a plan view showing shapes of a field oxide film and an active region in one memory element forming region in the conventional SRAM.
Figure 52:
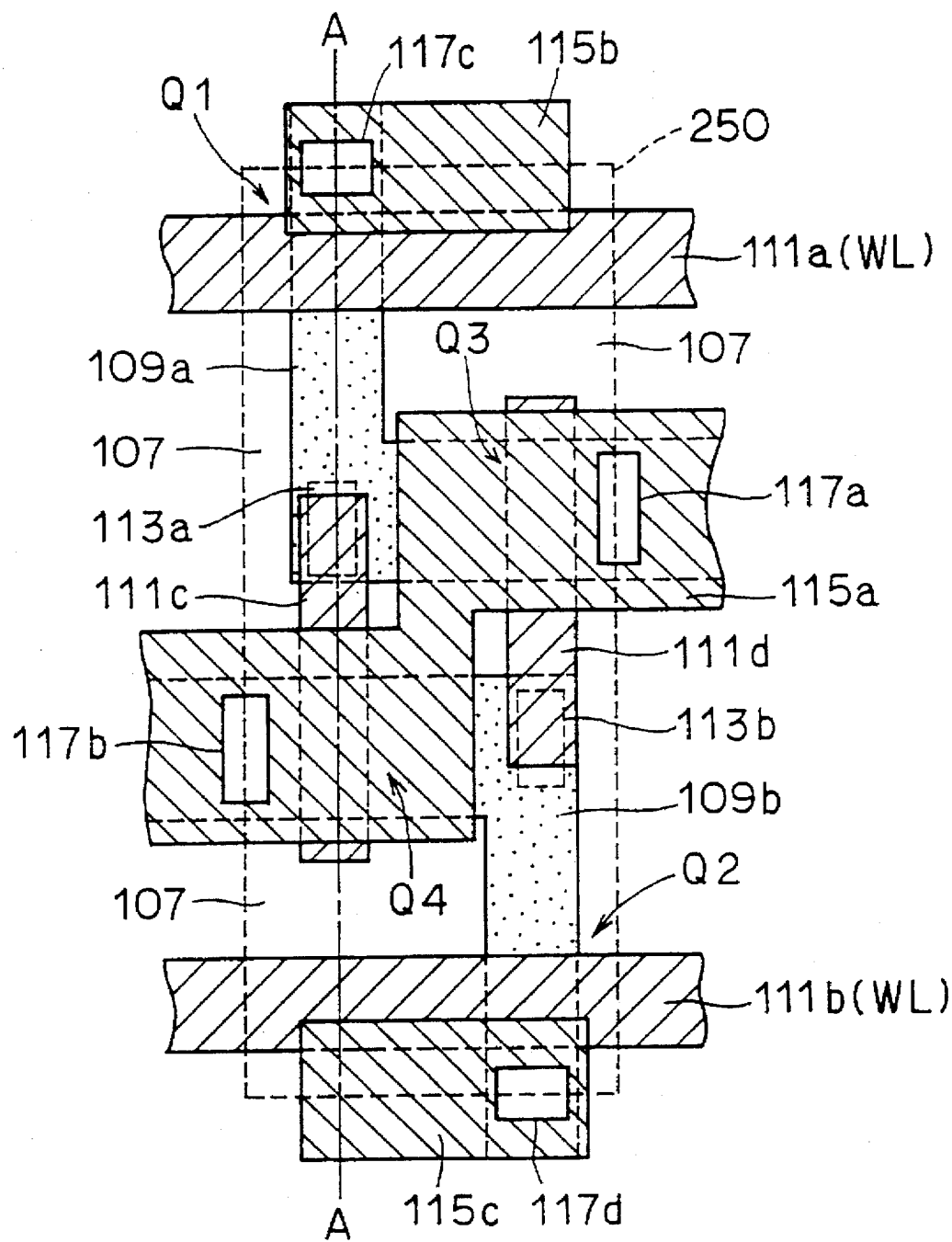
FIG. 52 is a plan view showing a state in which a word line, a GND line and a gate electrode of a driver transistor are formed on the active region and the field oxide film shown in FIG. 51.
Figure 53:
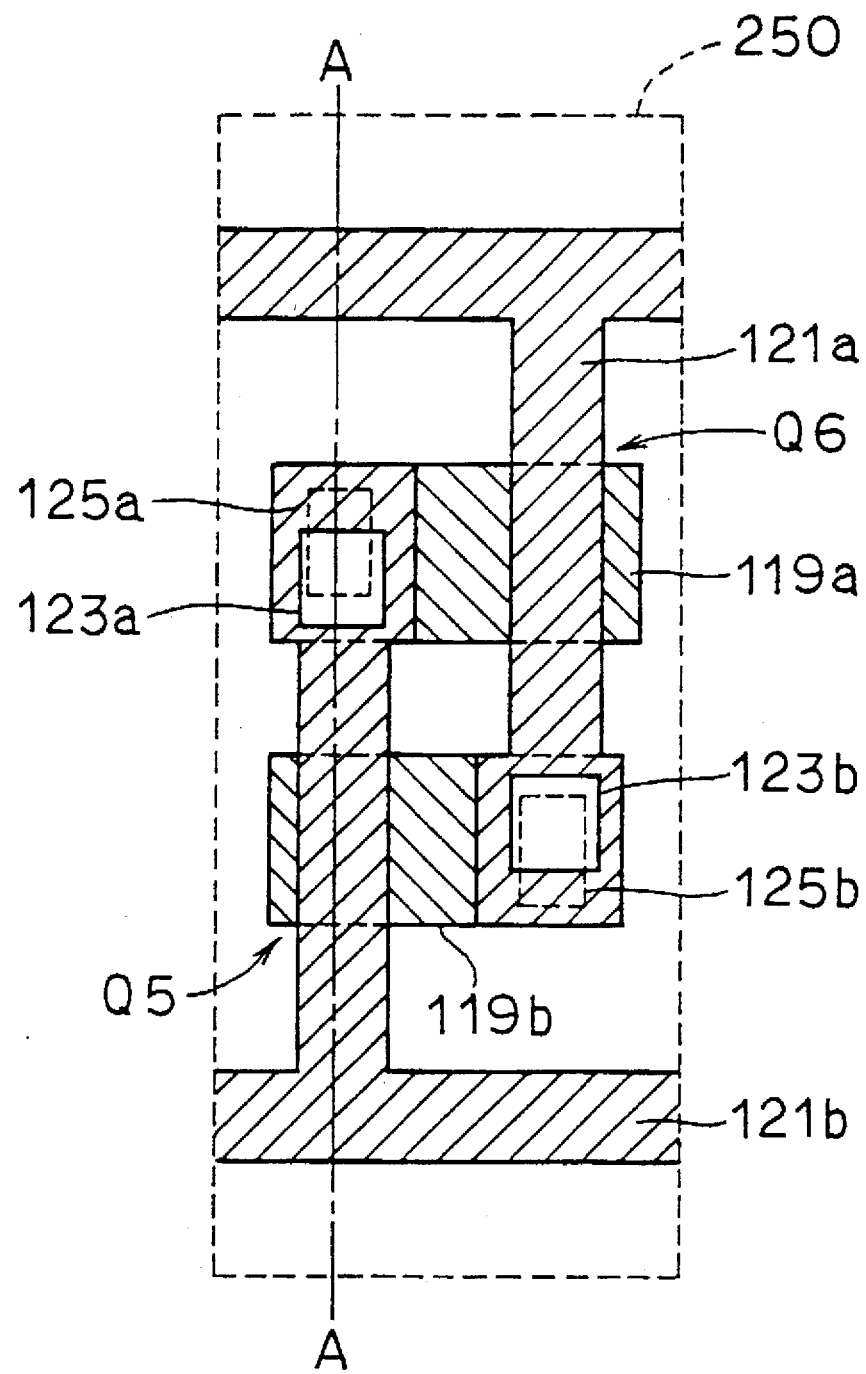
FIG. 53 is a plan view showing a state in which a TFT is formed on the structure of FIG. 52.
Figure 54:
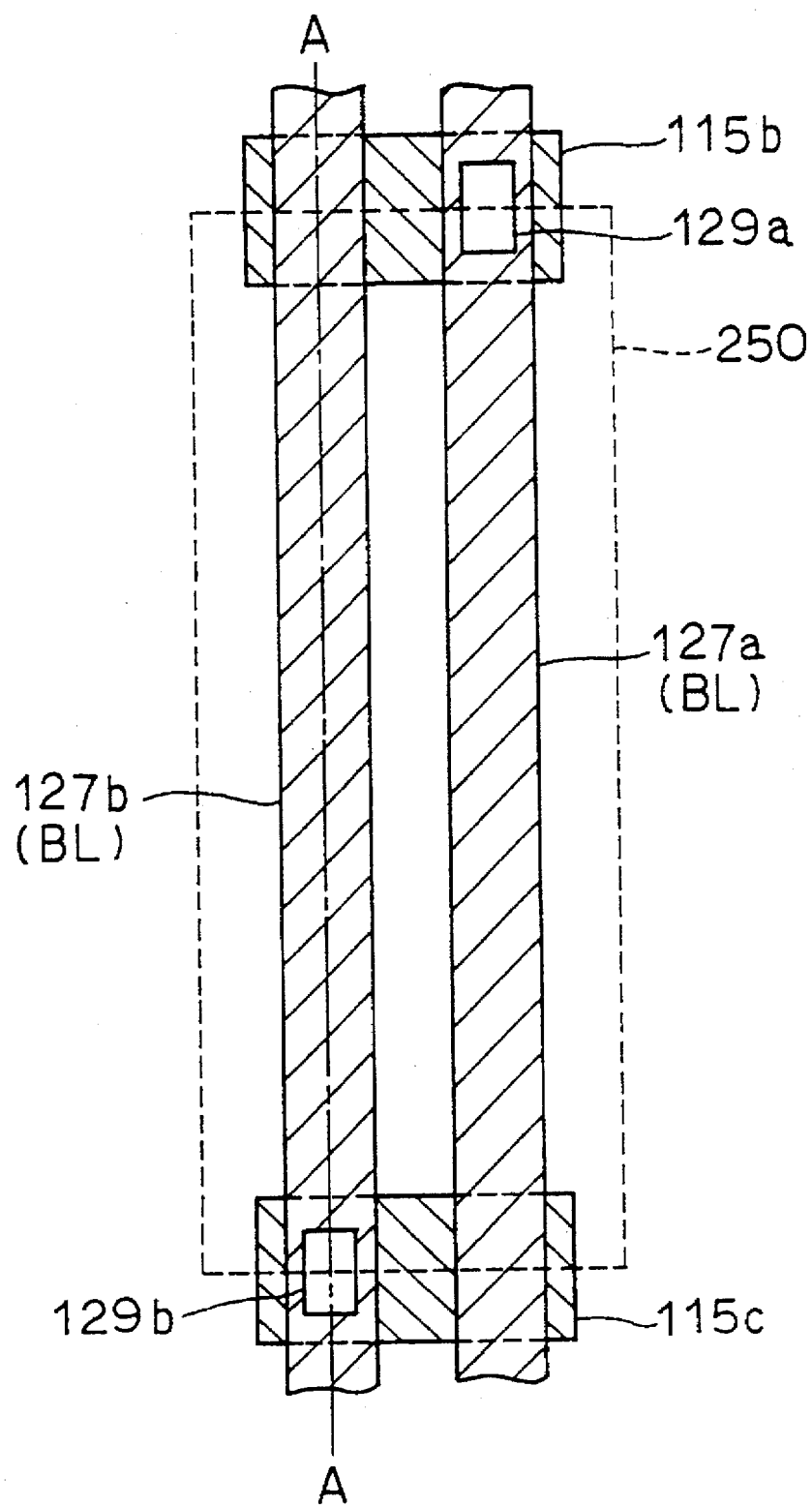
FIG. 54 is a plan view showing a state in which a bit line is formed on the structure of FIG. 53.

A second embodiment of the present invention will be described with reference to FIGS. 47 to 49. FIG. 47 is a plan view of the SRAM in accordance with the second embodiment of the present invention. FIG. 48 is an enlarged cross section taken along the Y—Y of FIG. 47. FIG. 49 is a cross section showing one method of eliminating formation of the GND line.

First, referring to FIG. 47, the layout of the memory cell of the SRAM in accordance with this embodiment will be described. Referring to FIG. 47, in this embodiment, two word lines 6a and 6b are formed in one memory element forming region. The GND lines 4a and 4b, the word lines 6a and 6b, and gate electrodes 3a and 3b of the driver transistor are arranged not to be overlapped with each other. TFT similar to that of FIG. 5 is formed on an upper layer.

Consequently, it becomes possible to form these interconnection layers by patterning the same polycrystalline silicon layer (or a polycide layer). Namely, interconnections in the memory cell can be formed by three layers of polycrystalline silicon layers. This allows reduction in manufacturing cost.

The active regions 2 shown in FIG. 47 has corners near the contact portions 5c and 5d between the active regions 2 and GND lines 4a and 4b, respectively. Therefore, there is a possibility of leak current near the corners. However, there is not a corner at the edge of the active region 2 near the storage node portion. Therefore, reliability of the SRAM can be improved at least than the prior art example.

Referring to FIG. 48, by the first layer polycrystalline silicon, word lines 6a and 6b, gate electrodes 3a and 3b of the driver transistor and GND lines 4a and 4b are formed. At prescribed regions on the first layer of polycrystalline silicon, the second layer of polycrystalline silicon layers 7a and 7b, in which source/drain regions of the TFT are formed, is formed with an insulating layer 41 interposed. An insulating layer 52 is formed to cover the polycrystalline silicon layers 7a and 7b. In insulating layer 52, contact holes are formed at prescribed positions, and a metal interconnection 53f is formed in the contact hole and on the insulating layer 52. Since the interconnection layers in the memory cell are formed by only three layers of polycrystalline silicon layers except the metal interconnection 53f, the height of the SRAM can be reduced as in the first embodiment described above, and the manufacturing cost can also be reduced.

A modification of the SRAM of the second embodiment will be described with reference to FIG. 49. Referring to FIG. 49, the GND lines 4a and 4b of the memory cell of the SRAM shown in FIG. 47 can be omitted. This allows further reduction in memory cell area.

Referring to FIG. 49, note the active region (source region of the driver transistor) at which contact portions 4c and 4d between the active region 2 and GND lines 4a and 4b shown in FIG. 47 are formed. An n type impurity is introduced to high concentration (of at least about $10^{21}$ cm$^{-3}$) to the contact portions 4c and 4d, whereby generating a junction leak i' at the pn junction portion between the source region in the active region 2 and the p type well region 26.

Meanwhile, at a prescribed position on the main surface of p type well region 26, a p type high concentration region 105 is formed. The p type high concentration region 105 is grounded. By utilizing the leak current derived from the junction leak mentioned above, a current i is fed between the source region in the active region 2 and the p type high concentration region 105. This enables grounding of a prescribed region of the active region 2. Accordingly, the formation of GND lines 4a and 4b can be omitted. As a result, TFT load memory cell can be formed simply by depositing two layers of polycrystalline silicon layers. Consequently, the manufacturing cost can further be reduced.

As described above, according to the present invention, corners of the active regions (isolating insulating layers) are not formed in one memory cell forming region (memory element forming region). Therefore, generation of leak current in the memory cell can be suppressed. As a result, highly reliable high performance static semiconductor memory device can be obtained. Further, by providing a resistance portion, a desired cell ratio can be easily ensured. Further, BiCMOS type SRAM having a high performance double polysilicon type bipolar transistor and a TFT in the memory cell portion can be implemented by depositing three layers of polycrystalline silicon. According to the method of manufacturing the SRAM in accordance with the present invention, a highly reliable high performance SRAM can be easily formed. Further, manufacturing cost can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device, comprising:
   a semiconductor substrate having a main surface;
   an element forming region provided on the main surface of said semiconductor substrate, in which one memory element is formed;
   an active region surrounded by an isolation region selectively formed in said memory element forming region;
   a first gate formed on a first region in said active region with an insulating layer interposed; and
   a second gate formed on a second region in said active region spaced by a prescribed distance from said first region, with an insulating layer interposed; wherein:

the active region is defined by two parallel edges extending continuously between the first and second gates; both the first and second gates extend on the active region; and the width of the active region perpendicular to the current flow below the first gate is substantially equal to the width of the active region positioned below the second gate.

2. The static semiconductor memory device according to claim 1, having an access transistor and a driver transistor in said memory element forming region, wherein said first gate functions as a gate electrode of said access transistor, and said second gate functions as a gate electrode of said driver transistor.

3. The static semiconductor memory device according to claim 2, wherein a TFT (Thin Film Transistor) is formed above said first and second gates, and said second gate functions also as a gate electrode of said TFT.

4. The static semiconductor memory device according to claim 2, wherein an impurity of a first conductivity type is introduced to the main surface of said semiconductor substrate;

said driver transistor has source/drain regions including an impurity of a second conductivity type of at most a first concentration, in said active region;

a high concentration region including an impurity of the second conductivity type of which concentration is higher than said first concentration is formed in said source region; and an impurity region of the first conductivity type is formed in a prescribed region of the main surface of said semiconductor substrate for grounding said source region by extracting a junction leak generated at a junction portion between said high concentration region and the main surface of said semiconductor substrate.

5. The static semiconductor memory device according to claim 2, comprising a resistance portion formed in said active region positioned between said first and second gates for adjusting ratio of an amount of current flowing through said driver transistor with respect to an amount of current flowing through said access transistor to a desired value.

6. The static semiconductor memory device according to claim 5, wherein an impurity of a first conductivity type is introduced to the main surface of said semiconductor substrate;

said access transistor has in said active region, first and second impurity regions of the second conductivity type sandwiching said first region;

said driver transistor has in said active region, third and fourth impurity regions of the second conductivity type provided sandwiching said second region;

said second impurity region is positioned on said driver transistor side, and said third impurity region is positioned on said access transistor side; and a third region of the first conductivity type is provided between said second and third impurity regions, said third region functioning as said resistance portion.

7. The static semiconductor memory device according to claim 6, further comprising a second driver transistor formed in said memory element forming region, and a third gate functioning as a gate electrode of said second driver transistor extending over said active region positioned between said first and second gates; wherein said third gate is electrically connected to said third impurity region, and third region functioning as said resistance portion is provided in said active region positioned below said third gate.

8. The static semiconductor memory device according to claim 1, wherein first and second said active regions are formed in said memory element forming region with an isolation insulating layer interposed;

said first gate includes a first portion having one end on said isolating insulating layer and extending over said first active region, a second portion formed on said isolating insulating layer continuous from said one end of said first portion and extending in a direction crossing said first portion and having the other end portion at a position apart from said one end of said first portion, and a third portion extending from said the other end portion of said second portion over said second active region;

a first access transistor is formed at a crossing between said first portion and said first active region; and a second access transistor is formed at a crossing between said second portion and said second active region.

9. The static semiconductor memory device according to claim 1, further comprising a TFT (Thin Film Transistor);

a first insulating layer formed to cover said second gate;

a contact hole extending through said first insulating layer and said second gate and reaching a surface of said active region; wherein an interconnection layer in which source/drain regions of said TFT are formed, is formed in said first insulating layer and in said contact hole.

10. A static semiconductor memory device having first and second driver transistors and an access transistor, comprising:

a semiconductor substrate of a first conductivity type having a main surface;

a memory element forming region provided on the main surface of said semiconductor substrate, in which one memory element is formed;

first and second active regions formed selectively in said memory element forming region to sandwich an element isolating region;

a first gate formed on a first region in said first active region with an insulating layer interposed, functioning as a gate electrode of said access transistor;

a second gate formed on a second region in said first active region spaced by a prescribed distance from said first region with an insulating layer interposed, functioning as a gate electrode of said first driver transistor;

a third gate electrically connected to a prescribed region in said first active region positioned between said first and second gates, extending from over said first active region to over said second active region, said second driver transistor being formed at a crossing between said third gate and said second active region; wherein said first active region positioned between said first and second gates has a pair of edge portions extending in a straight line;

in said first active region positioned below said third gate, a resistance portion for adjusting ratio of an amount of current flowing through said first driver transistor with respect to an amount of current flowing through said access transistor to a desired value is provided; the first active region extends straight, both the first and second gates extend on the first active region; and the width of the first active region positioned below the first gate is substantially equal to the width of the first active region positioned below the second gate.

11. The static semiconductor memory device according to claim 10, wherein said access transistor includes first and second impurity regions of the second conductivity type in said first active region; and said resistance portion is formed between a contact portion between said third gate and said first active region and said first impurity region positioned on the side of said third gate.

12. The static semiconductor memory device according to claim 11, wherein a third impurity region of the second conductivity type is formed in said active region at said contact portion, and said resistance portion is formed by a resistance region of the first conductivity type sandwiched by said first impurity region and said third impurity region.

13. The static semiconductor memory device according to claim 12, wherein impurity concentration of the first conductivity type included in said resistance region is equal to impurity concentration of the first conductivity type included in the main surface of said semiconductor substrate.

14. A static semiconductor memory device, comprising:

a semiconductor substrate having a main surface;

an element forming region provided on the main surface of said semiconductor substrate, in which one memory element is formed;

an active region selectively formed in said memory element forming region;

a first gate formed on a first region in said active region with an insulating layer interposed;

a second gate formed on a second region in said active region spaced by a prescribed distance from said first region, with an insulating layer interposed;

a third gate formed on said active region positioned between said first and second gates and contact with said active region; and a resistance portion formed only in said active region under said third gate for adjusting ratio of an amount of current flowing through said driver transistor with respect to an amount of current flowing through said access transistor to a desired value, wherein:

the active region extends straight, both the first and second gates extend on the active region; and the width of the active region positioned below the first gate is substantially equal to the width of the active region positioned above the second gate.

15. A static semiconductor memory device having a memory cell portion in which a memory cell is formed, a bipolar portion in which a bipolar transistor is formed and a TFT (Thin Film Transistor), comprising:

a semiconductor substrate of a first conductivity type having a main surface;

a bipolar transistor formed in said bipolar portion at the main surface of said semiconductor substrate, and having a collector region of a second conductivity type, a base region of the first conductivity type formed on a surface of said collector region, and an emitter region of the second conductivity type formed on the surface of said base region;

a base electrode formed on a surface of said base region;

an emitter electrode formed on a surface of said emitter region;

a driver transistor formed in said memory cell portion at the main surface of said semiconductor substrate and having a pair of impurity regions of the second conductivity type and a gate electrode;

an insulating layer covering said driver transistor; and a TFT layer formed on said insulating layer, in which source/drain regions of said TFT are formed; wherein said emitter electrode and said gate electrode of the driver transistor are formed of a patterned first conductive layer, and said base electrode and said TFT layer are formed of a patterned second conductive layer.

* * * * *